US008700840B2

(12) United States Patent
Paley et al.

(10) Patent No.: US 8,700,840 B2
(45) Date of Patent: *Apr. 15, 2014

(54) NONVOLATILE MEMORY WITH WRITE CACHE HAVING FLUSH/EVICTION METHODS

(75) Inventors: Alexander Paley, Kfar-Saba (IL); Sergey Anatolievich Gorobets, Edinburgh (GB); Eugene Zilberman, Richmond Hill (CA); Alan David Bennett, Edinburgh (GB); Shai Traister, San Jose, CA (US); Andrew Tomlin, San Jose, CA (US); William S. Wu, Cupertino, CA (US); Bum Suck So, San Jose, CA (US)

(73) Assignee: Sandisk Technologies, Inc., Plano, TX (US)

( * ) Notice: Subject to any disclaimer, the term of this patent is extended or adjusted under 35 U.S.C. 154(b) by 1004 days.

This patent is subject to a terminal disclaimer.

(21) Appl. No.: 12/348,895

(22) Filed: Jan. 5, 2009

(65) Prior Publication Data

US 2010/0174846 A1    Jul. 8, 2010

(51) Int. Cl.
*G06F 12/08*    (2006.01)
*G11C 11/34*    (2006.01)

(52) U.S. Cl.
USPC ................. 711/103; 711/135; 365/185.03

(58) Field of Classification Search
None
See application file for complete search history.

(56) References Cited

U.S. PATENT DOCUMENTS

| 4,622,656 | A | 11/1986 | Kamiya et al. |
| 5,043,940 | A | 8/1991 | Harari |
| 5,070,032 | A | 12/1991 | Yuan et al. |
| 5,095,344 | A | 3/1992 | Harari |
| 5,172,338 | A | 12/1992 | Mehrotra |
| 5,268,870 | A | 12/1993 | Harari |
| 5,291,440 | A | 3/1994 | Koyama |
| 5,297,148 | A | 3/1994 | Harari et al. |
| 5,313,421 | A | 5/1994 | Guterman et al. |
| 5,315,541 | A | 5/1994 | Harari et al. |
| 5,343,063 | A | 8/1994 | Yuan et al. |

(Continued)

FOREIGN PATENT DOCUMENTS

| EP | 0 589 597 A2 | 3/1994 |
| EP | 0 589 597 A3 | 3/1994 |

(Continued)

OTHER PUBLICATIONS

"FAB: Flash-Aware Buffer Management Policy for Portable Media Players" by Heeseung Jo et al. IEEE Transactions on Consumer Electronics, vol. 52, No. 2, May 2006; pp. 485-493.*

(Continued)

*Primary Examiner* — Kaushikkumar Patel
(74) *Attorney, Agent, or Firm* — Davis Wright Tremaine LLP

(57) ABSTRACT

A portion of a nonvolatile memory is partitioned from a main multi-level memory array to operate as a cache. The cache memory is configured to store at less capacity per memory cell and finer granularity of write units compared to the main memory. In a block-oriented memory architecture, the cache has multiple functions, not merely to improve access speed, but is an integral part of a sequential update block system. Decisions to archive data from the cache memory to the main memory depend on the attributes of the data to be archived, the state of the blocks in the main memory portion and the state of the blocks in the cache portion.

24 Claims, 64 Drawing Sheets

Binary Cache Eviction

(56) References Cited

U.S. PATENT DOCUMENTS

| | | |
|---|---|---|
| 5,388,083 A | 2/1995 | Assar et al. |
| 5,438,573 A | 8/1995 | Mangan et al. |
| 5,479,638 A | 12/1995 | Assar et al. |
| 5,485,595 A | 1/1996 | Assar et al. |
| 5,532,962 A | 7/1996 | Auclair et al. |
| 5,568,423 A | 10/1996 | Jou et al. |
| 5,570,315 A | 10/1996 | Tanaka et al. |
| 5,595,924 A | 1/1997 | Yuan et al. |
| 5,619,448 A | 4/1997 | Lin |
| 5,625,590 A | 4/1997 | Choi et al. |
| 5,640,529 A | 6/1997 | Hasbun |
| 5,661,053 A | 8/1997 | Yuan |
| 5,671,388 A | 9/1997 | Hasbun |
| 5,712,180 A | 1/1998 | Guterman et al. |
| 5,751,634 A | 5/1998 | Itoh |
| 5,761,128 A | 6/1998 | Watanabe |
| 5,768,192 A | 6/1998 | Eitan |
| 5,774,397 A | 6/1998 | Endoh et al. |
| 5,798,968 A | 8/1998 | Lee et al. |
| 5,822,251 A | 10/1998 | Bruce et al. |
| 5,835,935 A | 11/1998 | Estakhri et al. |
| 5,841,699 A | 11/1998 | Miyauchi |
| 5,851,881 A | 12/1998 | Lin et al. |
| 5,860,124 A | 1/1999 | Matthews et al. |
| 5,887,145 A | 3/1999 | Harari et al. |
| 5,890,192 A | 3/1999 | Lee et al. |
| 5,903,495 A | 5/1999 | Takeuchi et al. |
| 5,909,449 A | 6/1999 | So et al. |
| 5,928,370 A | 7/1999 | Asnaashari |
| 5,930,167 A | 7/1999 | Lee et al. |
| 5,930,815 A | 7/1999 | Estakhri et al. |
| 5,936,971 A | 8/1999 | Harari et al. |
| 5,956,743 A | 9/1999 | Bruce et al. |
| 6,011,287 A | 1/2000 | Itoh et al. |
| 6,028,794 A | 2/2000 | Nakai et al. |
| 6,046,935 A | 4/2000 | Takeuchi et al. |
| 6,076,137 A | 6/2000 | Asnaashari |
| 6,081,447 A | 6/2000 | Lofgren et al. |
| 6,103,573 A | 8/2000 | Harari et al. |
| 6,128,695 A | 10/2000 | Estakhri et al. |
| 6,134,143 A | 10/2000 | Norman |
| 6,149,316 A | 11/2000 | Harari et al. |
| 6,151,248 A | 11/2000 | Harari et al. |
| 6,202,138 B1 | 3/2001 | Estakhri et al. |
| 6,222,762 B1 | 4/2001 | Guterman et al. |
| 6,230,233 B1 | 5/2001 | Lofgren et al. |
| 6,281,075 B1 | 8/2001 | Yuan et al. |
| 6,307,785 B1 | 10/2001 | Takeuchi et al. |
| 6,335,878 B1 | 1/2002 | Yamada et al. |
| 6,345,001 B1 | 2/2002 | Mokhlesi |
| 6,373,746 B1 | 4/2002 | Takeuchi et al. |
| 6,426,893 B1 | 7/2002 | Conley et al. |
| 6,438,036 B2 | 8/2002 | Seki et al. |
| 6,456,528 B1 | 9/2002 | Chen |
| 6,512,263 B1 | 1/2003 | Yuan et al. |
| 6,522,580 B2 | 2/2003 | Chen et al. |
| 6,567,302 B2 | 5/2003 | Lakhani |
| 6,567,307 B1 | 5/2003 | Estakhri |
| 6,603,680 B2 | 8/2003 | Kanamitsu et al. |
| 6,614,070 B1 | 9/2003 | Hirose et al. |
| 6,684,289 B1 | 1/2004 | Gonzalez et al. |
| 6,721,843 B1 | 4/2004 | Estakhri |
| 6,763,424 B2 | 7/2004 | Conley |
| 6,771,536 B2 | 8/2004 | Li et al. |
| 6,781,877 B2 | 8/2004 | Cernea et al. |
| 6,829,167 B2 | 12/2004 | Tu et al. |
| 6,944,063 B2 | 9/2005 | Chen et al. |
| 6,944,068 B2 | 9/2005 | Quader et al. |
| 6,948,026 B2 | 9/2005 | Keays |
| 7,012,835 B2 | 3/2006 | Gonzalez et al. |
| 7,057,939 B2 | 6/2006 | Li et al. |
| 7,085,161 B2 | 8/2006 | Chen et al. |
| 7,120,729 B2 | 10/2006 | Gonzalez et al. |
| 7,363,421 B2 | 4/2008 | Di Sena et al. |
| 7,441,067 B2 | 10/2008 | Gorobets et al. |
| 7,660,158 B2 | 2/2010 | Aritome |
| 7,742,338 B2 | 6/2010 | Santin et al. |
| 2002/0099904 A1 | 7/2002 | Conley |
| 2002/0141237 A1 | 10/2002 | Goda et al. |
| 2002/0172227 A1 | 11/2002 | Varelas et al. |
| 2002/0184432 A1 | 12/2002 | Ban |
| 2003/0002348 A1 | 1/2003 | Chen et al. |
| 2003/0041210 A1 | 2/2003 | Keays |
| 2003/0046487 A1 | 3/2003 | Swaminathan |
| 2003/0109093 A1 | 6/2003 | Harari et al. |
| 2003/0110343 A1 | 6/2003 | Hagiwara et al. |
| 2003/0123301 A1 | 7/2003 | Jang et al. |
| 2003/0225961 A1 | 12/2003 | Chow et al. |
| 2004/0047182 A1 | 3/2004 | Cernea et al. |
| 2004/0080995 A1 | 4/2004 | Mokhlesi |
| 2004/0083335 A1 | 4/2004 | Gonzalez et al. |
| 2004/0083405 A1 | 4/2004 | Chang et al. |
| 2004/0123020 A1 | 6/2004 | Gonzalez et al. |
| 2004/0177212 A1 | 9/2004 | Chang et al. |
| 2004/0186946 A1 | 9/2004 | Lee |
| 2004/0228197 A1 | 11/2004 | Mokhlesi |
| 2005/0018482 A1 | 1/2005 | Cernea et al. |
| 2005/0018527 A1 | 1/2005 | Gorobets |
| 2005/0073884 A1 | 4/2005 | Gonzalez et al. |
| 2005/0144365 A1 | 6/2005 | Gorobets et al. |
| 2005/0144367 A1 | 6/2005 | Sinclair |
| 2005/0144516 A1 | 6/2005 | Gonzalez et al. |
| 2005/0154818 A1 | 7/2005 | Chen |
| 2005/0174849 A1 | 8/2005 | In et al. |
| 2005/0204187 A1 | 9/2005 | Lee et al. |
| 2005/0281095 A1 | 12/2005 | Eilert et al. |
| 2006/0004951 A1 | 1/2006 | Rudelic et al. |
| 2006/0053247 A1 | 3/2006 | Cheung et al. |
| 2006/0106972 A1 | 5/2006 | Gorobets et al. |
| 2006/0155917 A1 | 7/2006 | Di Sena et al. |
| 2006/0155922 A1* | 7/2006 | Gorobets et al. ............... 711/103 |
| 2006/0161724 A1 | 7/2006 | Bennett et al. |
| 2006/0161728 A1 | 7/2006 | Bennett et al. |
| 2006/0203546 A1 | 9/2006 | Lasser |
| 2007/0061502 A1* | 3/2007 | Lasser et al. ................... 711/103 |
| 2007/0101095 A1 | 5/2007 | Gorobets |
| 2007/0124531 A1 | 5/2007 | Nishihara |
| 2007/0204128 A1 | 8/2007 | Lee et al. |
| 2007/0208904 A1 | 9/2007 | Hsieh et al. |
| 2007/0220197 A1* | 9/2007 | Lasser ............................ 711/103 |
| 2007/0266200 A1 | 11/2007 | Gorobets et al. |
| 2007/0283081 A1 | 12/2007 | Lasser |
| 2008/0022046 A1* | 1/2008 | Miller ............................ 711/128 |
| 2008/0046639 A1* | 2/2008 | Tsuji ............................... 711/103 |
| 2008/0071970 A1* | 3/2008 | Lin .................................. 711/103 |
| 2008/0104308 A1 | 5/2008 | Mo et al. |
| 2008/0104309 A1 | 5/2008 | Cheon et al. |
| 2008/0112222 A1 | 5/2008 | Shirakawa |
| 2008/0112238 A1 | 5/2008 | Kim et al. |
| 2008/0126683 A1 | 5/2008 | Tsuji |
| 2008/0183949 A1 | 7/2008 | Ly et al. |
| 2008/0198651 A1 | 8/2008 | Kim |
| 2008/0209112 A1* | 8/2008 | Yu et al. ......................... 711/103 |
| 2008/0244164 A1 | 10/2008 | Chang et al. |
| 2008/0301256 A1 | 12/2008 | McWilliams et al. |
| 2009/0089482 A1* | 4/2009 | Traister ......................... 711/103 |
| 2009/0089485 A1 | 4/2009 | Yeh |
| 2009/0089491 A1 | 4/2009 | Hatanaka et al. |
| 2009/0157974 A1* | 6/2009 | Lasser ............................ 711/135 |
| 2009/0164702 A1 | 6/2009 | Kern |
| 2009/0187798 A1 | 7/2009 | Kim |
| 2010/0030953 A1 | 2/2010 | Noh et al. |
| 2010/0077132 A1 | 3/2010 | Hung |
| 2010/0125696 A1 | 5/2010 | Kumar et al. |
| 2010/0172179 A1 | 7/2010 | Gorobets et al. |
| 2010/0172180 A1 | 7/2010 | Paley et al. |
| 2010/0174845 A1 | 7/2010 | Gorobets et al. |

(56) References Cited

U.S. PATENT DOCUMENTS

| | | |
|---|---|---|
| 2010/0174847 A1 | 7/2010 | Paley et al. |
| 2010/0174869 A1 | 7/2010 | Gorobets et al. |
| 2010/0205352 A1* | 8/2010 | Chu et al. .......... 711/103 |

FOREIGN PATENT DOCUMENTS

| | | |
|---|---|---|
| WO | WO 98/24028 A1 | 6/1998 |
| WO | WO 00/49488 A1 | 8/2000 |
| WO | WO 02/49039 A2 | 6/2002 |
| WO | WO 02/058074 A2 | 7/2002 |
| WO | WO 03/027828 A1 | 4/2003 |
| WO | WO 2004/040459 A1 | 5/2004 |
| WO | WO 2004/040578 A2 | 5/2004 |
| WO | WO 2004/040585 A1 | 5/2004 |
| WO | WO 2006/065668 A2 | 6/2006 |
| WO | WO 2006/065668 A3 | 6/2006 |
| WO | WO 2007/141783 A1 | 12/2007 |

OTHER PUBLICATIONS

USPTO, "Office Action," corresponding U.S. Appl. No. 12/348,899, mailed on Jun. 16, 2011, 51 pages.

Eitan et al., "NROM: A Novel Localized Trapping, 2-Bit Nonvolatile Memory Cell," IEEE Electron Device Letters, vol. 21, No. 11, Nov. 2000, pp. 543-545.

"3.1: Objects, values and types." Python Library Reference. 2004, 2 pages. http://web.archive.org/web/20040823015823/docs.python.org/ref/about.html.

Brown et al, "Nonvolatile Semiconductor Memory Technology," IEEE Press, Section 1.2, 1998, pp. 9-25.

Chan et al., "A True Single-Transistor Oxide-Nitride-Oxide EEPROM Device," IEEE Electron Device Letters, vol. EDL-8, No. 3, Mar. 1987, pp. 93-95.

Chang, "An Adaptive Striping Architecture for Flash Memory Storage Systems of Embedded Systems." Proceedings of the Eighth IEEE Real-Time and Embedded Technology and Applications Symposium, 2002, pp. 1-10.

Chiang, "Cleaning Policies in Mobile Computers using Flash Memory," Journal of Systems and Software. Elsevier Science, 1999, pp. 213-231.

Chiang, "Managing Flash Memory in Personal Communication Devices." IEEE, 1997, pp. 177-182.

Kalinsky, David, "Introduction to Priority Inversions." Embedded Systems Programming. Apr. 2002, pp. 55-56. http://www.netrino.com/Publications/Glossary/Priority/Inversion.html.

Kamiya et al., "EPROM Cell with High Gate Injection Efficiency," IEDM Technical Digest, Dec. 1982, pp. 741-744.

Nozaki et al., "A 1-Mb EEPROM With MONOS Memory Cell for Semiconductor Disk Application," IEEE Journal of Solid-State Circuits, vol. 26, No. 4, Apr. 1991, pp. 497-501.

Park, "Cost-Efficient Memory Architecture Design of NAND Flash Memory Embedded Systems." Proceedings of the 21$^{st}$ International Conference on Computer Design, 2003, pp. 1-6.

EPO/ISA, "Invitation to Pay Additional Fees," corresponding International Patent Application No. PCT/US2009/069535, mailed on Apr. 8, 2010, 8 pages.

EPO/ISA, "Notification of Transmittal of the International Search Report and the Written Opinion of the International Searching Authority, or the Declaration," corresponding International Patent Application No. PCT/US2009/069535, mailed on Jun. 21, 2010, 20 pages.

USPTO, "Notice of Allowance and Fee(s) Due," mailed in related U.S. Appl. No. 12/348,891 on Sep. 22, 2010, 24 pages.

Olsen et al., "Solid State Drives Data Reliability and Lifetime," White Papers, Apr. 7, 2008, 27 pages.

USPTO, "Notice of Allowance and Fee(s) Due," mailed in related U.S. Appl. No. 12/348,891 on Sep. 8, 2011, 24 pages.

USPTO, "Office Action," corresponding U.S. Appl. No. 12/348,819, mailed on Sep. 23, 2011, 61 pages.

USPTO, "Office Action," corresponding U.S. Appl. No. 12/348,899, mailed on Dec. 13, 2011, 15 pages.

USPTO "Office Action," corresponding U.S. Appl. No. 13/433,584, mailed on Jan. 27, 2014, 21 pages.

USPTO, "Office Action," corresponding U.S. Appl. No. 12/348,819, mailed on Jan. 7, 2014, 15 pages.

* cited by examiner

Multistate Memory

Lower Page Programming (2-bit Code)

Upper Page Programming (2-bit Code)

Lower Page Read (2-bit Code)

Upper Page Read (2-bit Code)

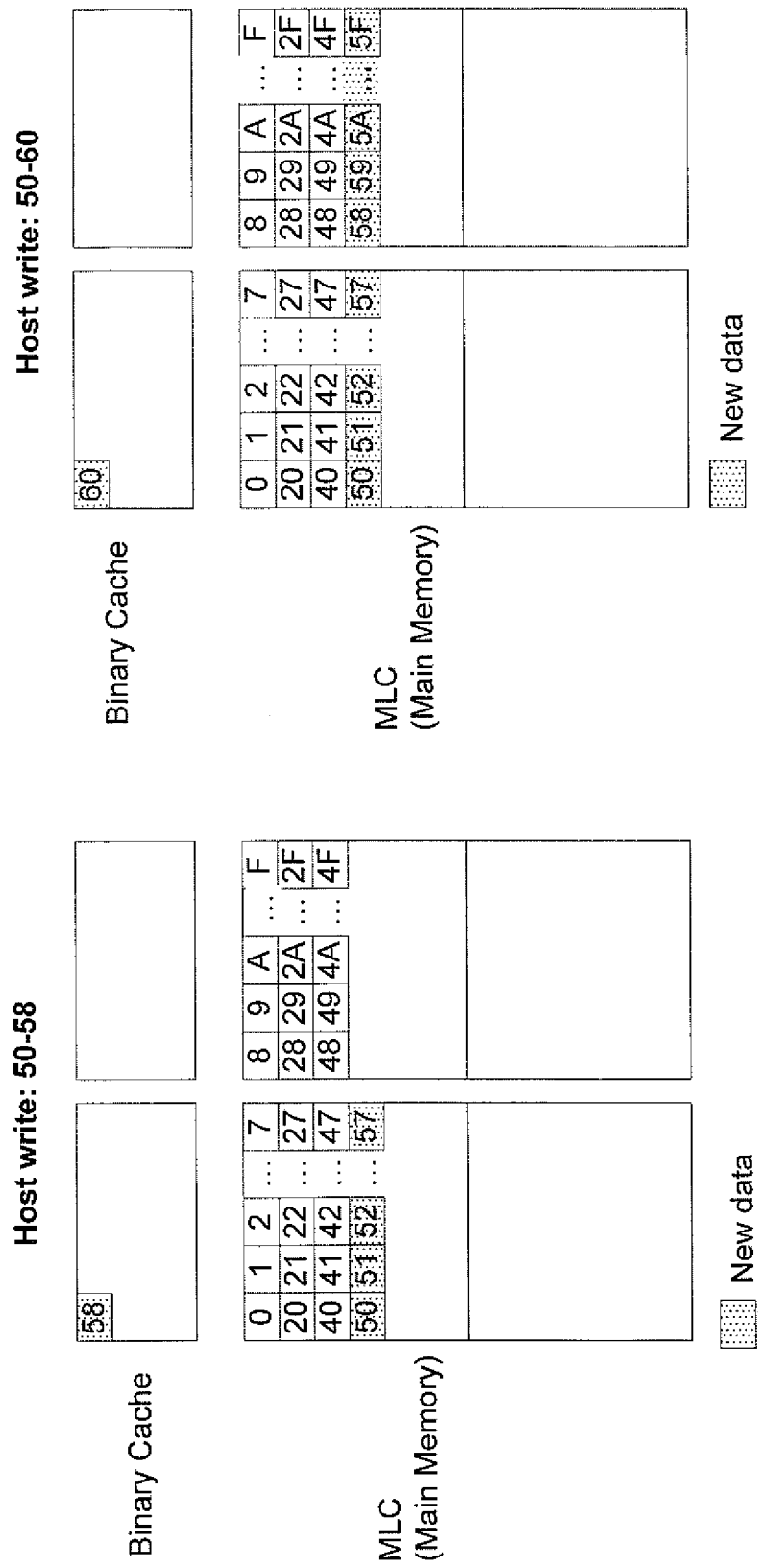

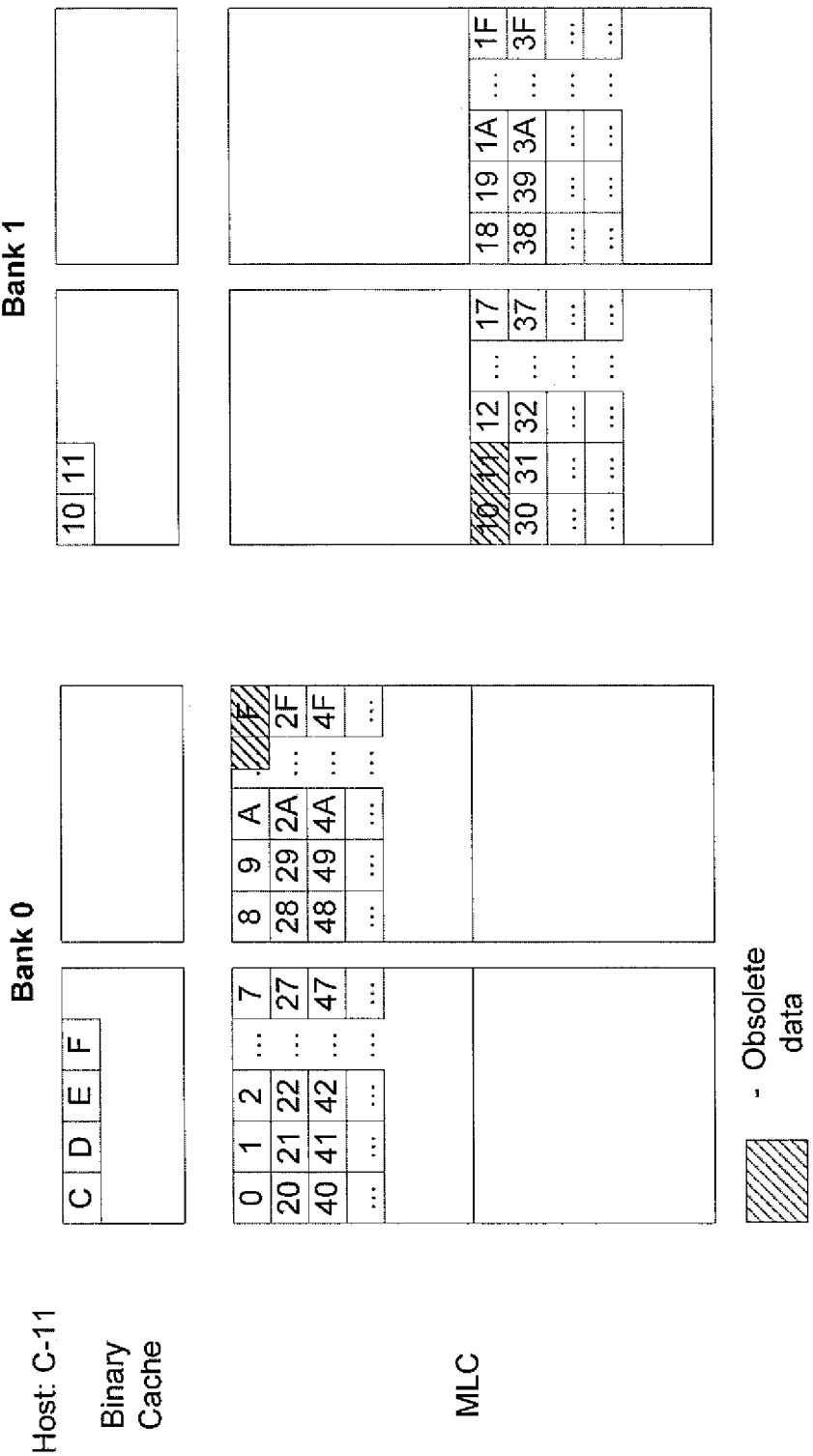

| Parameter | Description | Value | Unit |
|---|---|---|---|
| A | Binary Cache valid data limit for host data write to the Binary Cache (sBCBPartialPageOnlyStartPercent) | 85 | % |
| B | Binary Cache valid data limit for normal archiving to meta-block (sBCBCleanupStartPercent) | 80 | % |
| C | Index entry limit for a Logical Group (sBCBLgCleanupStartPercent) | 70 | % |
| D | Maximum logical groups with update blocks | 10 | logical groups |
| E | Maximum update blocks per logical group | 2 | Meta-blocks |
| F | Maximum logical groups with multiple update blocks | 10 | logical groups |
| G | Maximum forward LBA jump in update block | Length of meta-block | LBAs |
| H | Maximum length of short sequential write segment | Length of meta-block | sectors |
| J | Short Forward Jump parameters (metapage) | 1 | Meta-page |
| K | Binary Cache Valid Data limit for idle time archiving | | % |
| M | Length of the MRU list used for Idle Time Archiving | 32 | |
| T | Idle time after the last write command before idle time archiving may start | | µs |
| W | Bias/weight given to logical group without update block for data archiving logical group selection. (sOpenUpdateNum2KWeight) | 256 | 2k Entries |

*FIG. 26*

| Name | Description |
|---|---|
| Logical Group number | Logical Group that this fragment belongs to. |
| Sector offset in LG | Sector in LG that this fragment belongs to. |
| Length | Length of the fragment in sectors. |
| UbOverwirteFlags | Markers to determine if fragment overwrites Update Block |

Partial Description of Fragment header

FIG. 27

| Name | | Description |
|---|---|---|
| LgInfo (variable size up to 64 entries) | | Logical group id, start sector, size (in sectors) of a fragment. |
| BCIDirectory (fixed size, @ the end of an ECC Page) | BcBlocks[32] | Logical group id, start sector, size (in sectors) of a fragment. |
| | BciDirectory[128] | Location of all valid BCI records and start LG for each record. |

Partial Description of BCI

FIG. 28

| Transaction # | Data LG#(sector range) | BCI LG#(sector range) |
|---|---|---|
| 1 | LG0(0-1) | LG0(0-1) |
| 2 | LG0(2-3) | LG0(0-1) LG0(2-3) |
| 3 | LG0(4-5) | LG0(0-1) LG0(2-3) LG0(4-5) |
| 4 | LG0(1-2) | LG0(0) LG0(1-2) LG0(3) LG0(4-5) |

*FIG. 34*

```
For Each BCI
    For Each LG in BCI
        For Each fragment in LG
            If Fragment exists in target physical block
                Copy fragment to destination block
                Update cached BCIRecord
Erase target block
```

Binary Cache compaction pseudo code

FIG. 36

```
In most recent BCI
For Each BCI in referenced in BCI Directory
    If BCI contains references to BCI with target LG
        Load BCI from reference.
        For Each fragment in LG
            If Fragment in target physical block
                Copy fragment to destination block
                Update cached BCIRecord
Erase target block
```

Optimized Binary Cache compaction pseudo code

FIG. 37

```
Load BCI into memory.
Transfer the LgInfo of this BCI into separate memory.
Load adjacent BCI into memory.
If the 2 blocks will fit into a single sector, merge them.
Update the BCI.
```

Steps to merge a BCI record

FIG. 38

> BC asks UM evict a logical group.
> UM responds by reading the contents of entire the LG range and storing in Update Block
> UM issues an obsolete command for the Logical Group.

Logical Group Eviction

FIG. 39

> If LG exists in BC
>     If area to be obsoleted covers entire range of LG in BC
>         Remove LG from BCI.
>         If BCI now contains no LGs
>             Consider BCI deletion
>         If LG is first in BCI
>                 Consider adjustment of start index of BCI
>
>     Else
>         For each sector to be made obsolete check for fragment
>             If fragment exists
>                 Remove ref to fragment in BCI Pseudo code of BC Obsolescence

FIG. 40

> For every BCI that gets loaded into memory
>     For every LG in BCI
>         Sum the size of each fragment in LG (from BCI, not frag)
>
>     If largest LG in BCI > stored largest LG details
>         Replace largest LG in memory details Physically largest LG

FIG. 41

Compaction will be run on physical blocks which have a high quantity of obsolete data.
- Blocks with large amounts of obsolete data will tend to be 'old'
- Compaction moves data to the start of a new physical block
- Compaction will tend to be run as often as possible before the oldest LG needs to be determined, as this tends to be used for LG eviction.

Old LG deduction

FIG. 42

Search physical block for last BCI record

If BCI MI version != current MI version
Update of update block correction may be required.
See BC-UM_Initialisation.doc If BCI location != last written page
    // non indexed fragments exist.
    Read forwards, generating BCI for these fragments.

Initialization procedure

FIG. 43

BC Fragments                                    Update Block

|                             |
|-----------------------------|
| Page 0 (written)            |
| Page 1 (written)            |
| Page 2 (written)            |
| Page 3 (erased)             |
| Page 4 (erased)             |

*FIG. 45A*

BC Fragments                                    Update Block

| Sector 0 | Sector 1 | 3 |
|----------|----------|---|
| Sector 4 | Sector 5 | 3 |

|                             |
|-----------------------------|
| Page 0 (written)            |
| Page 1 (written)            |
| Page 2 (written)            |
| Page 3 (erased)             |
| Page 4 (erased)             |

*FIG. 45B*

BC Fragments                                    Update Block

| Sector 10 | Sector 11 | Sector 12 | Sector 13 | 3 |
|-----------|-----------|-----------|-----------|---|

|                             |
|-----------------------------|
| Page 0 (written)            |
| Page 1 (written)            |
| Page 2 (written)            |
| Page 3 (erased)             |
| Page 4 (erased)             |

| UB #0 | |
|---|---|
| Page 0 (written) | Page 1 (written) |
| Page 2 (written) | Page 3 (written) |
| Page 4 (written) | Page 5 (written) |
| Page 6 (written) | Page 7 (written) |
| Page 8 (erased) | Page 9 (erased) |
| Page 10 (erased) | Page 11 (erased) |
| Page 12 (erased) | Page 13 (erased) |
| Page 14 (erased) | Page 15 (erased) |

| UB #1 | |
|---|---|
| Page 0 (written) | Page 1 (written) |
| Page 2 (written) | Page 3 (written) |
| Page 4 (erased) | Page 5 (erased) |
| Page 6 (erased) | Page 7 (erased) |
| Page 8 (erased) | Page 9 (erased) |
| Page 10 (erased) | Page 11 (erased) |
| Page 12 (erased) | Page 13 (erased) |
| Page 14 (erased) | Page 15 (erased) |

UM scans the FBL for all UBs for all LGs. Doesn't look inside the UBs.

Load the most recent BCI for the given LG into RAM

Search forward from the BCI to find fragments that were written since the last BCI was dumped.

For each unreferenced fragment
{
    // These fragments will be valid since a BCI dump occurs before every UoU
    Obtain the GAT entry for the fragment from the UM.
Update the BCI.
}

UM-BC Initialization

FIG. 48

BC saves current dirty BCI.

UM selects and erases new UB from FBL.

Data written to latest UB.

BC informed of write operation.

Update of Update Operation

FIG. 49

```
If UB for LG not initialised
        Search for NextErasedPage in UB

BC access
        If UB GAT != BCI GAT for LG
                // an update of updates has occurred
                Obsolete fragments from UB GAT PageTag to UB
NextErasedPage
                dirty BCI's GAT = UB GAT Else If UB NextFreePage > BC NextFreePage
                // The UB has been updated but a write abort occurred before an
                // obsolete command and BCI dump could occur.
                Obsolete fragments from GAT PageTag to UB NextErasedPage
                BC NextFreePage = UB NextFreePage
```

Initialization procedure

FIG. 50

Example of Update of Update

| | UB #1 |
|---|---|
| Page 0 (erased) | Page 1 (written) |
| Page 2 (written) | Page 3 (written) |
| Page 4 (erased) | Page 5 (erased) |
| Page 6 (erased) | Page 7 (erased) |
| Page 8 (erased) | Page 9 (erased) |
| Page 10 (erased) | Page 11 (erased) |
| Page 12 (erased) | Page 13 (erased) |
| Page 14 (erased) | Page 15 (erased) |

| BCI | Sectors 0,1,22,23 | NEP=4, ID=44, PT=1 |
|---|---|---|

NEP = Next Erased Page
ID = Block ID
PT = Page Tag

Example of Update of Update

*FIG. 51B*

Binary Cache Eviction

| State | FBL | Gat Delta | GAT (Flash) |
|---|---|---|---|
| Intact | - | - | X |
| Unwritten | - | - | X |
| Update (original and update blocks) | X | - | X |
| Update (only update blocks) | X | - | - |
| Closed | X | X | - |

Logical Group State and Control Structures

FIG. 54

| State | FBL | GAT Delta | GAT (Flash) |
|---|---|---|---|
| Free Block | X | - | - |
| Update Block | X | - | - |
| Closed Block (SRAM) | X | X | - |
| Closed block (Flash) | - | - | X |
| Released Block | X | - | X |

Update Block State and Control Structures

FIG. 56

| | |
|---|---|
| MIP | Master Index Page - this flash structure holds information from all MML modules & allows the MML unitization. |
| GAT Entry | Group Address Translation. For every intact LG, a specific metablock is allocated. |
| SGAT | Spare GAT - meaning a GAT Entry that is used only for meta block allocation. The SGAT LG is not used as an exported user logical space. |
| GAT Delta | A list GAT Entries (resides in the RAM & as part of MI on flash) - used as a cache for setting new GAT Entries. |
| GBL | GAT Block list. |
| UM | Update Manager. |

Terms used in connection with Group Address Table (GAT)

*FIG. 57*

| Name | Description |
|---|---|
| pDeltaListLG | Pointer to the array of the Delta LG's |
| pDeltaListPayload | pDeltaListPayload Pointer to the array of the GAT entries |
| pDeltaListCtrl | Pointer to the array of the list control vars |
| GATDeltaListSize | he size of the list |
| numOfFreeEntries | Variable that hold number of free entries in the list |

GAT Delta List

*FIG. 58*

| Name | Description |
|---|---|
| pGATCacheEntryChunks | Pointer to the linked list of cache chunks |
| GATEntriesCacheLRUListHead | Index of the head |
| GATEntriesCacheLRUListTail | Index of the tail |
| GATEntriesCacheLRUListSize | Size of list |
| GATEntriesCacheLRUListNumOfFree | Number of free nodes (used in init) |

GAT Entry Cache List

*FIG. 59*

Set GAT Entry Process

Get GAT Entry Process

| Name | Description |
|---|---|
| Specific Variables | Are defined in GAT Handler context. The GAT Block provides field access routines for the modules that uses them (mainly UM & BM) |
| GAT Block list | Managed by GAT Handler |
| Page Indice List | Managed by GAT Handler (GAT/SGAT Pages) |
| GAT Delta List | Managed by GAT Handler |
| BC area | Allocated only when MIP is being updated. Data exist in BC context. |
| UM area | Allocated only when MIP is being updated Data exist in UM context. |
| FBL's | 2 FBL's (Binary & MLC). Exist in the GAT handler context. Managed by BM module (the GAT handler provides simple Get/Set entry for the FBL tables) |

Data Structure of the Master Index Page (MIP)

FIG. 62

| Name | Description |
|---|---|
| GATBlockMBA | Array of MBA's of the GAT Blocks |
| GATBlockRLF | Array of RLF's of the GAT Blocks |
| GATBlockNumOfCTRLPages | Uint16 control word for every GAT Block - allowing management decision |

GAT Block Management List

FIG. 64

Initial state – empty GAT Delta

GAT Block Allocation

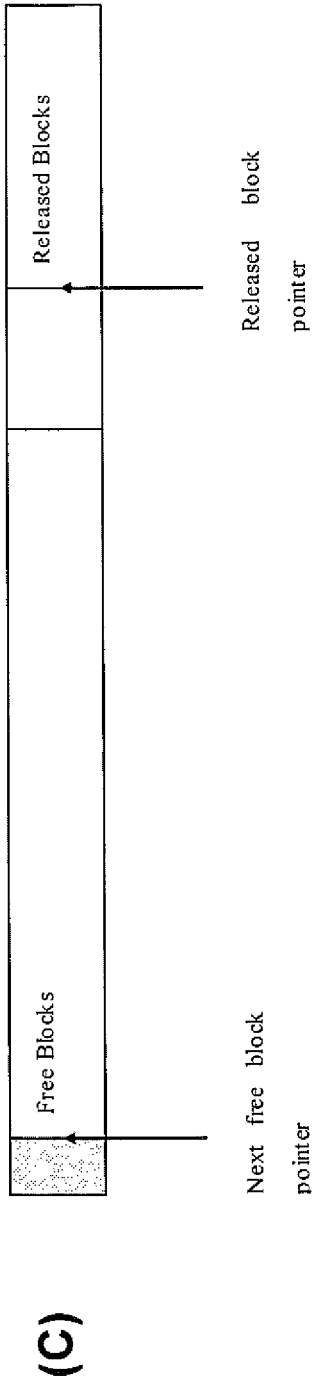
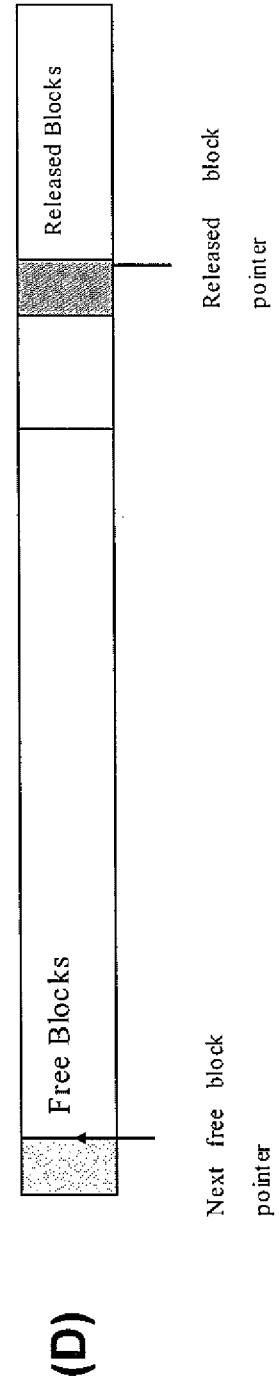
FIG. 66 (continuation)

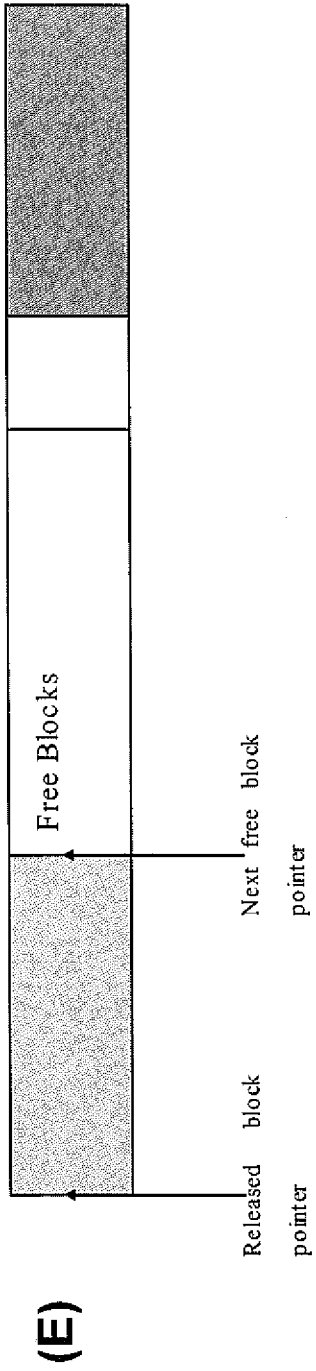
FIG. 66 (continuation)

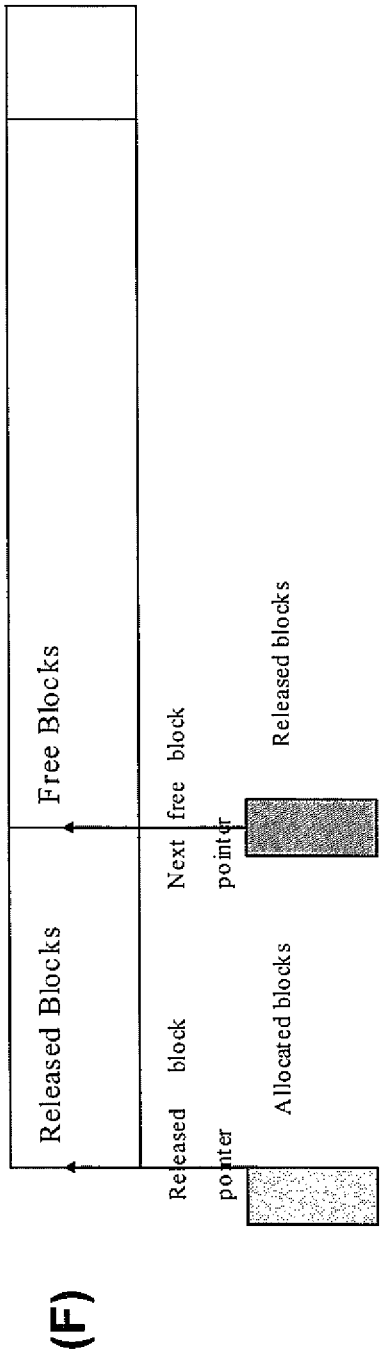
FIG. 66 (continuation)

Spare Block Allocation from Main to BC

NONVOLATILE MEMORY WITH WRITE CACHE HAVING FLUSH/EVICTION METHODS

CROSS-REFERENCE TO RELATED PATENT APPLICATIONS

This application is related to two United States patent applications of Alexander Paley, Sergey Anatolievich Gorobets, Eugene Zilberman, Alan David Bennett, Shai Traister, Andrew Tomlin, William S. Wu and Bum Suck So, U.S. patent application Ser. No. 12/348,891 filed Jan. 5, 2009, now U.S. Pat. No. 8,094,500, entitled "NON-VOLATILE MEMORY AND METHOD WITH WRITE CACHE PARTITIONING," U.S. patent application Ser. No. 12/348,899 filed Jan. 5, 2009, "NONVOLATILE MEMORY WITH WRITE CACHE PARTITION MANAGEMENT METHODS," and a provisional application by them, U.S. Provisional Patent Application No. 61/42,620 filed Jan. 5, 2009, entitled "NONVOLATILE MEMORY WITH IMPROVED BLOCK MANAGEMENT SYSTEM," all being filed concurrently herewith.

This application is also related to two United States patent applications of Sergey Anatolievich Gorobets, Bum Suck So and Eugene Zilberman, U.S. patent application Ser. No. 12/348,819 filed Jan. 5, 2009, entitled "WEAR LEVELING FOR NON-VOLATILE MEMORIES: MAINTENANCE OF EXPERIENCE COUNT AND PASSIVE TECHNIQUES," and of Sergey Anatolievich Gorobets, Alan David Bennett and Eugene Zilberman, U.S. patent application Ser. No. 12/348,825 filed Jan. 5, 2009, now U.S. Pat. No. 8,040,744, entitled "SPARE BLOCK MANAGEMENT IN NON-VOLATILE MEMORIES," all being filed concurrently herewith.

This application is also related to United States patent applications of Sergey Anatolievich Gorobets, Alexander Paley, Eugene Zilberman, Alan David Bennett and Shai Traister, U.S. patent application Ser. No. 12/348,782 filed Jan. 5, 2009, entitled "MAPPING ADDRESS TABLE MAINTENANCE IN A MEMORY DEVICE," being filed concurrently herewith.

Any and all patents, patent applications, articles, and other publications and documents referenced herein are hereby incorporated herein by those references in their entirety for all purposes. To the extent of any inconsistency or conflict in the definition or use of terms between the present provisional application and any incorporated patents, patent applications, articles or other publications and documents, those of the present application shall prevail.

BACKGROUND AND SUMMARY

This application relates to the operation of re-programmable non-volatile memory systems such as semiconductor flash memory, and, more specifically, to the management of the interface between a host device and the memory.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retaining its stored data even after power is turned off. Also, unlike ROM (read only memory), flash memory is rewritable similar to a disk storage device. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate. While the term "program" has been used historically to describe writing to a memory by injecting electrons to an initially erased charge storage unit of the memory cell so as to alter the memory state, it has now been used interchangeable with more common terms such as "write" or "record."

The memory device may be erased by a number of mechanisms. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more minimum erasable blocks at a time, where a minimum erasable block may consist of one or more sectors and each sector may store 512 bytes or more of data.

The memory device typically comprises one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

In flash memory systems, erase operation may take as much as an order of magnitude longer than read and program operations. Thus, it is desirable to have the erase block of substantial size. In this way, the erase time is amortized over a large aggregate of memory cells.

The nature of flash memory predicates that data must be written to an erased memory location. If data of a certain logical address from a host is to be updated, one way is rewrite the update data in the same physical memory location. That is, the logical to physical address mapping is unchanged. However, this will mean the entire erase block contain that physical location will have to be first erased and then rewritten with the updated data. This method of update is inefficient, as it requires an entire erase block to be erased and rewritten, especially if the data to be updated only occupies a small portion of the erase block. It will also result in a higher frequency of erase recycling of the memory block, which is undesirable in view of the limited endurance of this type of memory device.

Data communicated through external interfaces of host systems, memory systems and other electronic systems are addressed and mapped into the physical locations of a flash memory system. Typically, addresses of data files generated or received by the system are mapped into distinct ranges of a continuous logical address space established for the system in terms of logical blocks of data (hereinafter the "LBA interface"). The extent of the address space is typically sufficient to cover the full range of addresses that the system is capable of handling. In one example, magnetic disk storage drives communicate with computers or other host systems through such a logical address space. This address space has an extent sufficient to address the entire data storage capacity of the disk drive.

Flash memory systems are most commonly provided in the form of a memory card or flash drive that is removably connected with a variety of hosts such as a personal computer, a camera or the like, but may also be embedded within such host systems. When writing data to the memory, the host typically assigns unique logical addresses to sectors, clusters or other units of data within a continuous virtual address space of the memory system. Like a disk operating system (DOS), the host writes data to, and reads data from, addresses within the logical address space of the memory system. A controller within the memory system translates logical addresses received from the host into physical addresses within the memory array, where the data are actually stored, and then keeps track of these address translations. The data storage capacity of the memory system is at least as large as the amount of data that is addressable over the entire logical address space defined for the memory system.

In current commercial flash memory systems, the size of the erase unit has been increased to a block of enough memory cells to store multiple sectors of data. Indeed, many pages of data are stored in one block, and a page may store multiple sectors of data. Further, two or more blocks are often operated together as metablocks, and the pages of such blocks logically linked together as metapages. A page or metapage of data are written and read together, which can include many sectors of data, thus increasing the parallelism of the operation. Along with such large capacity operating units the challenge is to operate them efficiently.

For ease of explanation, unless otherwise specified, it is intended that the term "block" as used herein refer to either the block unit of erase or a multiple block "metablock," depending upon whether metablocks are being used in a specific system. Similarly, reference to a "page" herein may refer to a unit of programming within a single block or a "metapage" within a metablock, depending upon the system configuration.

When the currently prevalent LBA interface to the memory system is used, files generated by a host to which the memory is connected are assigned unique addresses within the logical address space of the interface. The memory system then commonly maps data between the logical address space and pages of the physical blocks of memory. The memory system keeps track of how the logical address space is mapped into the physical memory but the host is unaware of this. The host keeps track of the addresses of its data files within the logical address space but the memory system operates with little or no knowledge of this mapping.

Another problem with managing flash memory system has to do with system control and directory data. The data is produced and accessed during the course of various memory operations. Thus, its efficient handling and ready access will directly impact performance. It would be desirable to maintain this type of data in flash memory because flash memory is meant for storage and is nonvolatile. However, with an intervening file management system between the controller and the flash memory, the data can not be accessed as directly. Also, system control and directory data tends to be active and fragmented, which is not conducive to storing in a system with large size block erase. Conventionally, this type of data is set up in the controller RAM, thereby allowing direct access by the controller. After the memory device is powered up, a process of initialization enables the flash memory to be scanned in order to compile the necessary system control and directory information to be placed in the controller RAM. This process takes time and requires controller RAM capacity, all the more so with ever increasing flash memory capacity.

U.S. Pat. No. 6,567,307 discloses a method of dealing with sector updates among large erase block including recording the update data in multiple erase blocks acting as scratch pad and eventually consolidating the valid sectors among the various blocks and rewriting the sectors after rearranging them in logically sequential order. In this way, a block needs not be erased and rewritten at every slightest update.

WO 03/027828 and WO 00/49488 both disclose a memory system dealing with updates among large erase block including partitioning the logical sector addresses in zones. A small zone of logical address range is reserved for active system control data separate from another zone for user data. In this way, manipulation of the system control data in its own zone will not interact with the associated user data in another zone. Updates are at the logical sector level and a write pointer points to the corresponding physical sectors in a block to be written. The mapping information is buffered in RAM and eventually stored in a sector allocation table in the main memory. The latest version of a logical sector will obsolete all previous versions among existing blocks, which become partially obsolete. Garbage collection is performed to keep partially obsolete blocks to an acceptable number.

Prior art systems tend to have the update data distributed over many blocks or the update data may render many existing blocks partially obsolete. The result often is a large amount of garbage collection necessary for the partially obsolete blocks, which is inefficient and causes premature aging of the memory. Also, there is no systematic and efficient way of dealing with sequential update as compared to non-sequential update.

Flash memory with a block management system employing a mixture of sequential and chaotic update blocks is disclosed in United States Patent Publication No. US-2005-0144365-A1 dated Jun. 30, 2005, the entire disclosure of which is incorporated herein by reference.

Prior art has disclosed flash memory systems operating with a cache and operating in mixed MLC (multi-level cell) and SLC (single-level cell) modes and with the SLC memory operating as a dedicated cache. However, the cache disclosed is mainly to buffer the data between a fast host and a slower MLC memory and for accumulation to write to a block. These systems mostly treat the cache memory at a high level as storage and ignoring the underlying low level operating considerations of the block structure and its update scheme. The following publications are examples of these prior art.

Using RAM in a write cache operating with a flash memory has been disclosed in U.S. Pat. No. 5,936,971 to Harari et al.

Partitioning the memory into two portions one operating in binary and the other in MLC has been disclosed in U.S. Pat. No. 5,930,167 to Lee et al and U.S. Pat. No. 6,456,528 to Chen, the entire disclosure of which is incorporated therein by reference.

United States Patent Publication Number: Publication Number: US-2007-0061502-A1 on Mar. 15, 2007 and US-2007-0283081-A1 dated Dec. 6, 2007 by Lasser both disclose a flash memory operating in mixed MLC and SLC modes. A specific portion of the memory is always allocated to operate in SLC mode and to serve as a dedicated cache.

Therefore there is a general need for high capacity and high performance non-volatile memory. In particular, there is a need to have a high capacity nonvolatile memory able to conduct memory operations in large blocks without the aforementioned problems.

Such high capacity and high performance non-volatile memory is accomplished by an improved block management system that can operate in massively parallel manner while allowing efficient use of large structure resources. In particular it is desirable to have the performance of non-volatile memory improved by incorporating a write cache with multi-function capability and can be flexibly configured from a portion of the memory.

SUMMARY OF THE INVENTION

According to a general aspect of the invention, a flash memory incorporates an improved write cache. The flash memory is of the type having an array of memory cells that are organized into a plurality of blocks, the cells in each block being erased together. The flash memory is partitioned into at least two portions. A first portion forms the main memory for storing mainly user data. Individual memory cells in the main memory being configured to store one or more bits of data in each cell. A second portion forms an optional cache for data in transit to the main memory. The memory cells in the cache portion are configured to store less bits of data in each cell than that of the main memory portion. Both the cache portion and the main memory portion operate under a block management system for which cache operation is optimized.

In the preferred embodiment, individual cells in the cache portion are each configured to store one bit of data while the cells in the main memory portion each stores more than one bit of data. The cache portion then operates as a binary cache with faster and more robust write and read performances.

In the preferred embodiment, the cache portion is configured to allow finer granularity of writes than that for the main memory portion. The finer granularity is more compatible with the granularity of logical data units from a host write. Due to requirement to store sequentially the logical data units in the blocks of the main memory, smaller and chaotic fragments of logical units from a series of host writes can be buffered in the cache portion and later reassembly in sequential order to the blocks in the main memory portion.

In one aspect of the invention, the decision for the block management system to archive data from the cache portion to the main portion depends on a number of predefined conditions. The predefined conditions include the attributes of the data to be archived, the state of the blocks in the main memory portion and the state of the blocks in the cache portion.

The Binary Cache of the present system has the follows functions, features and advantages.

It serves as a higher speed buffer than the main memory portion to increase burst write speed to the device, thereby rendering the device more compatible with the speed of a host.

It also serves as a read cache for designated data such a control data for speedier access.

It allows data that is not aligned to pages or meta-pages, which are units of write for blocks in the main memory portion to be efficiently written;

It accumulates data for a logical group, which is a predefined group of logical units that fills an entire block in the main memory, to minimize the amount of data that must be relocated during garbage collection of a meta-block after the data has been archived to the meta-block.

It stores data for a logical group in which frequent repeated writes occur, to avoid writing data for this logical group to the meta-block; and e) it buffers host data, to allow garbage collection of the meta-block to be distributed amongst multiple host busy periods.

It is constituted from the same memory cells that make up the main memory portion and organized under the same block structure and is managed by the same block management system.

It allows flexible partitioning between the cache portion and the main memory portion on demand.

BRIEF DESCRIPTION OF THE DRAWINGS

FIG. 21A illustrates a first example of a sequential write to the last page in an open MLC update block.

FIG. 21B illustrates a second example of a sequential write to the last page in an open NLC update block.

FIGS. 25A and 25B illustrate an example of a host update that is written to the Binary Cache with data alignment.

FIG. 26 is a table of example parameter values.

FIG. 27 is a table showing partial description of the fragment header.

FIG. 28 is a table showing partial description of binary cache index.

FIG. 34 illustrates the BCI records in RAM getting reorganized dynamically.

FIG. 36 is an example of a pseudo code for binary cache compaction.

FIG. 37 shows a pseudo code for optimized binary cache compaction.

FIG. 38 shows a pseudo code to merge a BCI record.

FIG. 39 shows a pseudo code for logical group eviction.

FIG. 40 shows a pseudo code for binary cache obsolescence.

FIG. 41 is a pseudo code for maintaining information about identifying the physically largest logical group.

FIG. 42 is a pseudo code for identifying the oldest logical group by inferring from knowledge of how the systems in the BC operate.

FIG. 43 is a pseudo code for the initialization procedure.

FIGS. 45A and 45B illustrate another example for the case where the fragment written to the cache covers a range of sectors which has already been written to the update block.

FIG. 46 illustrates an example of partially valid/obsolete fragments. It is possible that a fragment may only partially cover a written area of the update block.

FIG. 47A-47C illustrate examples of operating with multiple update blocks for a given logical group.

FIG. 48 shows a pseudo code for initialization.

FIG. 49 illustrates a pseudo code for the process followed by the UM when an update of an existing update is performed is shown below.

FIG. 50 illustrates a pseudo code for further accesses to the BC have to validate the data in the phased initialization described above.

FIGS. 51A-51B illustrate an example, of an update of an update.

FIG. 53 is a state diagram showing the transitions a logical group can go through.

FIG. 54 is a table showing the possible states for a logical group and the control structures which are relevant for each state.

FIG. 55 is a state diagram showing the transitions a meta-block can go through.

FIG. 56 is a table showing the possible states for a meta-block and the control structures which are relevant for each state.

FIG. 57 is a table describing the terms used in GAT.

FIG. 58 is a table showing the GAT Delta list.

FIG. 59 is a table showing the GAT Entry Cache List.

FIG. 62 is a table listing the data structure of the master index page (MIP).

FIG. 64 is a table showing the GAT block list. The GAT Block is managed with the GAT block list.

DETAILED DESCRIPTION

Memory System

FIG. 1 to FIG. 7 provide example memory systems in which the various aspects of the present invention may be implemented or illustrated.

FIG. 8 to FIG. 14 illustrate preferred memory and block architecture for implementing the various aspects of the present invention.

Figure 15:
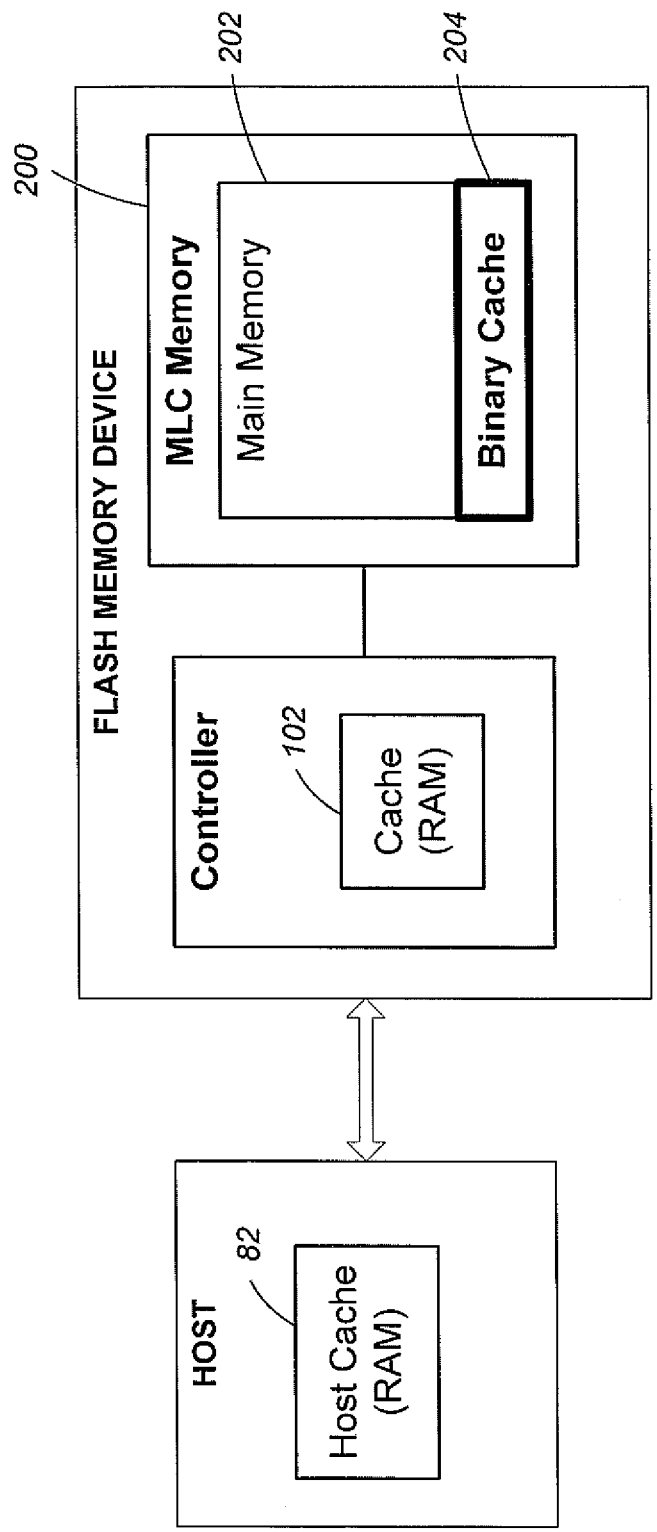
FIG. 15 illustrates a host operating with the flash memory device through a series of caches at different levels of the system.
Figure 69:
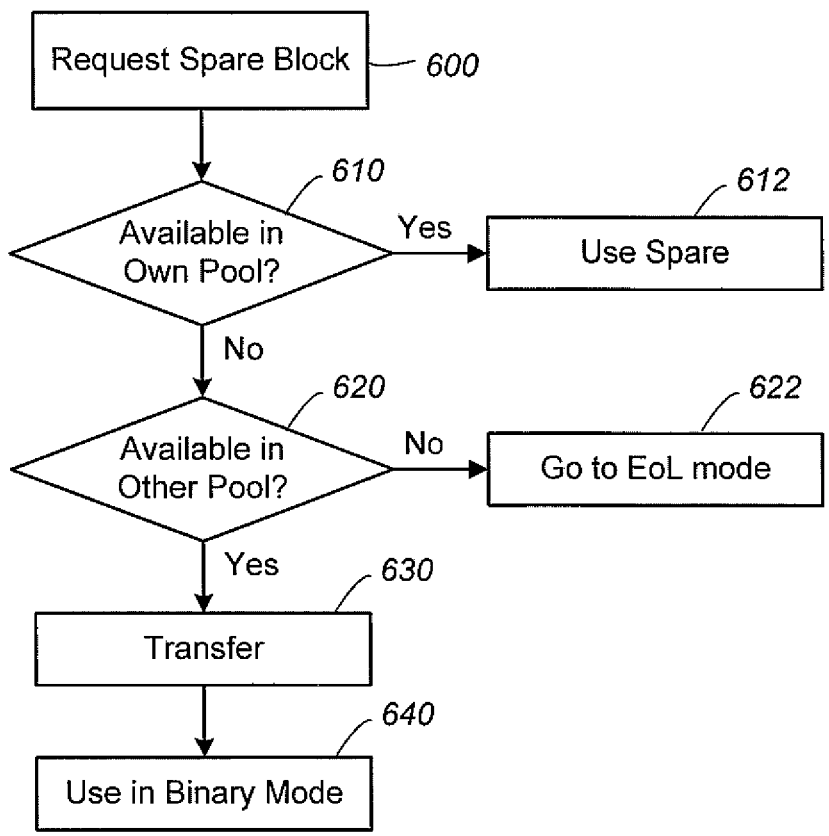
FIG. 69 is a flow diagram illustrating the allocation of spare blocks across the binary portion and the main (MLC) portion of the memory.

FIG. 15 to FIG. 69 illustrate details and context of the various aspects and embodiments of the present invention.

Figure 1:
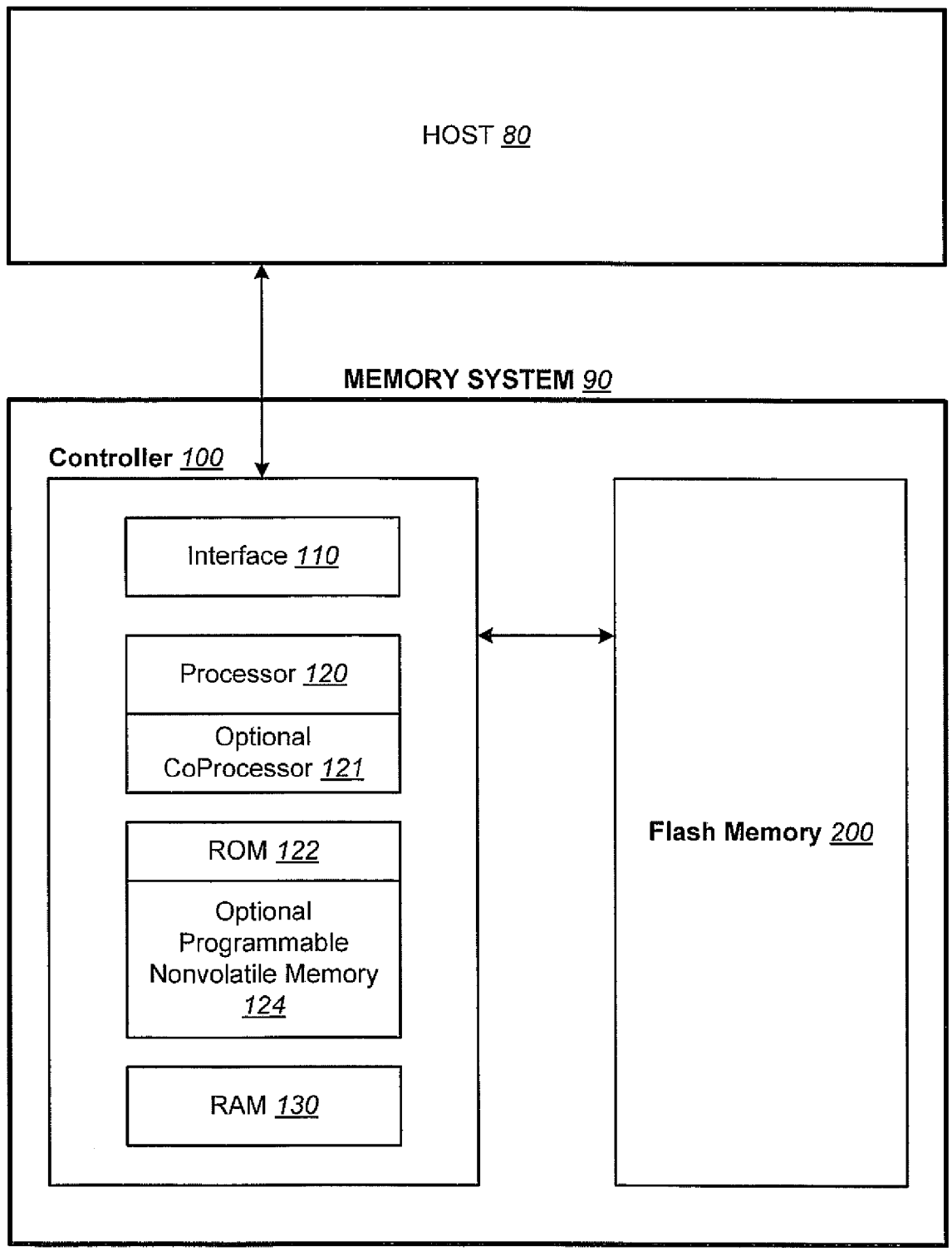
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system is typically in the form of a memory card or an embedded memory system. The memory system 90 includes a memory 200 whose operations are controlled by a controller 100. The memory 200 comprises of one or more array of non-volatile memory cells distributed over one or more integrated circuit chip. The controller 100 includes an interface 110, a processor 120, an optional coprocessor 121, ROM 122 (read-only-memory), RAM 130 (random access memory) and optionally programmable nonvolatile memory 124. The interface 110 has one component interfacing the controller to a host and another component interfacing to the memory 200. Firmware stored in nonvolatile ROM 122 and/or the optional nonvolatile memory 124 provides codes for the processor 120 to implement the functions of the controller 100. Error correction codes may be processed by the processor 120 or the optional coprocessor 121. In an alternative embodiment, the controller 100 is implemented by a state machine (not shown.) In yet another embodiment, the controller 100 is implemented within the host.

Physical Memory Structure

Figure 2:
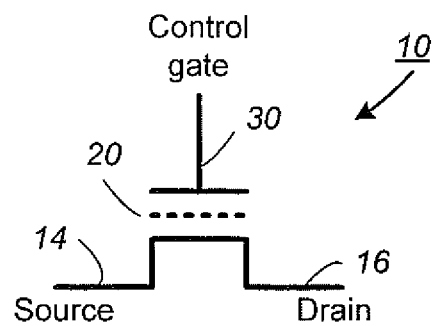
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661, 053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

Figure 3:
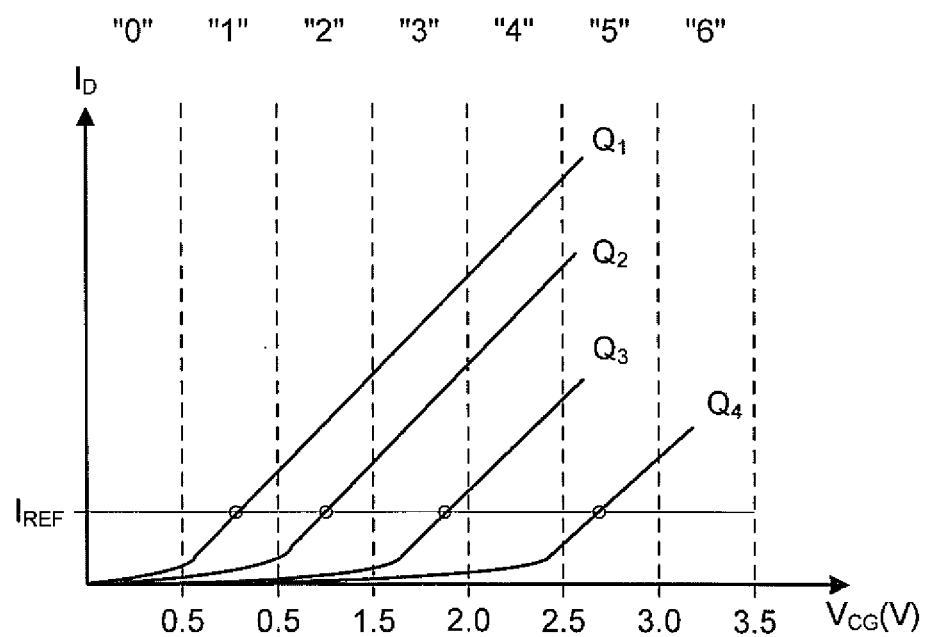
FIG. 3 illustrates the relation between the source-drain current $I_D$ and the control gate voltage $V_{CG}$ for four different charges Q1-Q4 that the floating gate may be selectively storing at any one time.

FIG. 3 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven possible memory states "0", "1", "2", "3", "4", "5", "6", respectively representing one erased and six programmed states may be demarcated by partitioning the threshold window into five regions in interval of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

Figure 4A:
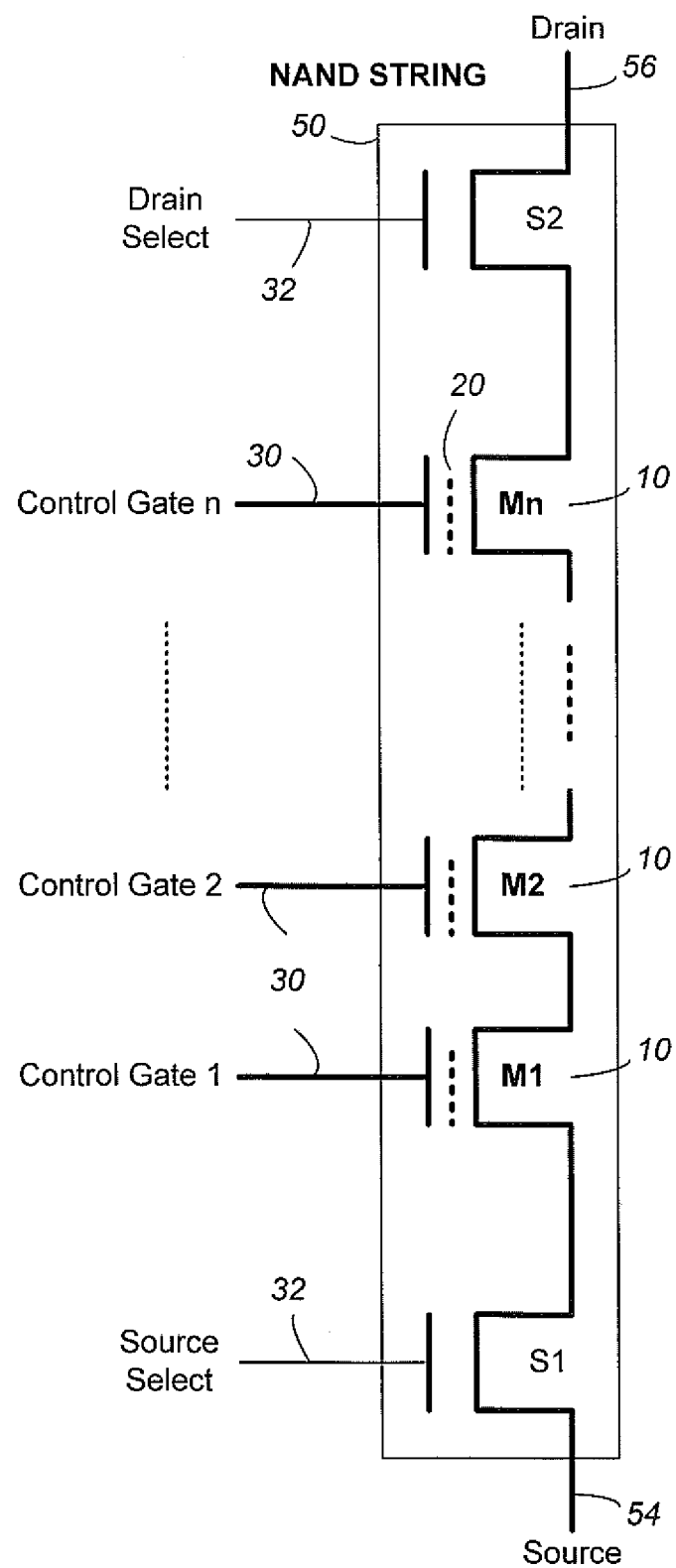
FIG. 4A illustrates schematically a string of memory cells organized into an NAND string.

FIG. 4A illustrates schematically a string of memory cells organized into an NAND string. An NAND string 50 comprises of a series of memory transistors M1, M2, . . . Mn (e.g., n=4, 8, 16 or higher) daisy-chained by their sources and drains. A pair of select transistors S1, S2 controls the memory transistors chain's connection to the external via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within an NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effective created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
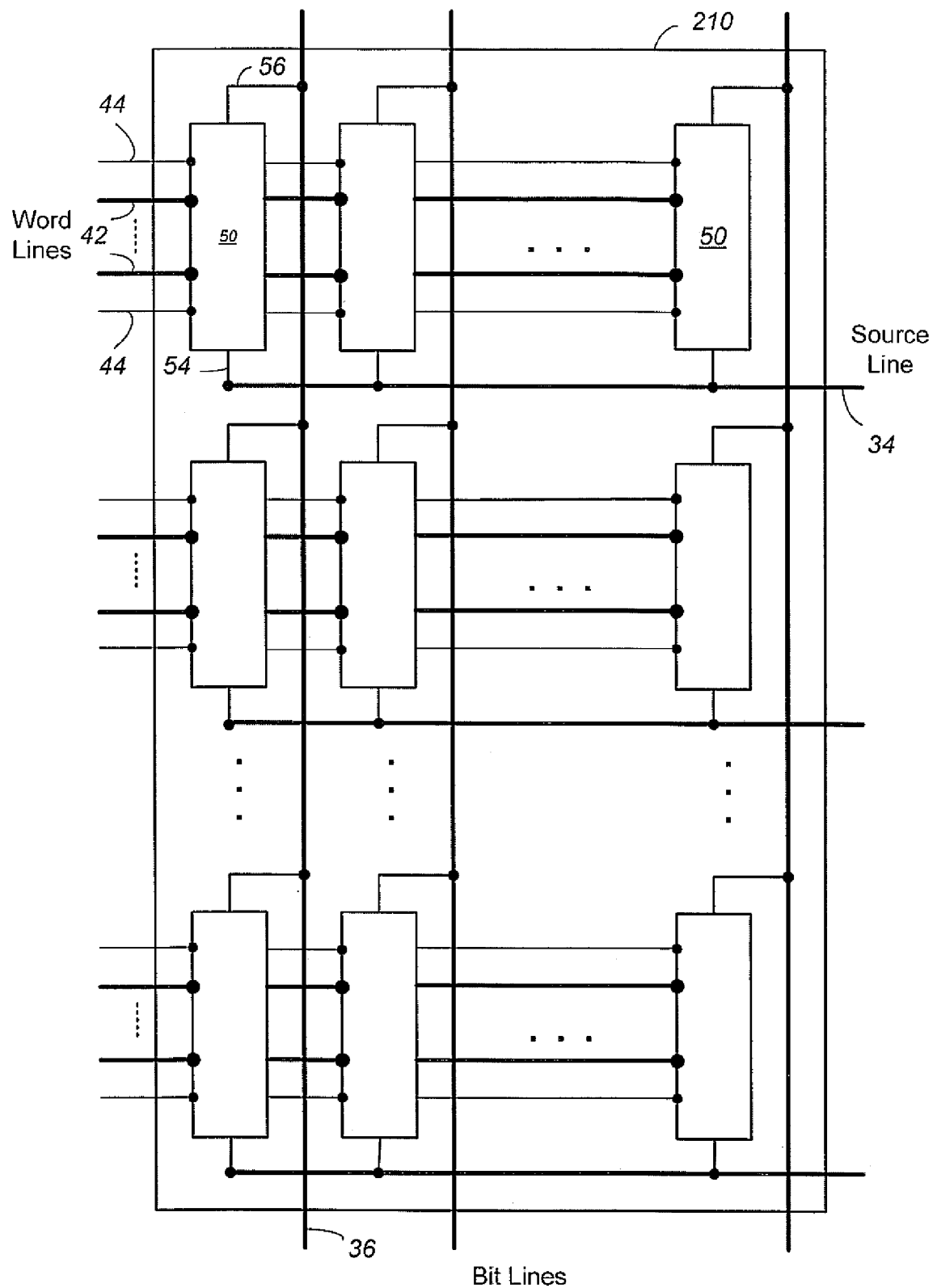
FIG. 4B illustrates an example of an NAND array 210 of memory cells, constituted from NAND strings 50 such as that shown in FIG. 4A.

FIG. 4B illustrates an example of an NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is couple to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings. When a memory transistor within a NAND string is being read, the remaining memory transistors in the string are turned on hard via their associated word lines so that the current flowing through the string is essentially dependent upon the level of charge stored in the cell being read.

Figure 5:
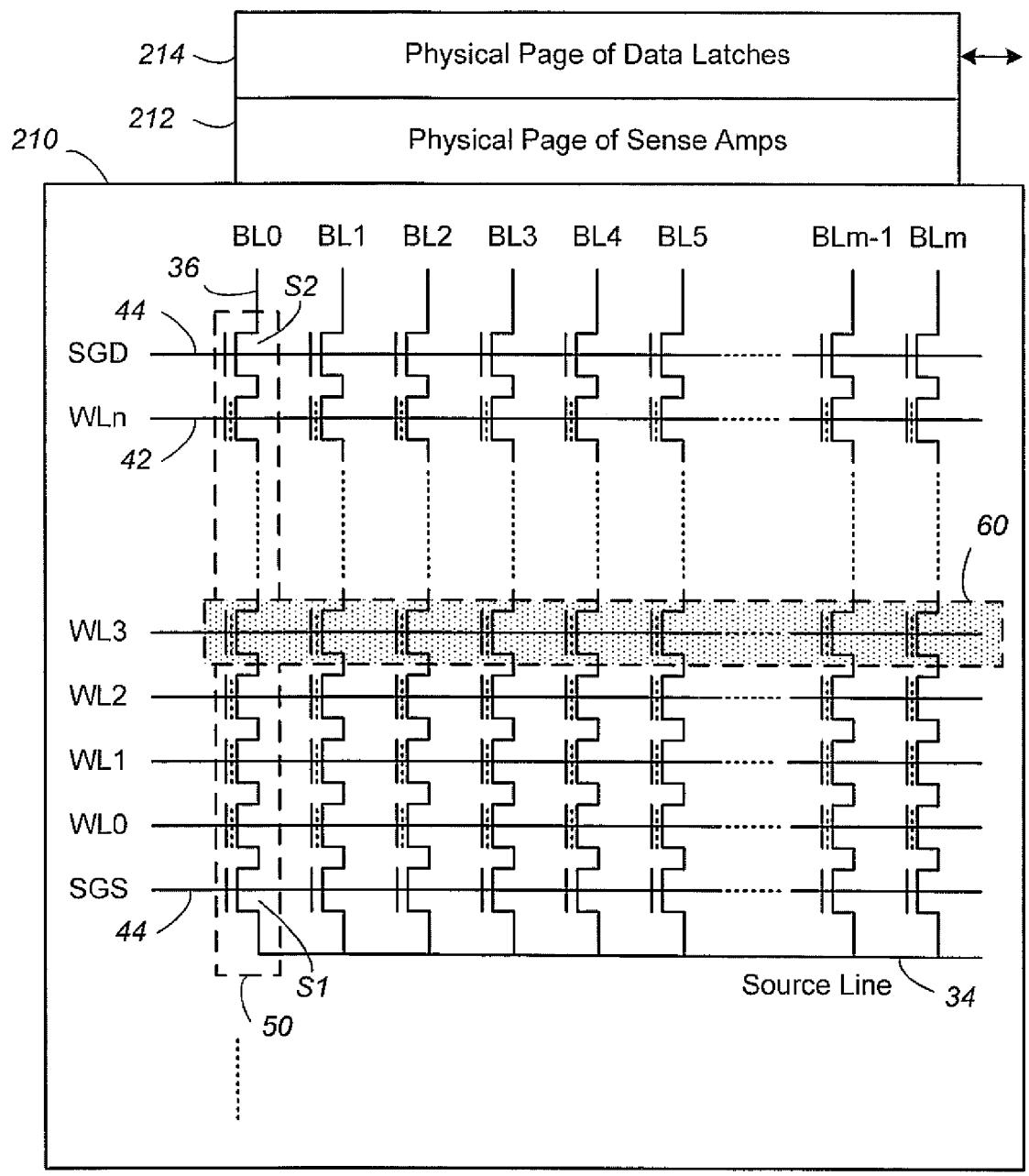
FIG. 5 illustrates a page of memory cells, organized for example in the NAND configuration, being sensed or programmed in parallel.

FIG. 5 illustrates a page of memory cells, organized for example in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A "page" such as the page 60, is a group of memory cells enabled to be sensed or programmed in parallel. This a accomplished by a corresponding page of sense amplifiers 212. The sensed results are latches in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and of type of memory is that a cell must be programmed from the erased state. That is the floating gate must first be emptied of charge. Programming then adds a desired amount of charge back to the floating gate. It does not support removing a portion of the charge from the floating to go from a more programmed state to a lesser one. This means that update data cannot overwrite existing one and must be written to a previous unwritten location.

Furthermore erasing is to empty all the charges from the floating gate and generally takes appreciably time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data. Just before the block is erased, a garbage collection is required to salvage the non-obsolete data in the block.

Each block is typically divided into a number of pages. A page is a unit of programming or reading. In one embodiment, the individual pages may be divided into segments and the segments may contain the fewest number of cells that are written at one time as a basic programming operation. One or more pages of data are typically stored in one row of memory cells. A page can store one or more sectors. A sector includes user data and overhead data. Multiple blocks and pages distributed across multiple arrays can also be operated together as metablocks and metapages. If they are distributed over multiple chips, they can be operated together as megablocks and megapage.

Examples of Multi-Level Cell ("MLC") Memory Partitioning

A nonvolatile memory in which the memory cells each stores multiple bits of data has already been described in connection with FIG. 3. A particular example is a memory formed from an array of field-effect transistors, each having a charge storage layer between its channel region and its control gate. The charge storage layer or unit can store a range of charges, giving rise to a range of threshold voltages for each field-effect transistor. The range of possible threshold voltages spans a threshold window. When the threshold window is partitioned into multiple sub-ranges or zones of threshold voltages, each resolvable zone is used to represent a different memory states for a memory cell. The multiple memory states can be coded by one or more binary bits. For example, a memory cell partitioned into four zones can support four states which can be coded as 2-bit data. Similarly, a memory cell partitioned into eight zones can support eight memory states which can be coded as 3-bit data, etc.

All-Bit, Full-Sequence MLC Programming

Figure 6:
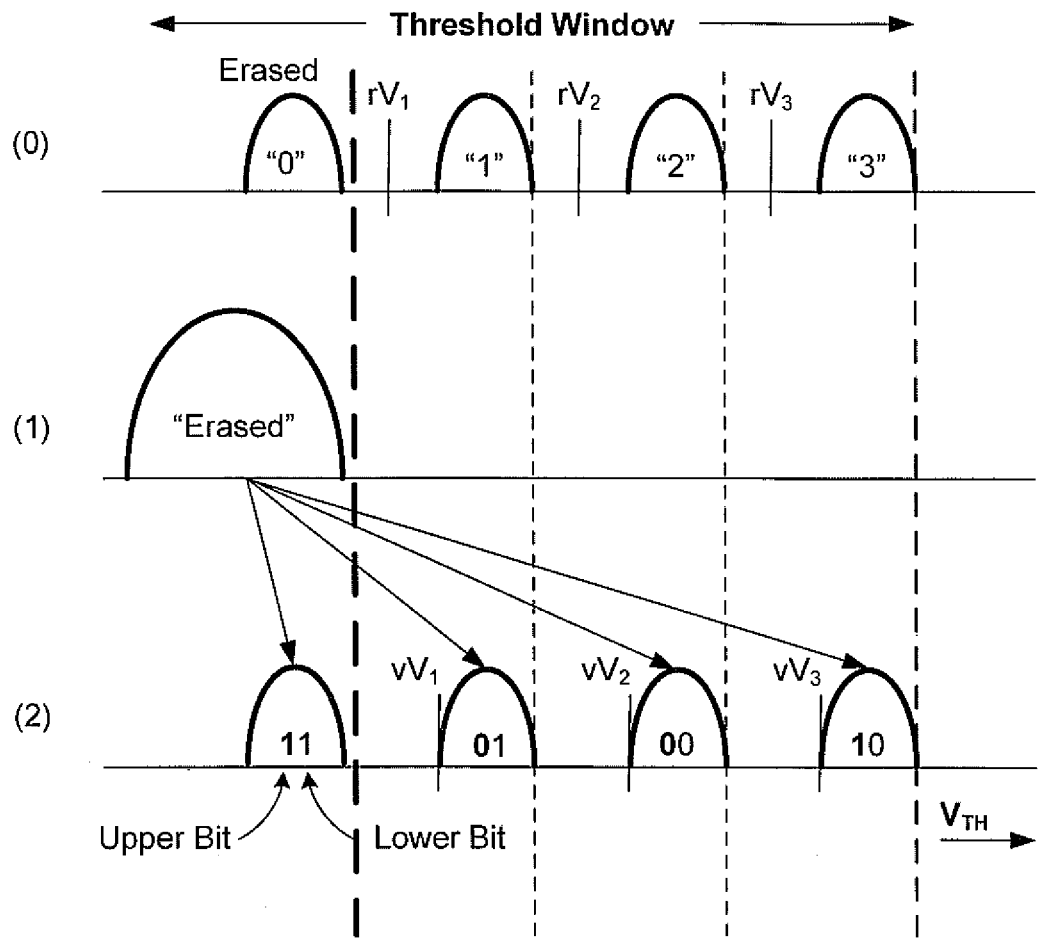
FIGS. 6(0)-6(2) illustrate an example of programming a population of 4-state memory cells.

FIGS. 6(0)-6(2) illustrate an example of programming a population of 4-state memory cells. FIG. 6(0) illustrates the population of memory cells programmable into four distinct distributions of threshold voltages respectively representing memory states "0", "1", "2" and "3". FIG. 6(1) illustrates the initial distribution of "erased" threshold voltages for an erased memory. FIG. 6(2) illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed state "1", "2" and "3" or remain un-programmed in the "erased" state. As the memory gets more programming, the initial distribution of the "erased" state as shown in FIG. 6(1) will become narrower and the erased state is represented by the "0" state.

A 2-bit code having a lower bit and an upper bit can be used to represent each of the four memory states. For example, the "0", "1", "2" and "3" states are respectively represented by "11", "01", "00" and "10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

Bit-by-Bit MLC Programming and Reading

Figure 7A:
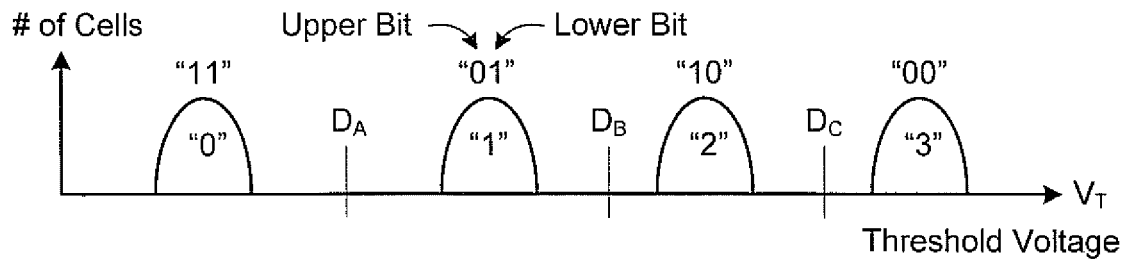
FIGS. 7A-7E illustrate the programming and reading of the 4-state memory encoded with a given 2-bit code.

FIGS. 7A-7E illustrate the programming and reading of the 4-state memory encoded with a given 2-bit code. FIG. 7A illustrates threshold voltage distributions of the 4-state memory array when each memory cell stores two bits of data using the 2-bit code. Such a 2-bit code has been disclosed in U.S. patent application Ser. No. 10/830,824 filed Apr. 24, 2004 by Li et al., entitled "NON-VOLATILE MEMORY AND CONTROL WITH IMPROVED PARTIAL PAGE PROGRAM CAPABILITY".

Figure 7B:
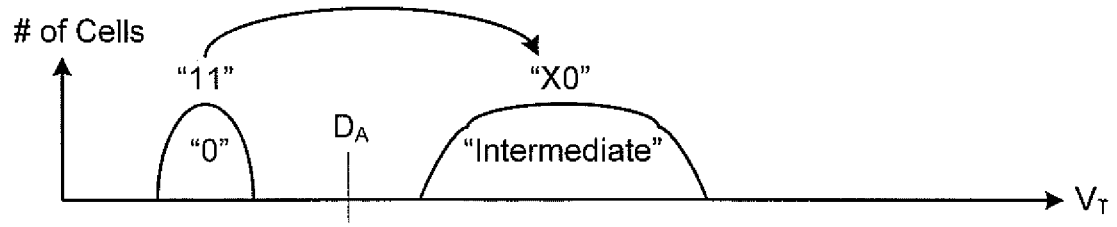

FIG. 7B illustrates the lower page programming (lower bit) in a 2-pass programming scheme using the 2-bit code. The fault-tolerant LM New code essentially avoids any upper page programming to transit through any intermediate states. Thus, the first pass lower page programming has the logical state (upper bit, lower bit)=(1, 1) transits to some intermediate state (x, 0) as represented by programming the "unprogrammed" memory state "0" to the "intermediate" state designated by (x, 0) with a programmed threshold voltage greater than $D_A$ but less than $D_C$.

Figure 7C:
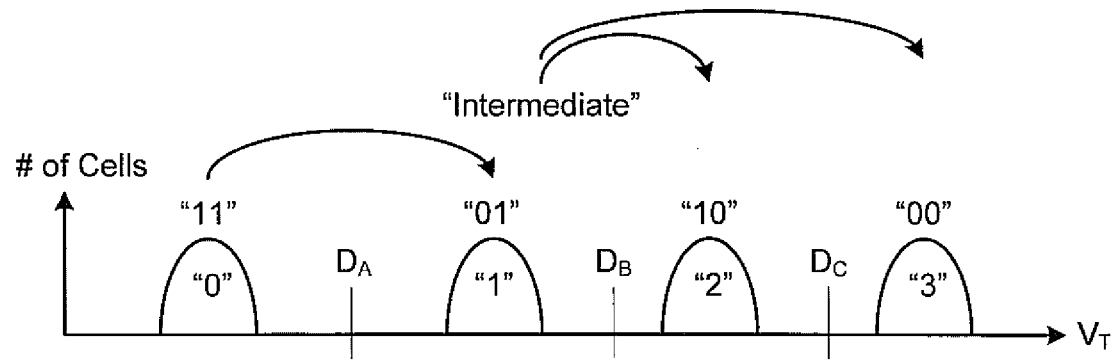

FIG. 7C illustrates the upper page programming (upper bit) in the 2-pass programming scheme using the 2-bit code. In the second pass of programming the upper page bit to "0", if the lower page bit is at "1", the logical state (1, 1) transits to (0, 1) as represented by programming the "unprogrammed" memory state "0" to "1". If the lower page bit is at "0", the logical state (0, 0) is obtained by programming from the "intermediate" state to "3". Similarly, if the upper page is to remain at "1", while the lower page has been programmed to "0", it will require a transition from the "intermediate" state to (1, 0) as represented by programming the "intermediate" state to "2".

Figure 7D:
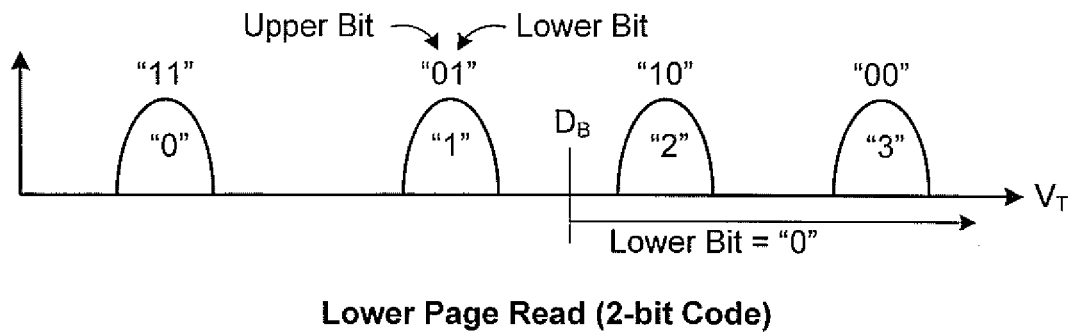

FIG. 7D illustrates the read operation that is required to discern the lower bit of the 4-state memory encoded with the 2-bit code. A readB operation is first performed to determine if the LM flag can be read. If so, the upper page has been programmed and the readB operation will yield the lower page data correctly. On the other hand, if the upper page has not yet been programmed, the lower page data will be read by a readA operation.

Figure 7E:
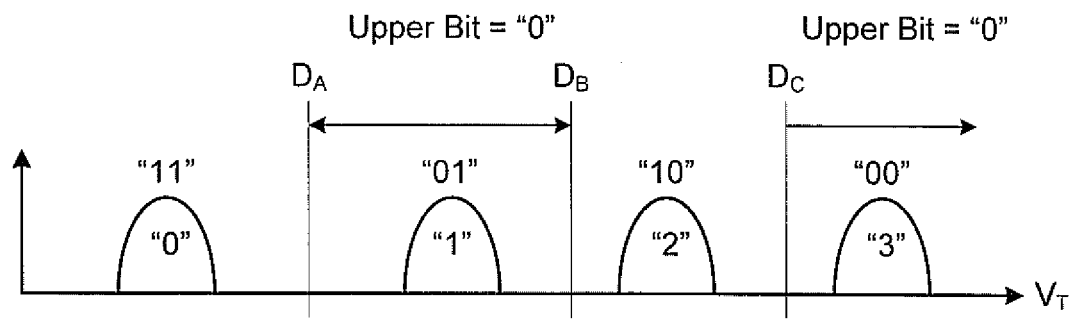

FIG. 7E illustrates the read operation that is required to discern the upper bit of the 4-state memory encoded with the 2-bit code. As is clear from the figure, the upper page read will require a 3-pass read of readA, readB and readC, respectively relative to the demarcation threshold voltages $D_A$, $D_B$ and $D_C$.

In the bit-by-bit scheme for a 2-bit memory, a physical page of memory cells will store two logical data pages, a lower data page corresponding to the lower bit and an upper data page corresponding to the upper bit.

Binary and MLC Memory Partitioning

FIG. 6 and FIG. 7 illustrate examples of a 2-bit (also referred to as "D2") memory. As can be seen, a D2 memory has its threshold range or window partitioned into 4 regions, designating 4 states. Similarly, in D3, each cell stores 3 bits (low, middle and upper bits) and there are 8 regions. In D4, there are 4 bits and 16 regions, etc. As the memory's finite threshold window is partitioned into more regions, the resolution and for programming and reading will necessarily become finer. Two issues arise as the memory cell is configured to store more bits.

First, programming or reading will be slower when the threshold of a cell must be more accurately programmed or read. In fact in practice the sensing time (needed in programming and reading) tends to increase as the square of the number of partitioning levels.

Secondly, flash memory has an endurance problem as it ages with use. When a cell is repeatedly programmed and erased, charges is shuttled in and out of the floating gate 20 (see FIG. 2) by tunneling across a dielectric. Each time some charges may become trapped in the dielectric and will modify the threshold of the cell. In fact over use, the threshold window will progressively narrow. Thus, MLC memory generally is designed with tradeoffs between capacity, performance and reliability.

Conversely, it will be seen for a binary memory, the memory's threshold window is only partitioned into two regions. This will allow a maximum margin of errors. Thus, binary partitioning while diminished in storage capacity will provide maximum performance and reliability.

The multi-pass, bit-by-bit programming and reading technique described in connection with FIG. 7 provides a smooth transition between MLC and binary partitioning. In this case, if the memory is programmed with only the lower bit, it is effectively a binary partitioned memory. While this approach does not fully optimize the range of the threshold window as in the case of a single-level cell ("SLC") memory, it has the advantage of using the same demarcation or sensing level as in the operations of the lower bit of the MLC memory. As will be described later, this approach allows a MLC memory to be "expropriated" for use as a binary memory, or vice versa. How it should be understood that MLC memory tends to have more stringent specification for usage.

Binary Memory and Partial Page Programming

The charge programmed into the charge storage element of one memory cell produces an electric field that perturbs the electric field of a neighboring memory cell. This will affect the characteristics of the neighboring memory cell which essentially is a field-effect transistor with a charge storage element. In particular, when sensed the memory cell will appear to have a higher threshold level (or more programmed) than when it is less perturbed.

In general, if a memory cell is program-verified under a first field environment and later is read again under a different field environment due to neighboring cells subsequently being programmed with different charges, the read accuracy may be affected due to coupling between neighboring floating gates in what is referred to as the "Yupin Effect". With ever higher integration in semiconductor memories, the perturbation of the electric field due to the stored charges between memory cells (Yupin effect) becomes increasing appreciable as the inter-cellular spacing shrinks.

The Bit-by-Bit MLC Programming technique described in connection with FIG. 7 above is designed to minimize program disturb from cells along the same word line. As can be seen from FIG. 7B, in a first of the two programming passes, the thresholds of the cells are moved at most half way up the threshold window. The effect of the first pass is overtaken by the final pass. In the final pass, the thresholds are only moved a quarter of the way. In other words, for D2, the charge difference among neighboring cells is limited to a quarter of its maximum. For D3, with three passes, the final pass will limit the charge difference to one-eighth of its maximum.

However, the bit-by-bit multi-pass programming technique will be compromised by partial-page programming. A page is a group of memory cells, typically along a row or word line, that is programmed together as a unit. It is possible to program non overlapping portions of a page individually over multiple programming passes. However, owning to not all the cells of the page are programmed in a final pass together, it could create large difference in charges programmed among the cells after the page is done. Thus partial-page programming would result in more program disturb and would require a larger margin for sensing accuracy.

In the case the memory is configured as binary memory, the margin of operation is wider than that of MLC. In the preferred embodiment, the binary memory is configured to support partial-page programming in which non-overlapping portions of a page may be programmed individually in one of the multiple programming passes on the page. The programming and reading performance can be improved by operating with a page of large size. However, when the page size is much larger than the host's unit of write (typically a 512-byte sector), its usage will be inefficient. Operating with finer granularity than a page allows more efficient usage of such a page.

The example given has been between binary versus MLC. It should be understood that in general the same principles apply between a first memory with a first number of levels and a second memory with a second number of levels more than the first memory.

Logical and Physical Block Structures

Figure 8:
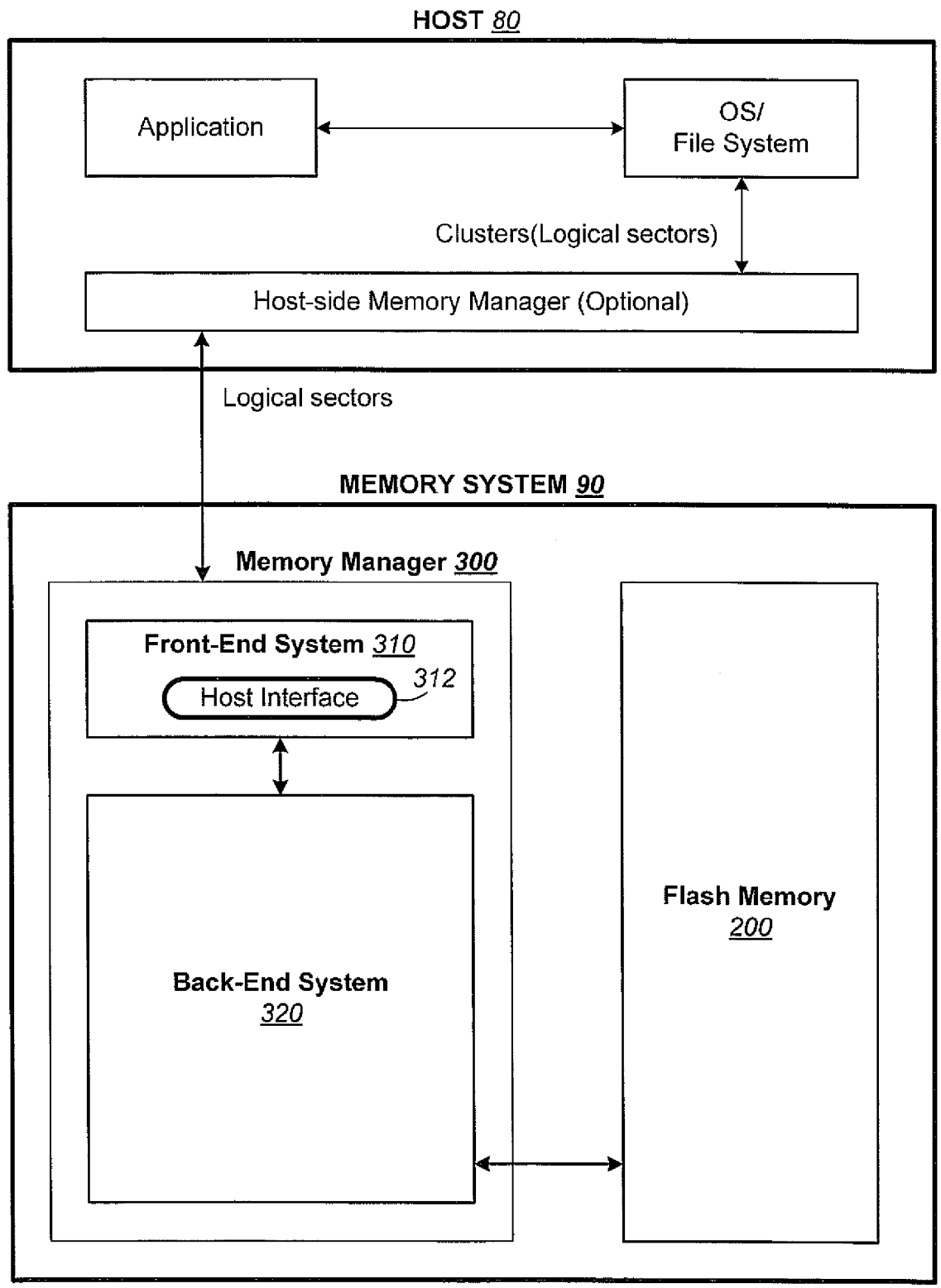
FIG. 8 illustrates the memory being managed by a memory manager with is a software component that resides in the controller.

FIG. 8 illustrates the memory being managed by a memory manager with is a software component that resides in the controller. The memory 200 is organized into blocks, each block of cells being a minimum unit of erase. Depending on implementation, the memory system may operate with even larger units of erase formed by an aggregate of blocks into "metablocks" and also "megablocks". For convenience the description will refer to a unit of erase as a metablock although it will be understood that some systems operate with even larger unit of erase such as a "megablock" formed by an aggregate of metablocks.

The host 80 accesses the memory 200 when running an application under a file system or operating system. Typically, the host system addresses data in units of logical sectors where, for example, each sector may contain 512 bytes of data. Also, it is usual for the host to read or write to the memory system in unit of logical clusters, each consisting of one or more logical sectors. In some host systems, an optional host-side memory manager may exist to perform lower level memory management at the host. In most cases during read or write operations, the host 80 essentially issues a command to the memory system 90 to read or write a segment containing a string of logical sectors of data with contiguous addresses.

A memory-side memory manager 300 is implemented in the controller 100 of the memory system 90 to manage the storage and retrieval of the data of host logical sectors among metablocks of the flash memory 200. The memory manager comprises a front-end system 310 and a back-end system 320. The front-end system 310 includes a host interface 312. The back-end system 320 includes a number of software modules for managing erase, read and write operations of the metablocks. The memory manager also maintains system control data and directory data associated with its operations among the flash memory 200 and the controller RAM 130.

Figure 9:
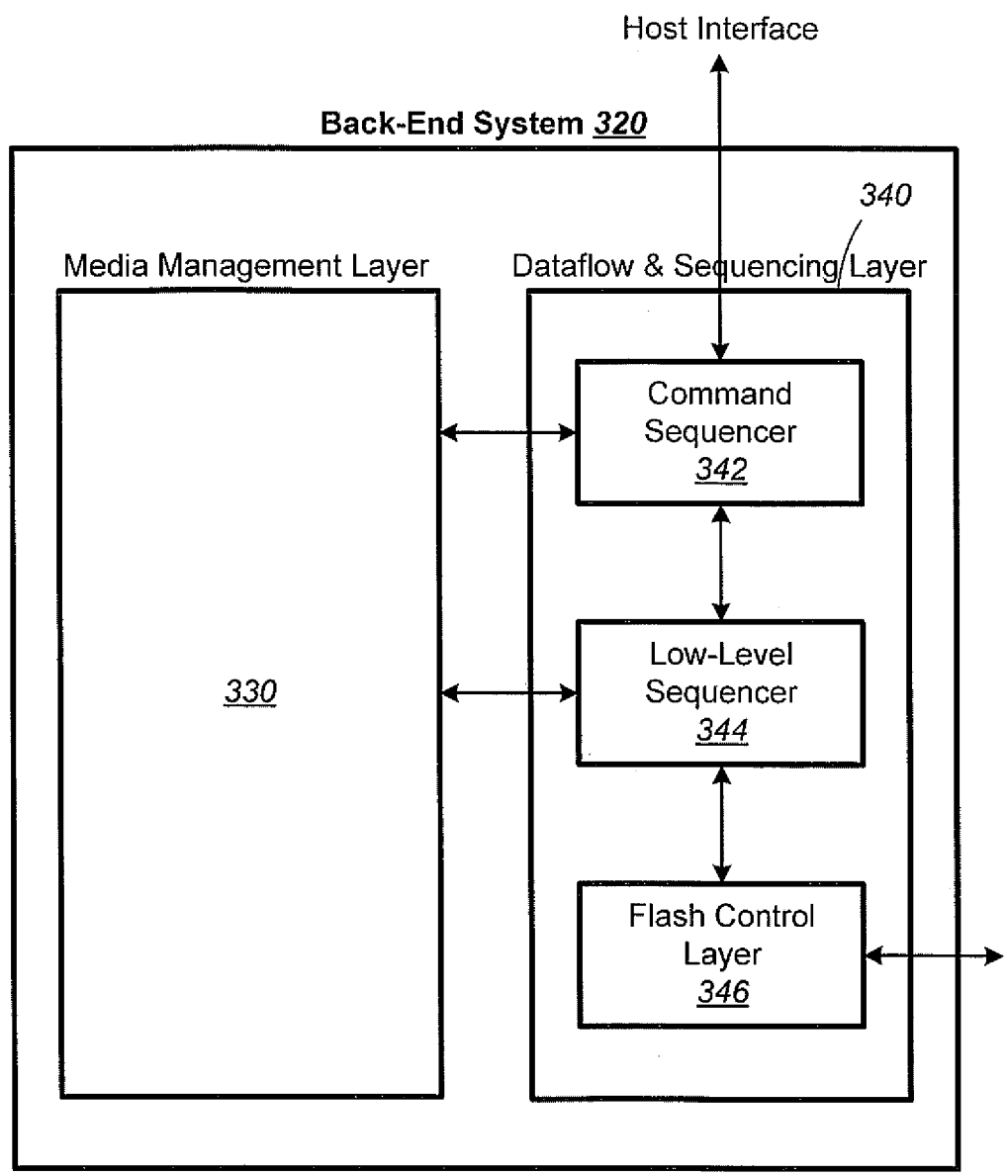
FIG. 9 illustrates the software modules of the back-end system.

FIG. 9 illustrates the software modules of the back-end system. The Back-End System mainly comprises two functional modules: a Media Management Layer 330 and a Dataflow and Sequencing Layer 340.

The media management layer 330 is responsible for the organization of logical data storage within a flash memory meta-block structure. More details will be provided later in the section on "Media management Layer".

The dataflow and sequencing layer 340 is responsible for the sequencing and transfer of sectors of data between a front-end system and a flash memory. This layer includes a command sequencer 342, a low-level sequencer 344 and a flash Control layer 346. More details will be provided later in the section on "Low Level System Spec".

The memory manager 300 is preferably implemented in the controller 100. It translates logical addresses received from the host into physical addresses within the memory array, where the data are actually stored, and then keeps track of these address translations.

Figure 10A:
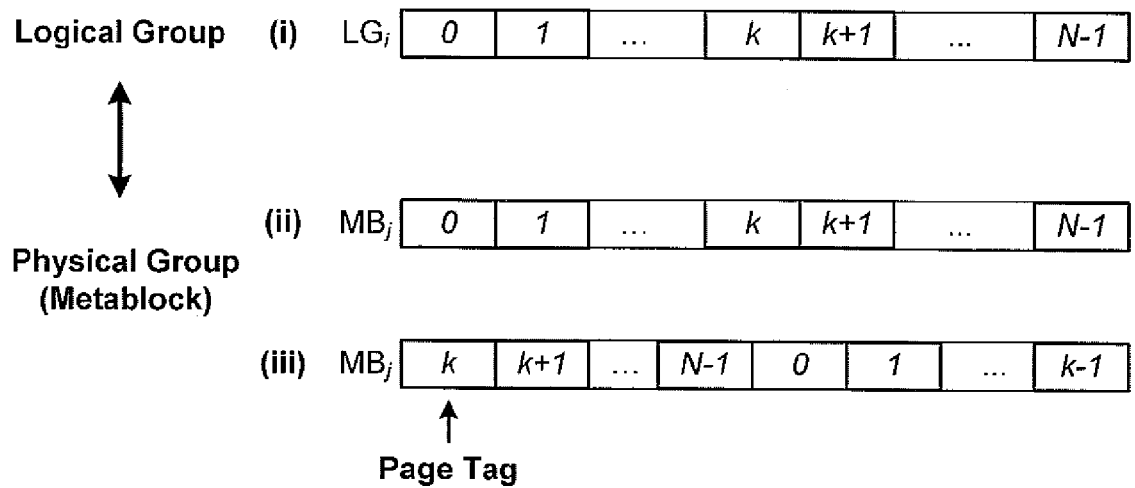
FIGS. 10A(i)-10A(iii) illustrate schematically the mapping between a logical group and a metablock.

FIGS. 10A(i)-10A(iii) illustrate schematically the mapping between a logical group and a metablock. The metablock of the physical memory has N physical sectors for storing N logical sectors of data of a logical group. FIG. 10A(i) shows the data from a logical group $LG_i$, where the logical sectors are in contiguous logical order 0, 1, . . . , N−1. FIG. 10A(ii) shows the same data being stored in the metablock in the same logical order. The metablock when stored in this manner is said to be "sequential." In general, the metablock may have data stored in a different order, in which case the metablock is said to be "non-sequential" or "chaotic."

There may be an offset between the lowest address of a logical group and the lowest address of the metablock to which it is mapped. In this case, logical sector address wraps round as a loop from bottom back to top of the logical group within the metablock. For example, in FIG. 10A(iii), the metablock stores in its first location beginning with the data of logical sector k. When the last logical sector N−1 is reached, it wraps around to sector 0 and finally storing data associated with logical sector k−1 in its last physical sector. In the preferred embodiment, a page tag is used to identify any offset, such as identifying the starting logical sector address of the data stored in the first physical sector of the metablock. Two blocks will be considered to have their logical sectors stored in similar order when they only differ by a page tag.

Figure 10B:
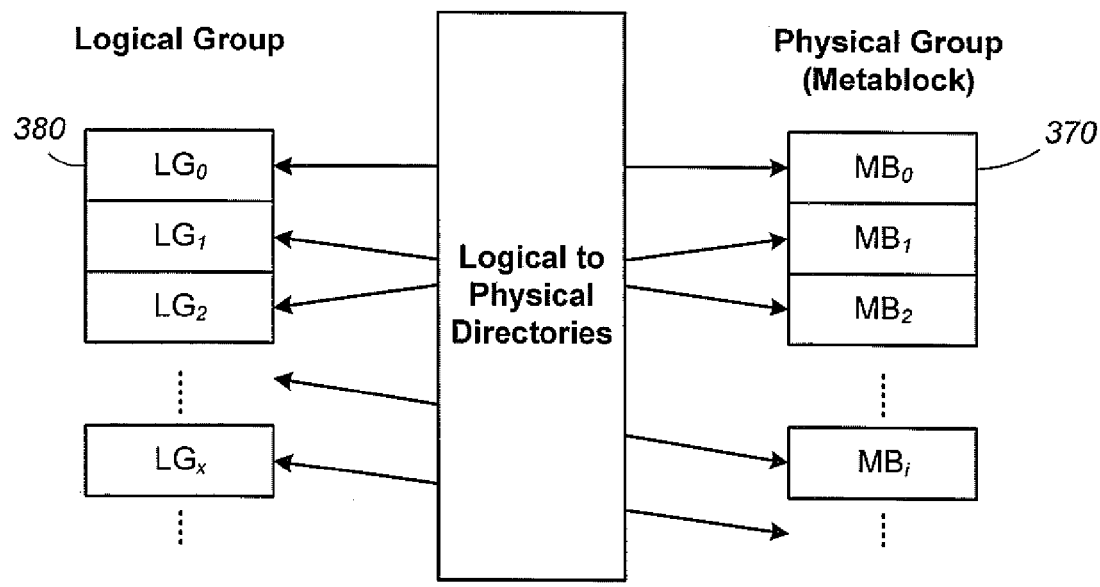
FIG. 10B illustrates schematically the mapping between logical groups and metablocks.

FIG. 10B illustrates schematically the mapping between logical groups and metablocks. Each logical group 380 is mapped to a unique metablock 370, except for a small number of logical groups in which data is currently being updated. After a logical group has been updated, it may be mapped to a different metablock. The mapping information is maintained in a set of logical to physical directories, which will be described in more detail later.

System Abstraction Model

Figure 11:
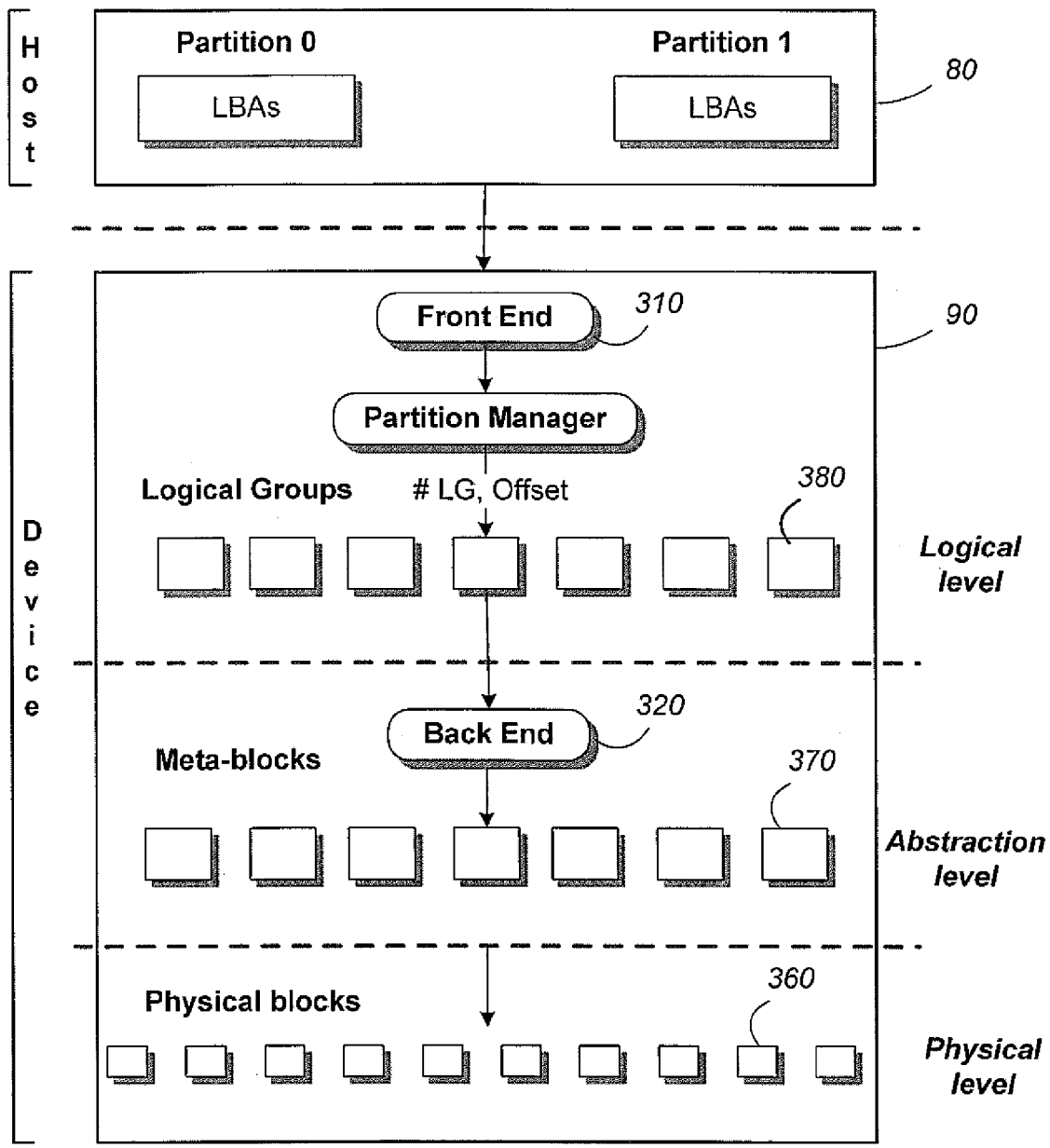
FIG. 11 illustrates the organizational system abstract levels showing the relation between host's logical address LBA, their grouping into logical groups and mapping to groupings of physical blocks (i.e., metablocks).

FIG. 11 illustrates the organizational system abstract levels showing the relation between host's logical address LBA, their grouping into logical groups and mapping to groupings of physical blocks (i.e., metablocks). There are three abstraction levels distributed among the front-end 310 and back-end 320 of the memory manager 300 (see also FIG. 8).

At the front end 310, in a logical organization, a partition manager groups logical units (LBAs) from the host into logical groups. Each logical group 380 will be stored in a metablock 370 of the memory.

At the back end 320, in a physical level, the memory is organized into physical blocks, each physical block 360 being a minimum physical unit of erase. However, to improve performance, greater parallelism is achieved in an abstraction level where an aggregate of blocks (metablock) are logically grouped to be erased together.

Figure 12:
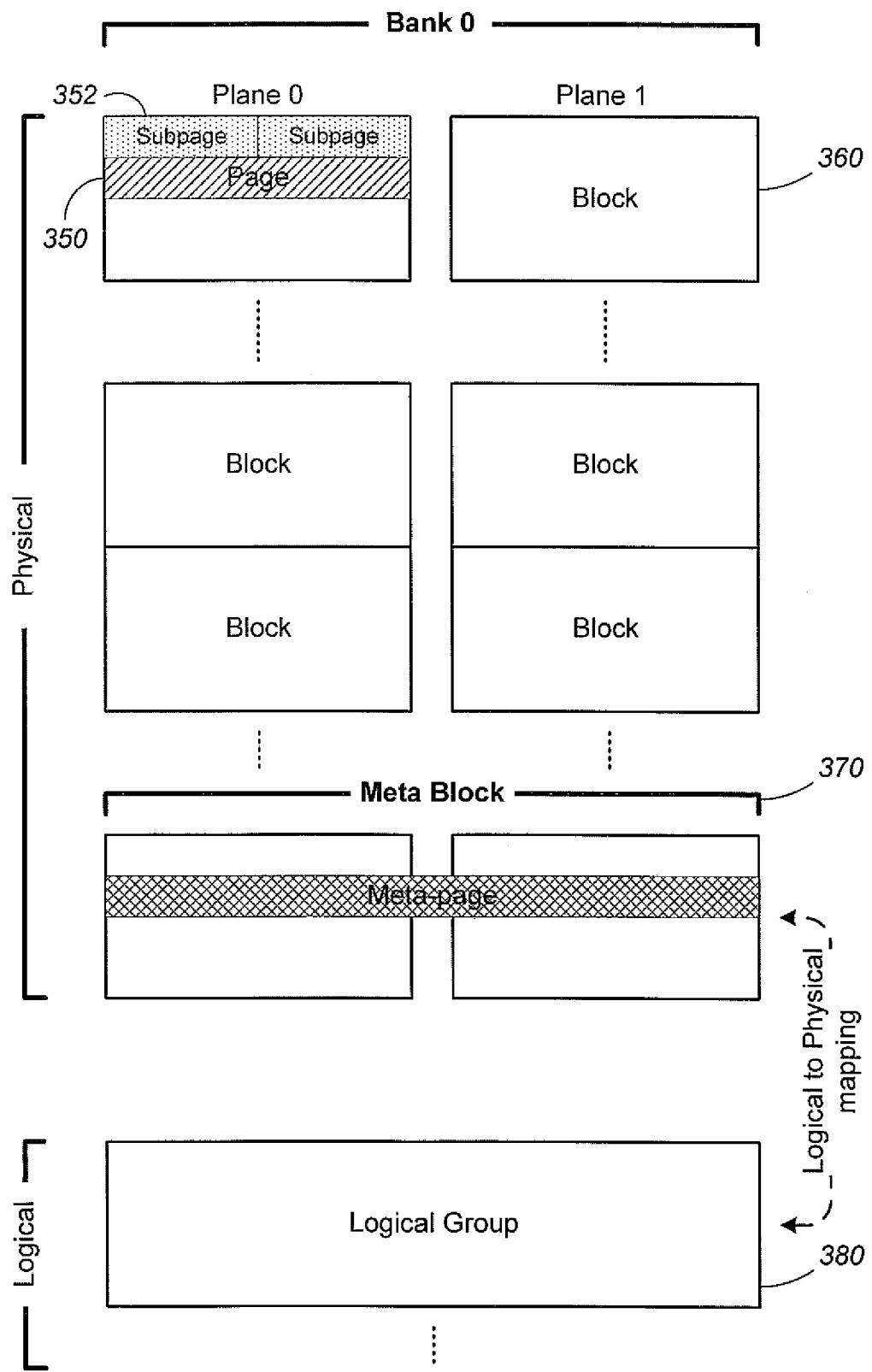
FIG. 12 illustrates the physical and logical memory architecture.

FIG. 12 illustrates the physical and logical memory architecture. Physically, the memory is organized into blocks which are the minimum unit of erase physically. Typically, a memory plane is an array of memory cells served by a page of sensing circuits. The plane contains a plurality of blocks. Each block 360 contains multiple physical pages. For binary memory, each physical page 350 stores one data page. For MLC, each physical page stores more than one data page. The physical page 350 is further partitioned into subpages. For binary memory, each subpage 352 stores one data ECC page. A metablock 370 is a logical grouping of erase blocks across multiple planes for the memory manager to erase as a unit. Similarly a metapage 372 is a logical grouping of pages across multiple planes for the memory manager to program or read as a unit. The logical group is a grouping of host logical units that are to be store in a metablock.

Figure 13:
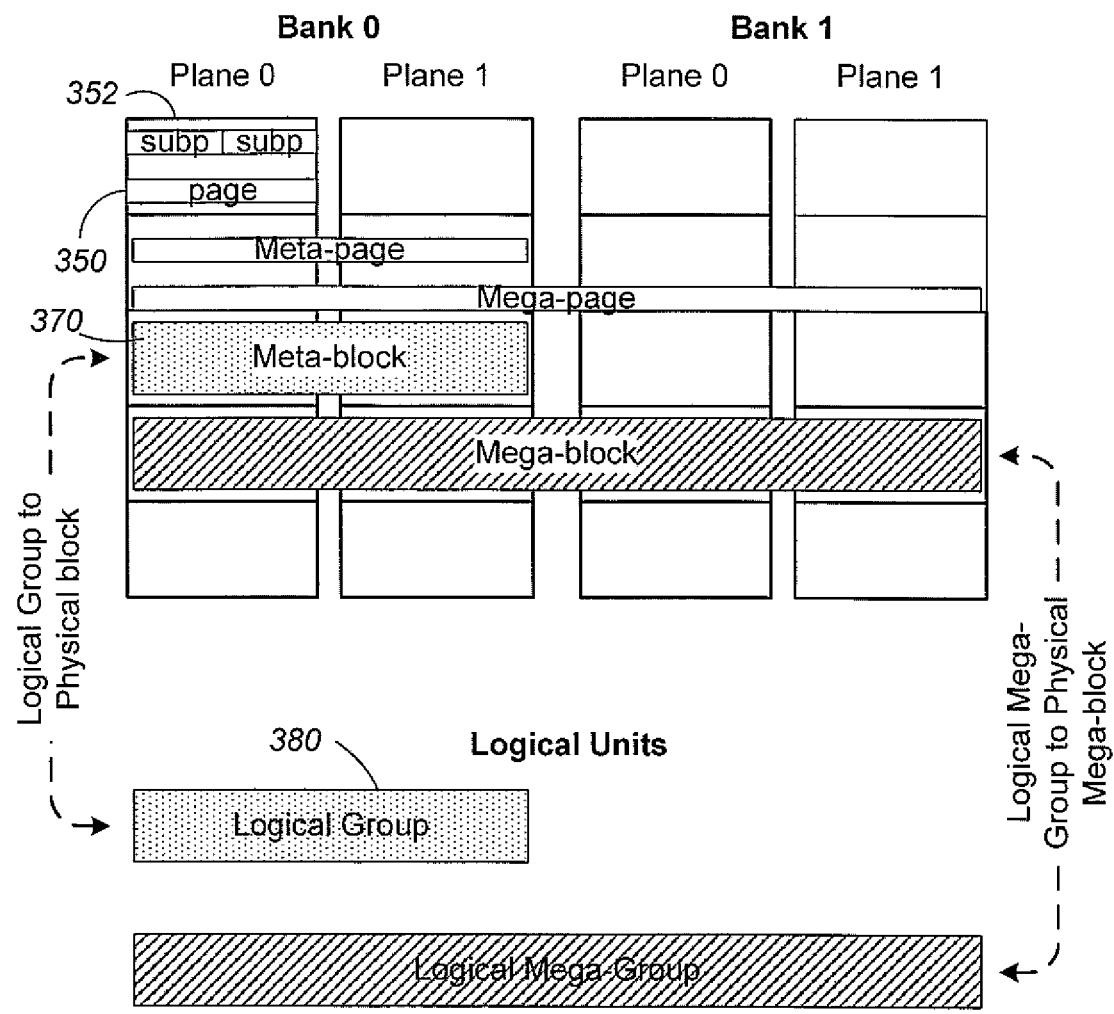
FIG. 13 illustrates the physical and logical memory architecture across multiple banks.

FIG. 13 illustrates the physical and logical memory architecture across multiple banks. Even more parallelism is achieved when the various entities are logical grouped across banks. The aggregated entities are each label with the prefix "mega". In particular, the various entities are defined below.

Figure 14A:
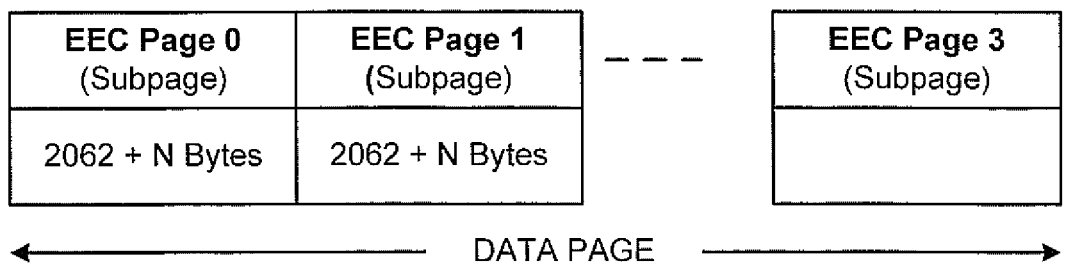
FIG. 14A illustrates a data page consisting of multiple ECC pages.

FIG. 14A illustrates a data page consisting of multiple ECC pages. For example, a data page may consist of 2, 4, or 8 ECC pages. A data page resides in a physical page 350 (see FIG. 13.) Similarly, an ECC page resides in a subpage 352.

Figure 14B:
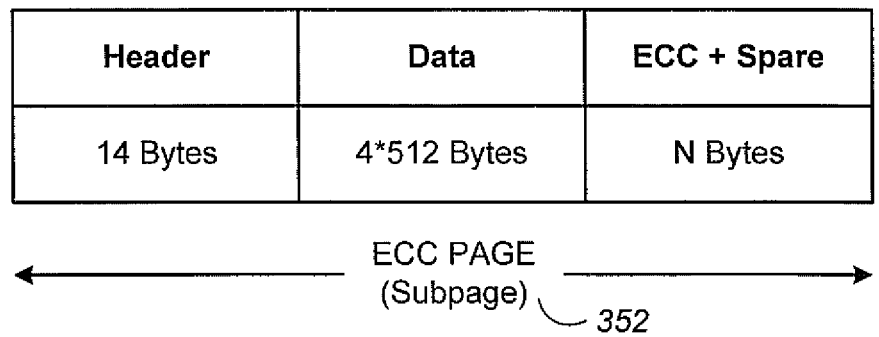
FIG. 14B illustrates an example format for an ECC page which stores only binary data and reside in a subpage.

FIG. 14B illustrates an example format for an ECC page which stores only binary data and reside in a subpage. It has three fields: a header of 14 bytes, a data section of four 512-byte sectors and a ECC plus spare portion of N bytes.

The following is a terminology for the abstraction model:
Physical NAND Layer Terms Physical Page: A maximum set of NAND memory cells which can be read or programmed concurrently in a physical block. A physical page can store one (SLC/Binary/D1) or more (MLC/D2, D3, D4)) data pages.

Data Page: A minimum amount of data which can be read and programmed concurrently in a physical block. MLC data pages differ from each other in accordance with the programming mode and order. There are Low and High pages in D2; Lower, Middle, and Upper pages in D3.

Word-line (wordline): A row of NAND memory cells across a physical block, which normally consists of one (in ABL memories) or two (called even and odd pages) physical pages.

Physical block: The minimum physical erase unit. Block consists of fixed number of physical pages and word-lines.

Plane: A subset of physical blocks within a die where the blocks are evenly distributed among planes. Parallel operations (write, read, or erase) are possible on a single block on each plane within a die.

Die: A die is a physical blocks array of one or more planes. Each die supports asynchronous operations relative to the other dies.

Chip: A chip is one or more dies, where chip-select line defines a chip.

Multi-chip package: A physical package with multiple chip select lines is referred to as multi-chip package.

Channel: A physical path to access a chip or group of chips. Channels on a card are mutually exclusive. A channel can access one or more memory banks.
Abstraction Level Terms Data Page: The Abstraction Model Data Page Maps to Physical NAND Layer Data Page. The Page can be programmed up to certain number of times depending on the memory technology and reliability requirements. Typically, Data Page can only be programmed once in MLC mode and 4 times in Binary or lower-page-only modes.

Sector: Sector is 512 Bytes of host data identified by Logical Group number and offset within the Logical Group.

ECC Page: The theoretically minimum read and program data unit for the memory management with an ECC Page header, all data (2048 bytes in BE5, or 4 sectors worth of data) protected by single ECC, all stored together. One Data Page can map 2, 4 or 8 ECC Pages, depending on the Data Page size.

Meta-page: The maximum read and program unit in a bank. Meta-page comprises all data pages across a meta-block which can be read and programmed concurrently. Meta-page consists of one or more die-pages.

Die-Page: The maximum read and program unit in a die. Die-page is made of all data pages across a die, which can be read and programmed concurrently. Die-page consists of one or more data pages.

Mega-page: The maximum read and program unit in a multi-bank product. Mega-page is made of all data pages across mega-block which can be read and programmed concurrently. Mega-page consists of one or more meta-pages.

Meta-block: The minimum erasable unit used by the memory management system, comprises a set of physical blocks. Normally, all meta-blocks are parallel-connected meaning they can be accessed independently and concurrently. Physical blocks forming a meta-block may be located in planes within a single chip, or in planes distributed across multiple chips, accessible from the same channel. When a meta-block is a group of multiple physical blocks they must be organized according to the interleave rules for a chip, die, plane and page; each physical block of the meta-block is capable of being accessed in parallel to the other blocks in the same meta-block Bank: The array of meta-blocks independently managed by memory management system. The bank is one meta-block, one meta-page wide. A flash based product can consist of one or more banks.
Logical Level Terms Logical Sector: A Logical Sector is 512 Bytes of host data identified by LBA within a logical partition. Every Logical Sector maps to an Abstraction Model sector, which is identified by Logical Group number and offset within the Logical Group.

LBA: LBA or Logical Block Address is an identifier for a logical sector in a logically contiguous partition.

Logical Group: The group of contiguous logical sectors which maps to one meta-block. Capacity of Logical Group depends on meta-block's type (D1, D2, D3, or D4). A Logical Group corresponds to a same capacity group of logical sectors, which may or may not be logically contiguous in LBA space of a partition.

Logical Mega-group: The group of contiguous logical sectors which maps to multiple meta-blocks. Capacity of Logical Mega-Group depends on meta-block's type (D1, D2, D3, or D4). A Logical Meta-Group corresponds to a same capacity group of logical sectors, which is logically contiguous in LBA space of a partition. Logical Mega-Group is made of one or more Logical Groups from different banks.

Memory Partitioned Into Main and Binary Cache Portions

According to a general aspect of the invention, in a flash memory having an array of memory cells that are organized into a plurality of blocks, the cells in each block being erased together, the flash memory is partitioned into at least two portions. A first portion forms the main memory for storing mainly user data. Individual memory cells in the main memory being configured to store one or more bits of data in each cell. A second portion forms a cache for data to be written to the main memory. The memory cells in the cache portion are configured to store less bits of data in each cell than that of the main memory. Both the cache portion and the main memory portion operate under a block management system for which cache operation is optimized.

In the preferred embodiment, individual cells in the cache portion are each configured to store one bit of data while the cells in the main memory portion each stores more than one bit of data. The cache portion then operates as a binary cache with faster and more robust write and read performances.

In the preferred embodiment, the cache portion is configured to allow finer granularity of writes than that for the main memory portion. The finer granularity is more compatible with the granularity of logical data units from a host write. Due to requirement to store sequentially the logical data units in the blocks of the main memory, smaller and chaotic fragments of logical units from a series of host writes can be buffered in the cache portion and later reassembly in sequential order to the blocks in the main memory portion.

In one aspect of the invention, the decision for the block management system to write data directly to the main portion or to the cache portion depends on a number of predefined conditions. The predefined conditions include the attributes and characteristics of the data to be written, the state of the blocks in the main memory portion and the state of the blocks in the cache portion.

The Binary Cache of the present system has the follows features and advantages: a) it increases burst write speed to the device; b) it allows data that is not aligned to pages or meta-pages to be efficiently written; c) it accumulates data for a logical group, to minimize the amount of data that must be relocated during garbage collection of a meta-block after the data has been archived to the meta-block; d) it stores data for a logical group in which frequent repeated writes occur, to avoid writing data for this logical group to the meta-block; and e) it buffers host data, to allow garbage collection of the meta-block to be distributed amongst multiple host busy periods.

FIG. 15 illustrates a host operating with the flash memory device through a series of caches at different levels of the system. A Cache is high-speed storage for temporarily storing data being passed between a high-speed and a slower-speed component of the system. Typically high-speed volatile RAM are employed as cache as in a host cache 82 and/or in a controller cache 102 of the memory controller. The non-volatile memory 200 is partitioned into two portions. The first portion 202 has the memory cells operating as a main memory for user data in either MLC or binary mode. The second portion 204 has the memory cells operating as a cache in a binary mode. Thus, the memory 200 is partitioned into a main memory 202 and a binary cache.

Figure 16:
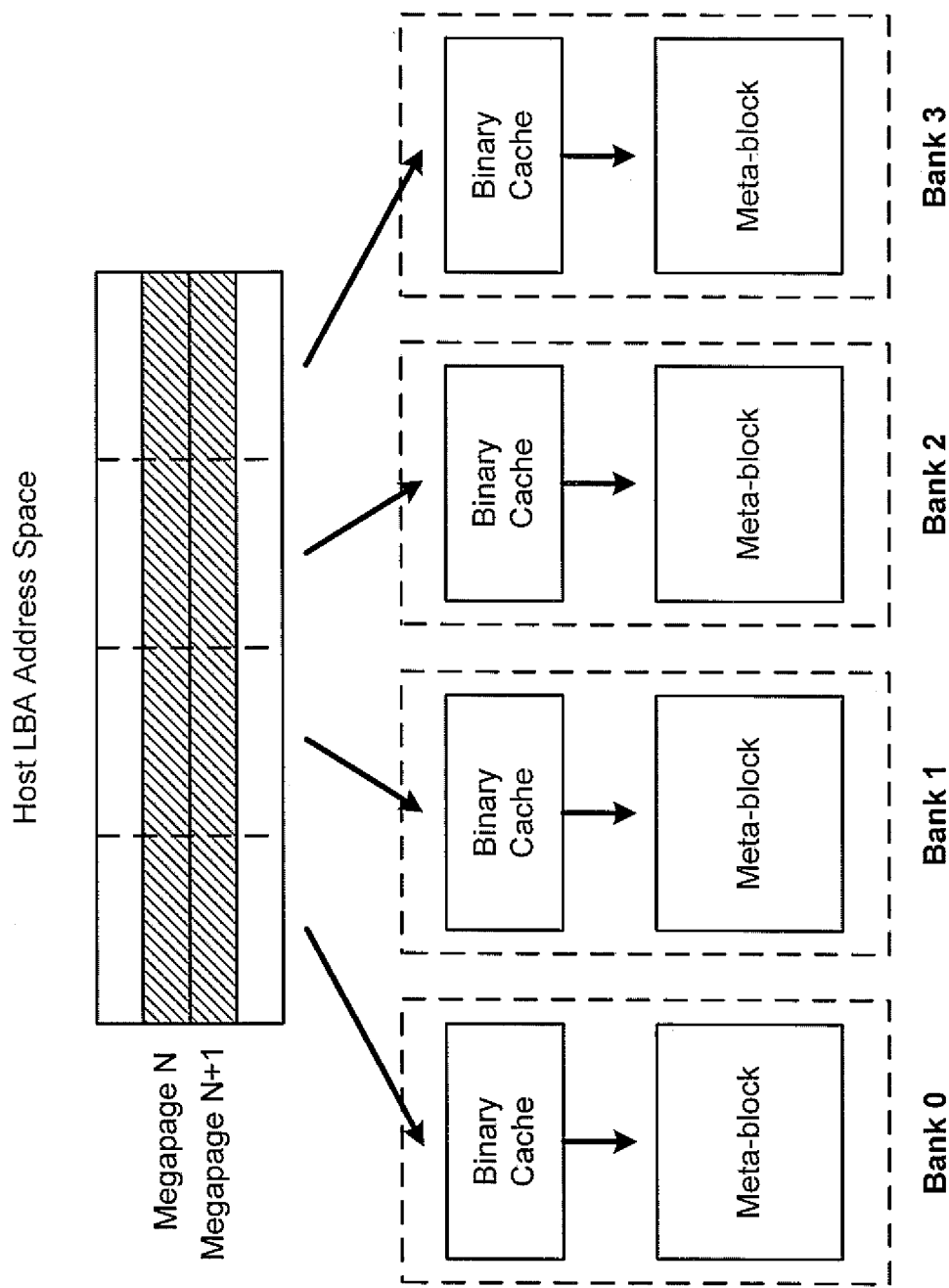
FIG. 16 illustrates the metablocks in each bank being partitioned into a binary cache portion and a regular metablock portion.

FIG. 16 illustrates the metablocks in each bank being partitioned into a binary cache portion and a regular metablock portion. As will be described in more detail later, the binary cache portion has the memory storing binary data, whereas the regular metablock portion is configured as MLC memory that can store one or more bits of data per cell. FIG. 16 also illustrates the mapping of addresses in host LBA address space to banks in a 4-bank memory. Meta-pages N and N+1 interleave across 4 banks, completely independent from each other. As described above, the memory arrays in each bank are organized into metablocks to which logical groups are mapped.

The host LBA address space comprises sequential LBA addresses within mega-pages, where a mega-page is the unit of programming parallelism, with size determined by required write speed to MLC flash.

The LBA address space for binary memory for a single bank comprises sequential LBA addresses within meta-pages, and sequential meta-pages within meta-blocks. For a 4-bank memory, every 4th meta-page in host LBA address space is a meta-page in the sequential LBA address space for one bank, making bank logical space 4 times smaller. An LBA address for a bank comprises a host LBA address with two relevant bits omitted.

Media Management Layer

Figure 17:
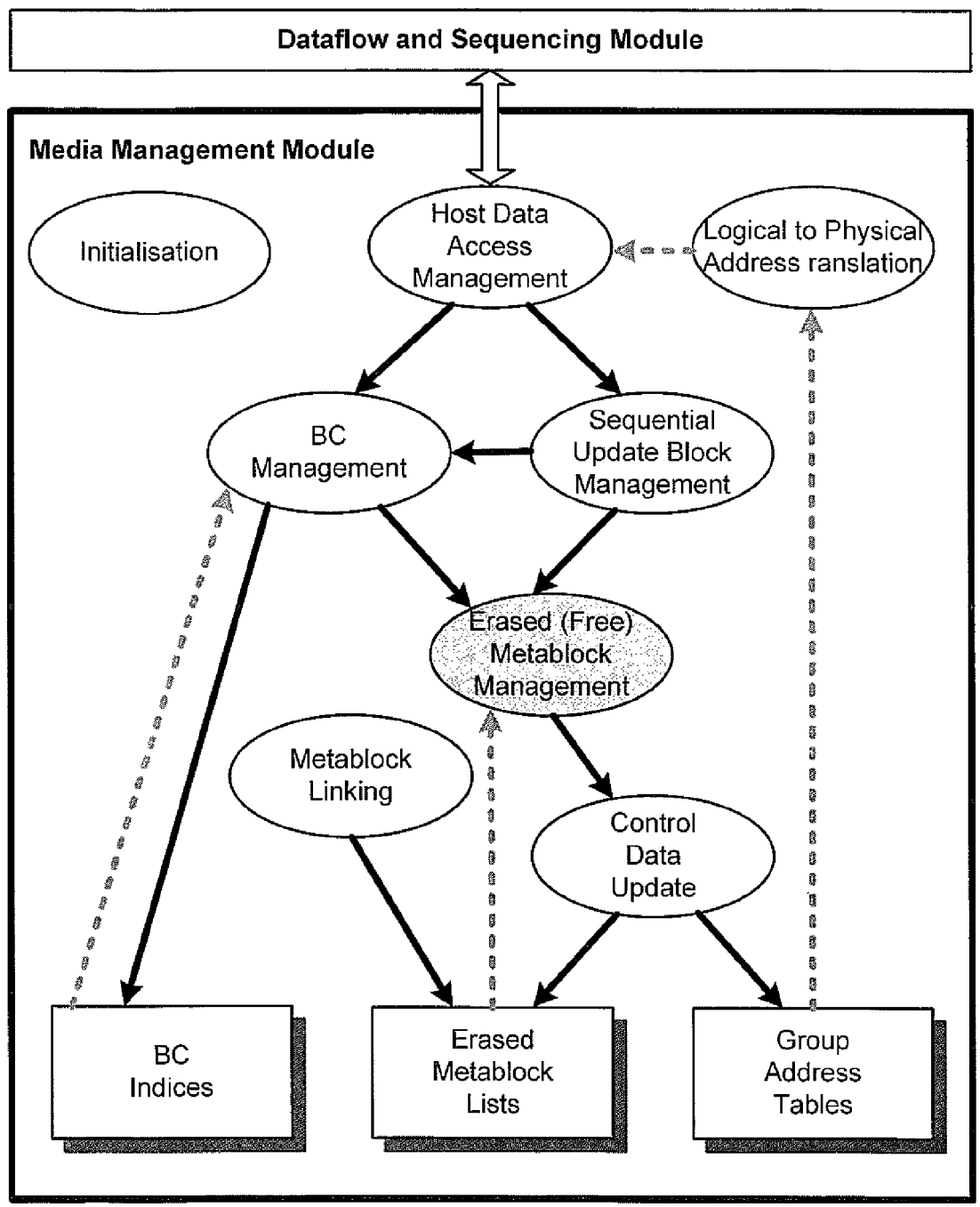
FIG. 17 illustrates processes within the Media Management Module.

The Media Management Layer (MML) 330 (see also FIG. 9) is a module of the Back-End system 320 for managing the organization of logical data storage within a flash memory meta-block structure which it creates and maintains. Specific features include handling of partial meta-page programming, handling of non-sequential and repetitive updates, tables and lists used for logical-to-physical address translation and free block management, and wear leveling based on hot counts FIG. 17 illustrates processes within the Media Management Module. After initialization, a host data access management is responsible for managing data exchange with the dataflow and sequencing module 340 (see also FIG. 9). When host data is received, it sends the host data either directly to the regular MLC portion or in transit to the binary cache ("BC") portion of the memory. If routed to the regular MLC portion, the data will be managed by a sequential update block management module. The sequential update block management module will have the data written page by page sequentially to one of a cluster of update blocks or to a newly allocated update block. If routed to the binary cache ("BC") portion, the data will be managed by a BC management module. The BC management module will have the data in units of ECC pages written into one or more subpages. In either cases, new block may need to be allocated or obsolete blocks recycled in cooperation with an erase (free) metablock management module. A set of control data is generated and maintained during the various block manipulations and data storage into the blocks. The control data includes BC indices, erased metablock lists, group address table ("GAT"). The control data are managed by the modules described earlier as well as a control data update module and a metablock linking module. The translation between logical to physical addresses is handled by a logical to physical address translation module operating with the group address table.

Host Data Storage

Figure 18:
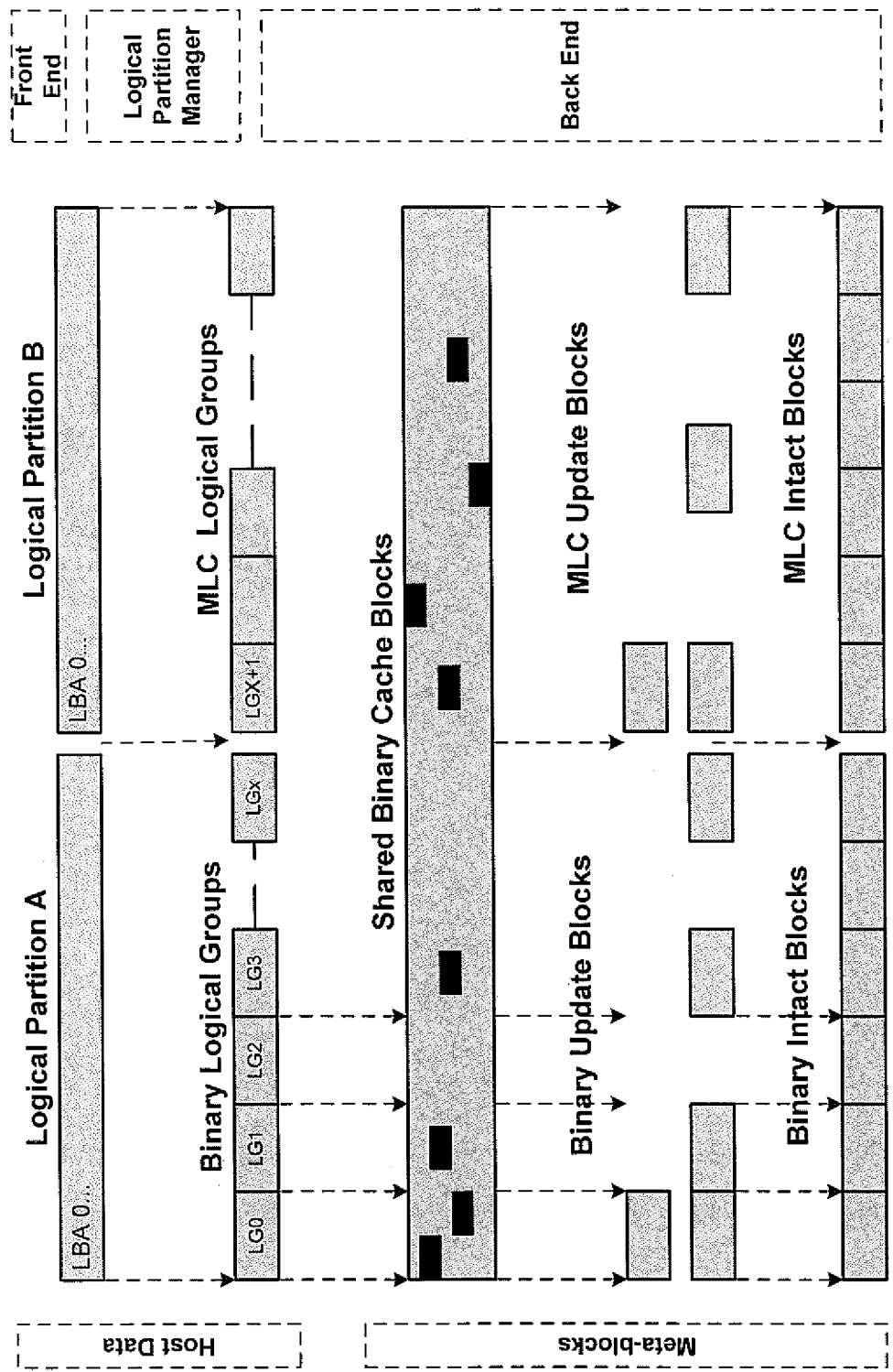
FIG. 18 illustrates the mapping of host logical data to the memory physical memory.

FIG. 18 illustrates the mapping of host logical data to the memory physical memory. All LBAs in all partitions are mapped to Logical Groups—Binary, or MLC, where MLC Logical Groups can be designated as stored in full MLC mode (D2 or D3) or lower-page only mode.

Every Logical Group is mapped to an Intact block. Those Logical Groups which were updated non-sequentially can have some data stored in one ore more Update Blocks. Also, Binary Cache blocks can contain fragments for Logical Groups, regardless if they have Update Blocks or not.

Host Write to Cache or Main Memory

Figure 19:
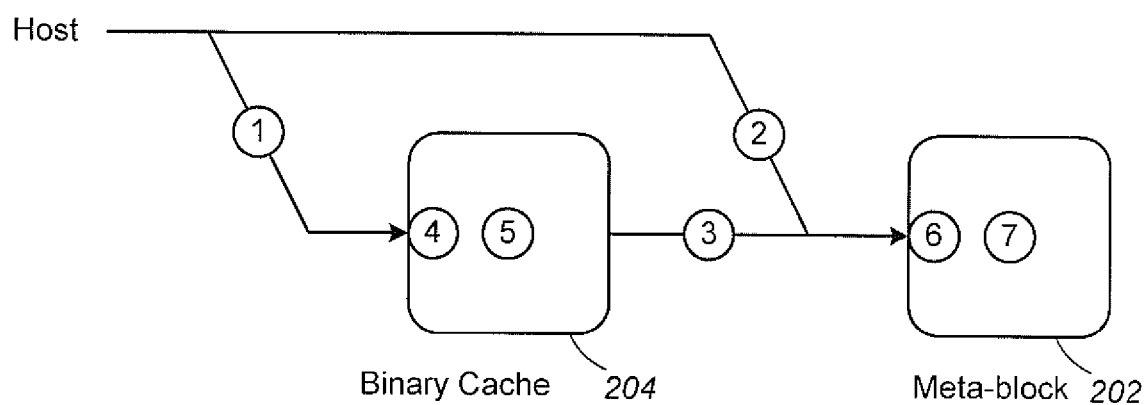
FIG. 19 illustrates the possible data paths and processes from the host to the metablock of the main memory via the binary cache.

FIG. 19 illustrates the possible data paths and processes from the host to the metablock of the main memory via the binary cache. The host data is slated for the metablocks in the main memory 202. The depending on conditions, the data is either written directly to the main memory 202 or in directly via the binary cache 204. The following is a list of the processes and management modules for the various routing shown in the figure.

(1) Binary Cache write from host
(2) Meta-block write from host
(3) Meta-block write from Binary Cache
(4) Binary Cache write management
(5) Binary Cache block management
(6) Meta-block write management
(7) Meta-block management Each of these processes and management modules will be described in more detail in the following sections.

(1) Binary Cache Write From Host

Figure 20A:
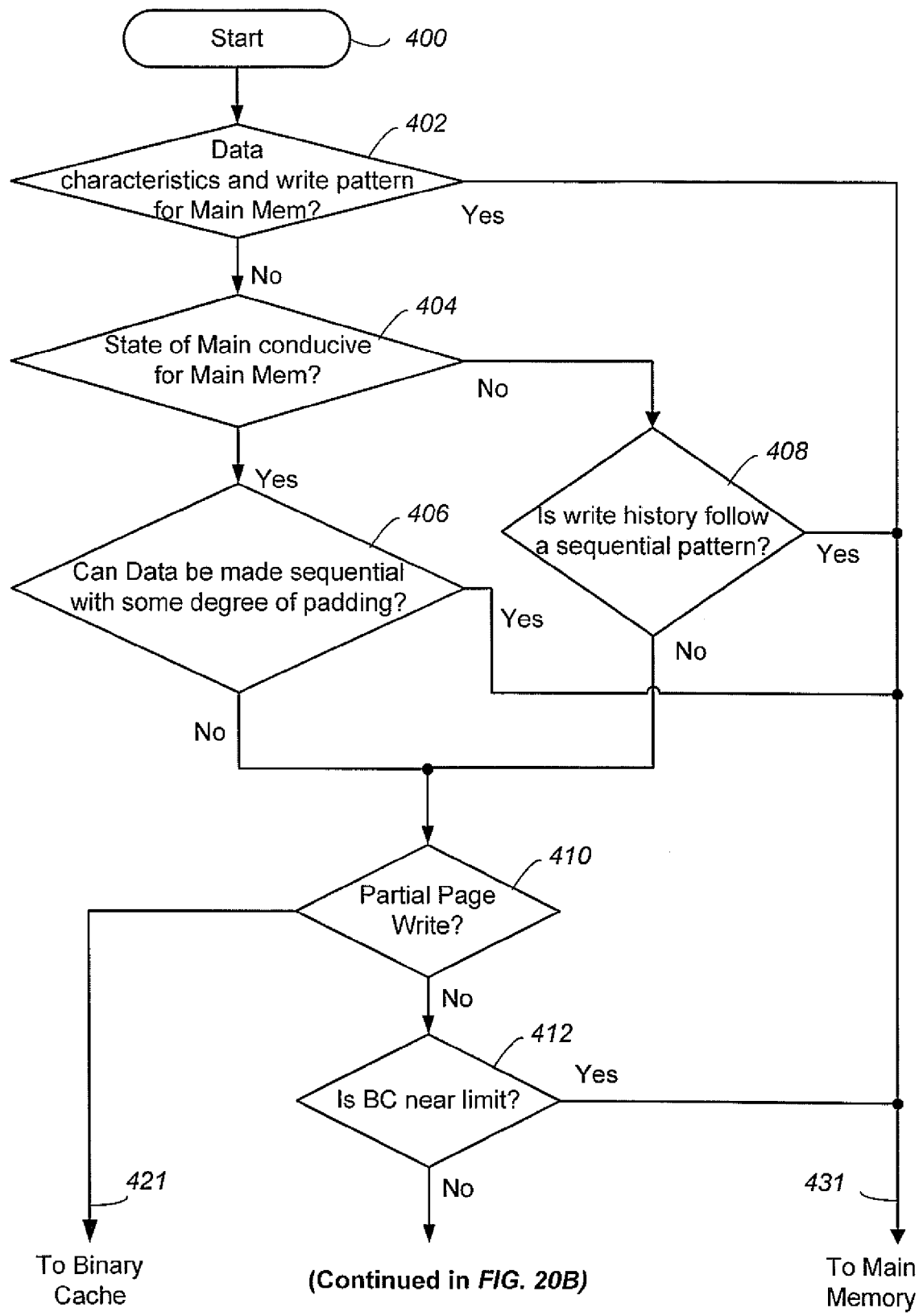
FIG. 20 is a flow diagram of the algorithm in determining if a write is to the binary cache or to the main memory.
Figure 20B:
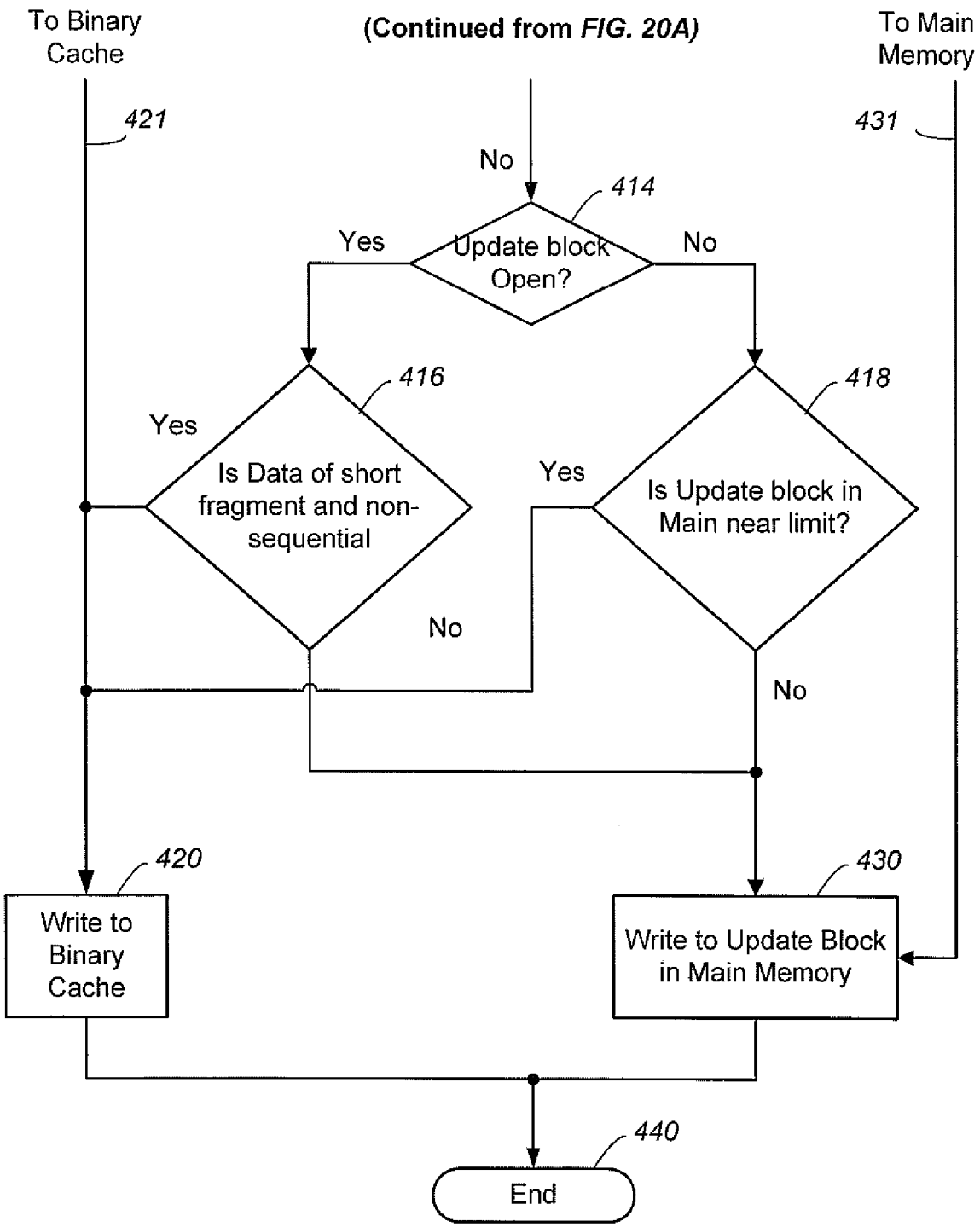

FIG. 20 is a flow diagram of the algorithm in determining if a write is to the binary cache or to the main memory. At a high level, the algorithm for determining whether a host write is to write to the binary cache or to the MLC is based on a combination factors.

First factor is the characteristics of the data in each command write including the pattern of write history. Generally, the write data will (weighing in other factors) preferably be directed to the binary cache if the write is for a short fragment, and/or starting logical address, and/or a partial page, and/or non-sequential relative to recent previous writes. Otherwise the write data will be directed to the main memory.

Second factor is the characteristics or state of the update blocks in the main memory. Generally, the write data will (weighing in other factors) preferably be directed to the main memory if there is an update block already open for the logical group of the write data and/or if the write data has a logical address that is within a predefined range from an existing one in an opened update block, and/or if an update block is not otherwise unavailable. Otherwise the write data will be directed to the binary cache.

Third factor is the characteristics or state of the binary cache. Generally, the write data will (weighing in other factors) preferably be directed to the binary cache unless it becomes full or unavailable for some reason.

STEP 400: Start.

STEP 402: Is data characteristics and write pattern obviously suitable for main memory? If so proceed along line 431 to write to main memory in STEP 430. Otherwise proceed to STEP 404.

In the preferred embodiment, the write data is examined if it conforms to "Secure Digital (SD) speed class data". For example, the write data is considered so if all the following conditions are met. 1) The previous write data for the logical group relating to the current write segments started at an RU size boundary, its length was a multiple of the RU size (Unit of RU size is 16 KB). 2) The current write segment starts at an RU size boundary and its length is greater than or equal to the RU size. 3) The current write segment is sequential to the previous write.

STEP 404: The state of the main memory is examined. If a set of predefined conditions are satisfied, proceed toward a main memory write by going to STEP 408. Otherwise proceed to STEP 406.

In the preferred embodiment, a predefined condition is that an update block for the logical group of the write data already exists.

STEP 406: The starting address of the write data is matched to the next write location in the update block in the main memory. If not sequential, can the gap be filled without excessive padding with existing data to make the write sequential? If so, proceed along line 431 to write to main memory in STEP 430. Otherwise proceed to STEP 410.

In the preferred embodiment, the write is to main memory if all the following conditions are satisfied: 1) The write includes the last sector in a page. 2) The Forward Jump or pad size is less than J (Short Forward Jump) metapage. 3) The pad sectors are available from either the binary cache, update block or intact block in the main memory.

STEP 408: The host write history is examined. If it follows a substantially sequential pattern, proceed along line 431 to write to main memory in STEP 430. Otherwise proceed to STEP 410.

In the preferred embodiment, the write is to main memory if all the following conditions are satisfied: 1) At least two metapages of sequential sector are present prior the first sector of the write. In that case a new update block will be open to store the sequential stream.

STEP 410: Is the write data less than a page? If so, proceed along line 421 to write to binary cache in STEP 420. Otherwise proceed to STEP 412.

STEP 412: With at least a page to be written, the binary cache is examined if its capacity is nearly full. If so write to the main memory instead by proceed along line 431 to write to main memory in STEP 430. Otherwise proceed to STEP 414.

In the preferred embodiment, the write is to main memory if the binary cache is in partial page mode only. The binary cache is in partial page mode when the volume of valid data in the cache is near (by a predefined amount) the cache capacity. In that case, the binary cache only allows partial page write to slow down memory consumption.

STEP 414: Is that an update block already open for the logical group of the write data? If so, proceed to test if the data could not easily be tacked on to the update block sequentially in STEP 416. If there is no such update block opened, proceed to test if an update block can be opened in STEP 418.

STEP 416: Test if the data is fragmented and non-sequential and therefore could not easily be tacked on to the existing update block sequentially. If so, proceed along line 421 to write to binary cache in STEP 420. Otherwise proceed to write to main memory in STEP 430.

In the preferred embodiment, the write is a binary cache write if either of the following conditions applies: 1) The segment to be written has length≤128 sectors, and cannot be written sequentially to the last-written sector in an open MLC update block. Note that data may be written sequentially if any gap may be padded with data moved from any source, in accordance with rules for MLC write management. 2) Remaining segment data to be written occupies a partial page.

STEP 418: Test if the ability to open a new update block is not limited in the main memory. If so, proceed along line 421 to write to binary cache in STEP 420. Otherwise proceed to write to main memory in STEP 430.

In the preferred embodiment, the write is a binary cache write if both of the following conditions apply: 1) The segment to be written has length≤128 sectors. 2) The maximum number of total update blocks that may exist is reached. Note: In all main memory write cases, the beginning/ending fragment of a write (Partial Page Write) is written to the binary cache.

STEP 420: Write data to binary cache. Proceed to end write command in STEP 440.

STEP 430: Write data to MLC main memory. Proceed to end write command in STEP 440.

STEP 440: End write command.

As can be seen from the example flow diagram of FIG. 20, the decision to cache data or write directly to main memory is a function of the characteristics of data to be written, the host write history, the state of the update blocks in the main memory and the state of the binary blocks in the binary cache.
Sequential Writes to MLC Main Memory The state of the update blocks, not only involve availability, but also if the data could be easily written to it sequentially. In the preferred embodiment, the main memory contains two types of blocks. An intact block is one where a logical group completely fills a metablock sequentially without any obsolete data. As soon as some of the logical units in the metablock are revised, the updated units are stored in a cluster of update blocks for that logical group. The update logical units are stored in an update block sequentially, so the state of the update block also involve whether the logical address of the data to be written follows sequentially to the last address written on any of the update blocks in the cluster. In cases where there is no match, sequence can still be maintained by padding, i.e., filling the intervening gap by copying valid logical units thereto. However, this padding process should only be applied moderately.

FIG. 21A illustrates a first example of a sequential write to the last page in an open MLC update block. If the write is not a partial page write, then it is always written to the MLC, with the remaining partial page write (if any) written to the binary cache. In the example shown in FIG. 21A, for host write of logical units 50-58, logical units 50-57 are written to the MLC with the remaining partial page of logical unit 58 written to the binary cache.

FIG. 21B illustrates a second example of a sequential write to the last page in an open NLC update block. For host write of logical units 50-60, logical units 50-5F are written to the MLC with the remaining partial page of logical unit 60 written to the binary cache.

If the write is a partial page write, then it is always written to the binary cache.

Figures 22A, 22B:
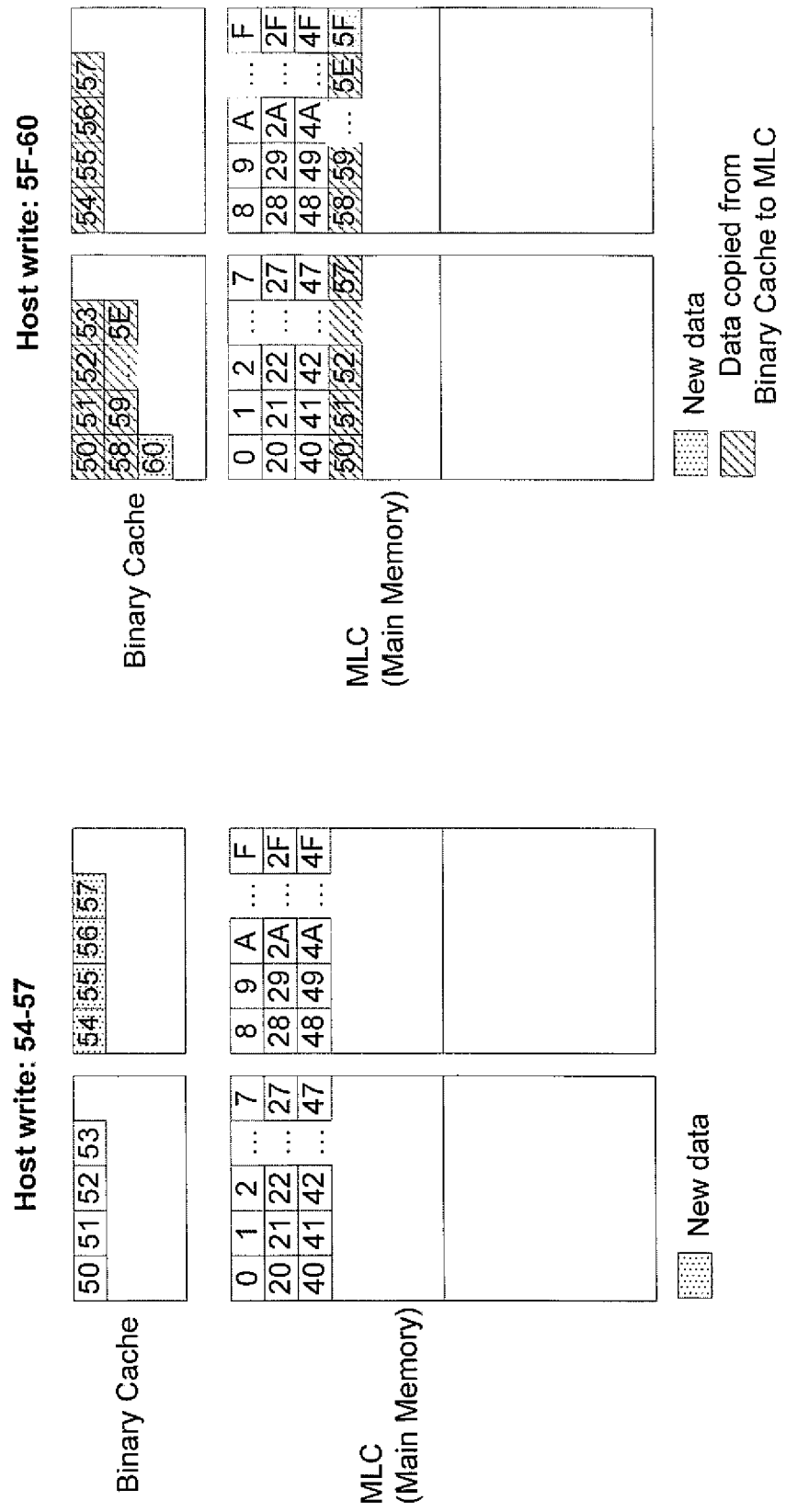
FIG. 22A illustrates a first example a write that is sequential to the last sector of the logical group written to the binary cache.
FIG. 22B illustrates a second example a write that is sequential to the last sector of the logical group written to the binary cache.

FIG. 22A illustrates a first example a write that is sequential to the last sector of the logical group written to the binary cache. If the condition of STEP 406 of FIG. 20A is satisfied, then along with the padding in the binary cache, the write is written to the update block. For the first example, since the host write 54-57 is a partial page write and does not have the last sector of a metapage, 54-57 is written to the binary cache.

FIG. 22B illustrates a second example a write that is sequential to the last sector of the logical group written to the binary cache. In the second example, since the host write 5F-60 satisfies the condition of STEP 406 of FIG. 20A. Except for the remaining partial page write (60), the host write is written to the MLC with intermediate data padded with data from the binary cache.

If the condition of STEP 408 of FIG. 20A is satisfied, an update block is open for the write. Except for the remaining partial page write of the host write, the host write is written to the MLC with intermediate data padded with data from the binary cache.

If the conditions in STEP 406 and STEP 408 of FIG. 20A are not satisfied, then the write is written into the binary cache.

(2) Meta-Block Write From Host

If the condition of STEP 402 of FIG. 20A is satisfied, the host write will be written directly to the metablock (update block) of the main memory. If a logical group is written the first time, there is at least one update block available for use, and if the write data is not a partial segment, then the data is written to an update block. For example meta-page size is 8 sectors. In case of data to be written is 8 sectors also, it is written to an update block. If the data to be written is 9 sectors, then first 8 sectors go to an update block and the last sector goes to the Binary Cache.

Any data present in the Binary Cache that should be written together with data from the host in accordance with rules for meta-block write management (described later) is moved from the Binary Cache to the meta-block.

(3) Meta-Block Write From Binary Cache (Cache Flush)

The binary cache is of finite capacity and its cached data will need to be flushed and archived periodically to make room. Cached data is archived by logical group. The consideration for which logical group to archived includes: how full the binary cache is; the existence of certain "sticky logical groups"; and the amount of indexing required for keeping track of the fragments from a logical group in the binary cache. Archiving of a logical group is classified/scheduled as follows:

1. As foreground operations, interleaved with writing data from the host to either cache or MLC. Archiving of all data for a logical group is performed at the end of a write segment.

2. As a background operation, when the host interface is idle.

Data Archiving Per BC Utilization (Foreground Operation)

Figure 23:
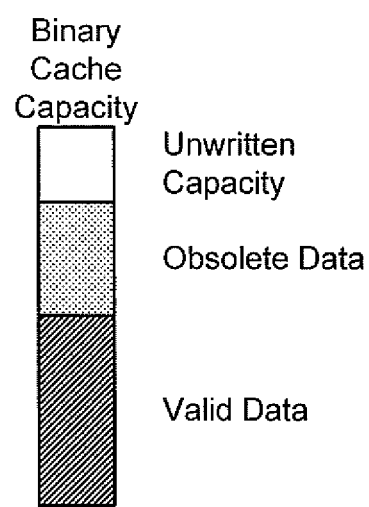
FIG. 23 illustrates the binary cache utilization.

FIG. 23 illustrates the binary cache utilization. Since the binary cache is implemented by the same block structure as the main memory, the blocks will contain valid data and obsolete data and what is left will be the unwritten capacity. Data archiving to MLC is performed by archiving data to MLC for a selected logical group for which an open MLC update block may or may not exists. Data archiving is enabled when valid data in the cache≥a predetermined percentage of cache capacity.

A logical group is selected for archiving according to the following algorithm:

1. A logical group for which no open MLC update block exists and with highest volume of valid data in the cache is selected as a candidate. However, the "sticky" logical group as described in item 2 of a later section are excluded from the selection. The selected logical group need not have the absolute highest volume of valid data, but may have a locally highest value according to groupings set by the control structures (e.g., cached Binary Cache Index (BCI) pages). If such logical group does not exist according to groupings set by the control structures, other groupings set by the control structures (BCIs) will be read until such logical group is found.

2. A logical group for which an open MLC update block exists and with highest volume of valid data in the cache is selected as a candidate. However, the "sticky" logical groups as described in a later section (item 1 and 2) are excluded from the selection. In all cases, the selected logical group need not have the absolute highest volume of valid data, but may have a locally highest value according to groupings set by the control structures. If such logical group does not exist according to groupings set by the control structures, then no candidate in other groupings needed to be found (i.e., no additional BCIs have to be read in).

3. For the final logical group selection, the logical group for which no open MLC update block exists is given a bias of W 2K entries.

That is, if (the volume of valid cache data of the logical group with no open MLC update block+W 2K entries) is greater than or equal to (the volume of valid data of the logical group with open MLC update block), then the logical group with no open MLC is selected for archiving. Otherwise, the logical group with open MLC update block is selected for archiving. The comparison is with the number of entries that are going to be copied to the update block.

Alternatively, early data archiving is enabled when the following three conditions are all met:

1. Valid data in the cache≥a first predetermined percentage of cache capacity
2. The number of valid data entries/number of valid fragments is≤a predetermined number, where the number is measure for determining if the cache contains a high number of small fragments.
3. Archiving of the selected LG candidate will not bring Valid data in the cache<a third predetermined percentage of cache capacity.

Normal data archiving is enabled when Valid data in the cache≥a fourth predetermined percentage of cache capacity Alternatively, in the selection of logical group for Data Archiving (instead of relying on locally cached BCI for selection, more BCIs are examined to find a more "optimal" logical group for consolidation).

If within the cached BCI page(s), the number of logical group (if any) without an open update block is less than N and the largest logical group with an open update block (if any) has less than X valid binary cache entries, then read in additional BCI pages until:

a) at least N logical groups without open update blocks have been found (accumulatively) and compared; or
   b) at least M BCI pages have been read; or
   c) at least a logical group with an open update block that has greater than or equal to X valid BC entries have been found.

When a logical group with no open MLC update block is selected all data in cache relating to that logical group is written into a new update block and then closed. When a logical group with an open MLC update block is selected, only data in cache that is required to close the update block is copied in the update block and closed.

Moving data from binary cache to MLC is also performed if required during a write or block management operation that is taking place in MLC.

"Sticky" Logical Groups Excluded From Archiving

For archiving, certain designated logical groups will be excluded from being selected for consolidation. For example:

1. The logical group corresponding to the MRU MLC update block
2. The logical group of the write access that results in a previous Binary Cache consolidation will be excluded (see FIG. 24) if there is no intervening write access to any other logical group in between the access and the new consolidation.
3. Special logical groups that are accessed frequently and randomly, for example those that hold the FAT tables.

Figure 24:
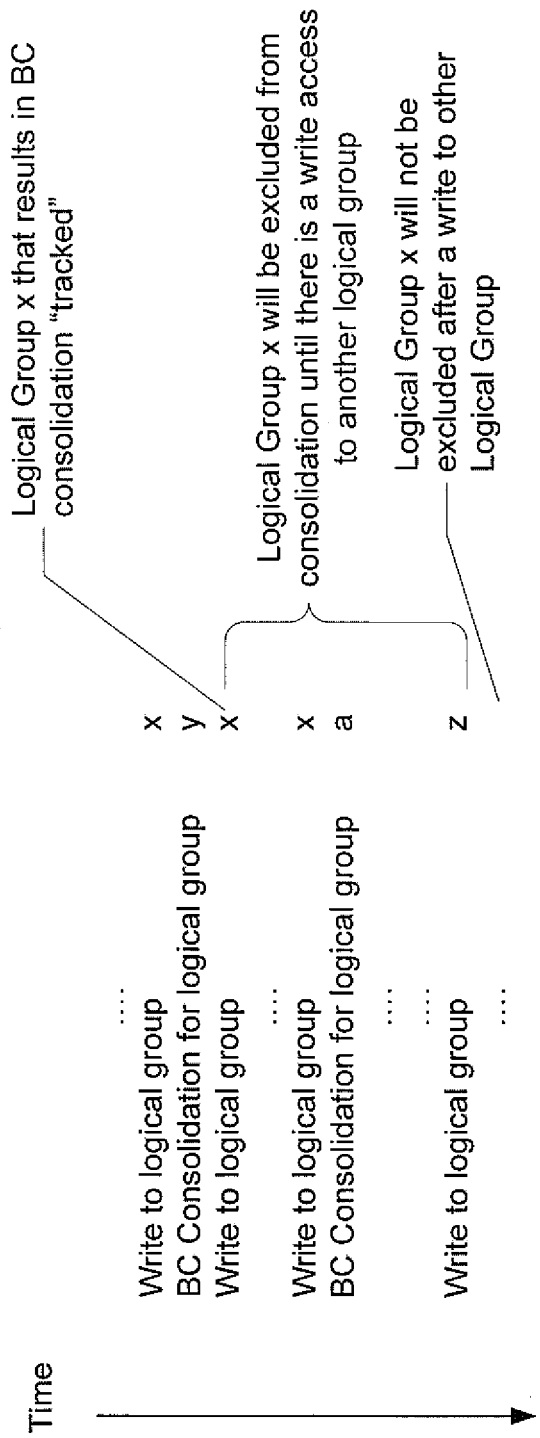
FIG. 24 illustrates the "sticky" logical group excluded from archiving.

FIG. 24 illustrates the "sticky" logical group excluded from archiving.

Data Archiving Per LG Index Utilization (Foreground Operation)

When the total number of index entries used by a logical group is≥C % maximum number of index entries in and BCI, the LG is archived.

Idle Time Archiving (Background Operation)

An idle time archiving will be initiated when all of following conditions are satisfied:

BC utilization is above K % (K is a new parameter)
   Idle time from the last write command is T us (T is a new parameter)

An ongoing idle time archiving will pause on receiving a new write command that results in a foreground data archiving (normal archiving or data archiving per LG index Utilization). The archiving will resume after the foreground data archiving. If the LG of the new command corresponds to the LG of the ongoing idle time archiving, then the idle time archiving of the LG will be terminated(the corresponding block will be returned to the freelist)

LG selection algorithm for idle time archiving is as followed:

The first LG in the cached BCI that is not in the MRU list and does not have an open update block will be selected for archiving.

If such LG is not found in the cached BCI, additional BCIs will be read until one is found (using the same selection algorithm in the last bullet item)

The length of the MRU list will be M (M is a new parameter). If the # of LG is less than M, then the oldest LG with no open update block in the MRU list will be selected for consolidation.

(4) Binary Cache Write Management

Binary Cache write management operates in accordance with the following rules:

Data fragments are written to the Binary Cache with a size granularity of 2 KB.

Data fragments in the Binary Cache are not aligned to LBA address space.

There may be a maximum of 128 fragments in the Binary Cache for any single logical group.

There is no restriction on the total number of fragments in the Binary Cache.

Data is written only to a single binary cache block currently designated as the binary cache write block, irrespective of the LBA of the data. When this block is filled, a physical block is designated as the new binary cache write block.

Data Alignment in the Binary Cache

Data stored in the BC is aligned to Banks similarly to the alignment in the regular MLC blocks, i.e. data that will eventually be written to a specific MLC bank will be stored in a Binary Cache Block within the same Bank. This is required in order to support independent Bank operation. Data within each Bank (within each meta-page) is not aligned—data can be stored into each 2 KB entry starting with any LBA and with any length. No pre/post padding is needed. If the data to be stored is not a multiple of 2 KB, then the last 2 KB will be partially written (padded with zeros). The next write will start with the next available 2 KB unit. Within every 2 KB unit the data will be sequential.

FIGS. 25A and 25B illustrate an example of a host update that is written to the Binary Cache with data alignment.

The host updates sectors 0xC-0x11. Since this transaction is short, and not sequential to a previous write, it is written to the BC. In this example, in order to keep the Bank-alignment, sectors 0xC-0xF are written to a Binary Cache block in Bank0 and sectors 0x10-0x11 are written to a Binary Cache Block in Bank1. The write is split into 2 different writes, even though it could have all been written to either one of the Banks using a single write operation.

(5) Binary Cache Block Management

Cache compaction is enabled when unwritten capacity<=size of current data segment or when the unwritten capacity is less than 128 sectors. (See FIG. 23.)

The binary cache block (excluding the cache write block) containing the least amount of valid data is selected to be compacted. If there are more than one binary cache block meeting the condition, the LRU one is selected.

The general rule for the compaction:

All valid data from the selected block is copied in increasing LBA order to the cache write block, and the selected block is erased (or marked for erasure).

No on-chip copy is used for compaction

Copy is done at min (64 sectors, MetapageSize) at a time in BCB compactions or BCB sector move. The last write may not end at a unit boundary and writes whatever sectors are left to write.

For efficiency and performance, a minimum of 2 indices should be temporarily cached in addition to the indices already in the index cache. After the compaction is finished, these temporarily cached indices are thrown away and the contents of the index cache are kept same as before starting the compaction.

Compaction of a binary cache block is scheduled as follows.

1. As a background operation, when the host interface is idle.

2. As foreground operations, interleaved with writing data from the host to either binary cache or MLC. The full selected cache block is compacted either immediately before or immediately after a data segment is written to the cache.

(6) Meta-block Write Management

There are certain update block limits as shown below:

1. Maximum total update blocks that may exist=D.
2. Maximum update blocks that may exist for any one logical group=E.
3. Maximum logical groups for which more than one update block may exist=F.

A new update block may be opened for data to be written, if does not exceed any of the limits specified above.

If a new update block is required, but cannot be opened because one or more of the maximum limits would be exceeded, a meta-block block management operation must first be performed.

Data is written in the most recently written update block for the logical group to which the data belongs, if the following condition is applied:

The data has a forward LBA jump≤G from the last written data in the meta-block. In this case, data for any intervening LBAs is moved from its current location in the Binary Cache or meta-block to pad the jump.

In all other cases, a new update block for the logical group must first be opened.

Data is written in an update block in LBA order. The meta-block may start with any LBA, with LBA wrapping round at the end of the logical group.

Data is written to an update block with a size granularity of one meta-page.

Data in an update block is aligned to LBA address space with a granularity of one meta-page.

(7) Meta-Block Management

When a new update block cannot be opened as required by meta-block write management, a consolidation operation is performed to reduce the existing number of update blocks in the category which limit would be exceeded. A consolidation operation may have one of the following forms:

1. Full consolidation for a logical group, which results in all data for the group being located in LBA order in a single meta-block, and one or more blocks being made available for erasure.

2. Partial consolidation for a logical group, which results in one meta-block being made available for erasure.

Full consolidation is used, unless a new update block is required for a logical group already having an update block, in which case a partial consolidation is preferred.

During full consolidation, all data for a logical group is moved in LBA order from its current location in the Binary Cache or a meta-block to the most recently written update block for the logical group, and all meta-blocks containing obsolete data for the logical group are freed, ready for re-use.

The least recently written logical group with a single update block is selected for full consolidation.

Partial consolidation is only performed on a logical group with multiple update blocks. The update block for which consolidation can be performed with the least movement of data is selected. Data is moved from this selected block to the most recently written update block for the logical group, after which the selected block is erased. Data may also be moved from other update blocks for the logical group during the consolidation, to pad LBA gaps.

Partial consolidation for a logical group is not possible if the most recently written update block would overflow in the course of the operation. In this case, full consolidation is performed on the logical group.

FIG. 26 is a table of example parameter values. The current values for parameters referenced in this document are shown in the following table. For references, the corresponding parameters in the Bermuda Simulator are included in parenthesis.

Binary Cache

The Binary Cache stores fragments of information in its own binary store. The Binary Cache is a slave of the Update Manager (UM) and has access to certain blocks of flash memory via the Low Level Sequencer (LLS). It has the ability to store and retrieve data passed to it from the UM. It can make data obsolete at the request of the UM. It has the ability to manage its own data effectively.

The Binary Cache contains the following control structures held persistently in Flash and moved into RAM as required for address translation. A fragment header is maintained in each fragment store in its subpages and pages. Binary cache index (BCI) to keep track of the fragments among the binary blocks.

FIG. 27 is a table showing partial description of the fragment header. The fields are logic group number, sector offset in LG, length of the fragment, and UbOverwriteFlags which is a flag to indicate if the fragment overwrites Update Block.

FIG. 28 is a table showing partial description of binary cache index. BCI records are used to aid rapid indexing of fragments. Each BCI record stores information about fragments belonging to a range of logical groups. A BCI record has a fixed size and fits inside a single ECC Page. If there is not enough free space inside the BCI record to store additional fragment descriptions, the BCI is split into 2 BCIs. Each BCI record references a discrete range of logical groups (and their fragments). Each BCI covers a non overlapping section of the possible logical group range.

The binary cache index stores directory information about fragments belonging to a range of logical groups. To control the size of a BCI, the device's logical address range is divided into a number of sections or 'zones'. Thus zone is a grouping of logical groups. Each zone is an independent entity, and manages its own logical address range. Each zone is further subdivided into logical areas which directly relate to the fragment data to be stored in the cache.

Zones are required because there is a limitation on the number of fragments that can be stored in a set of Binary Cache Indexes. Each zone can contain a full range of BCIs. On devices with large address ranges several zones may be present, on simple devices only one zone will exist. BCIs address logical ranges within a zone. The range of addresses and number of BCIs dynamically alters as fragments are added and made obsolete from the Binary Cache.

Figure 29:
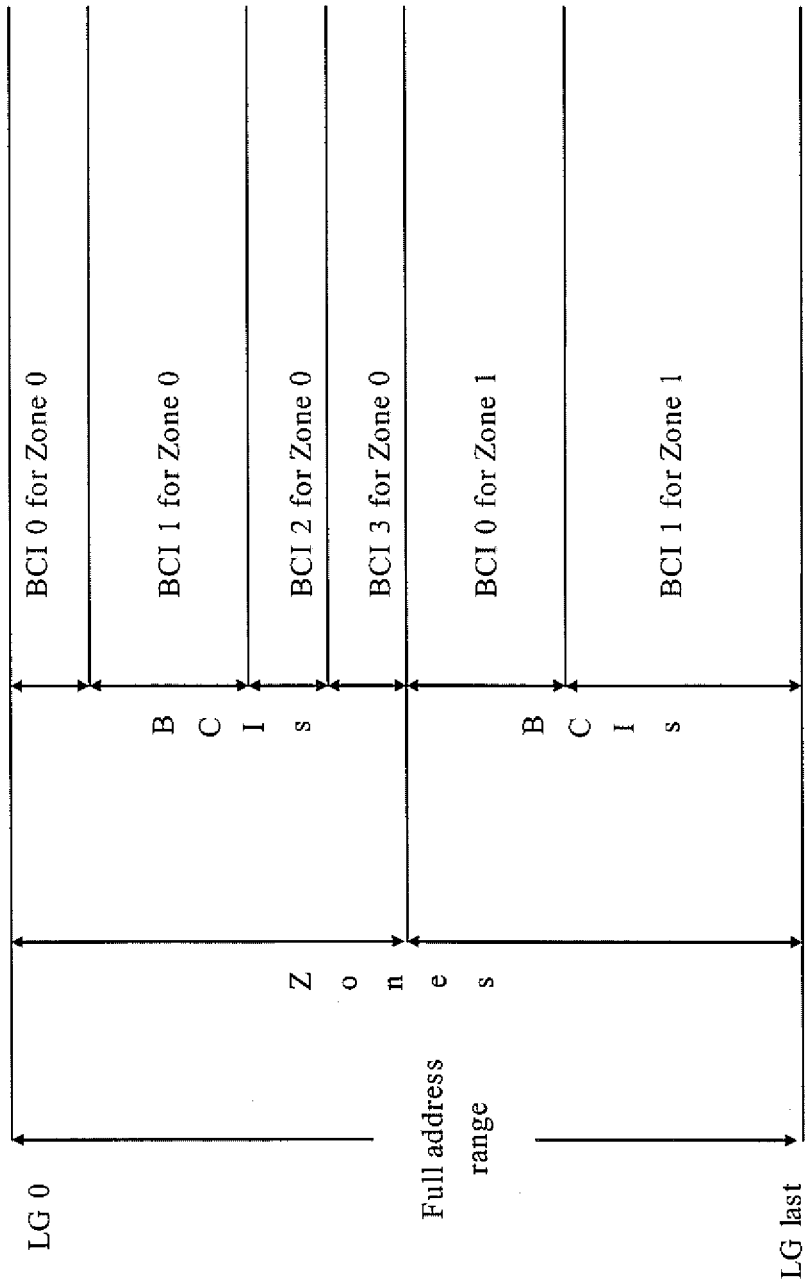
FIG. 29 illustrates the logical address range in the Binary Cache.

FIG. 29 illustrates the logical address range in the Binary Cache.

Figure 30:
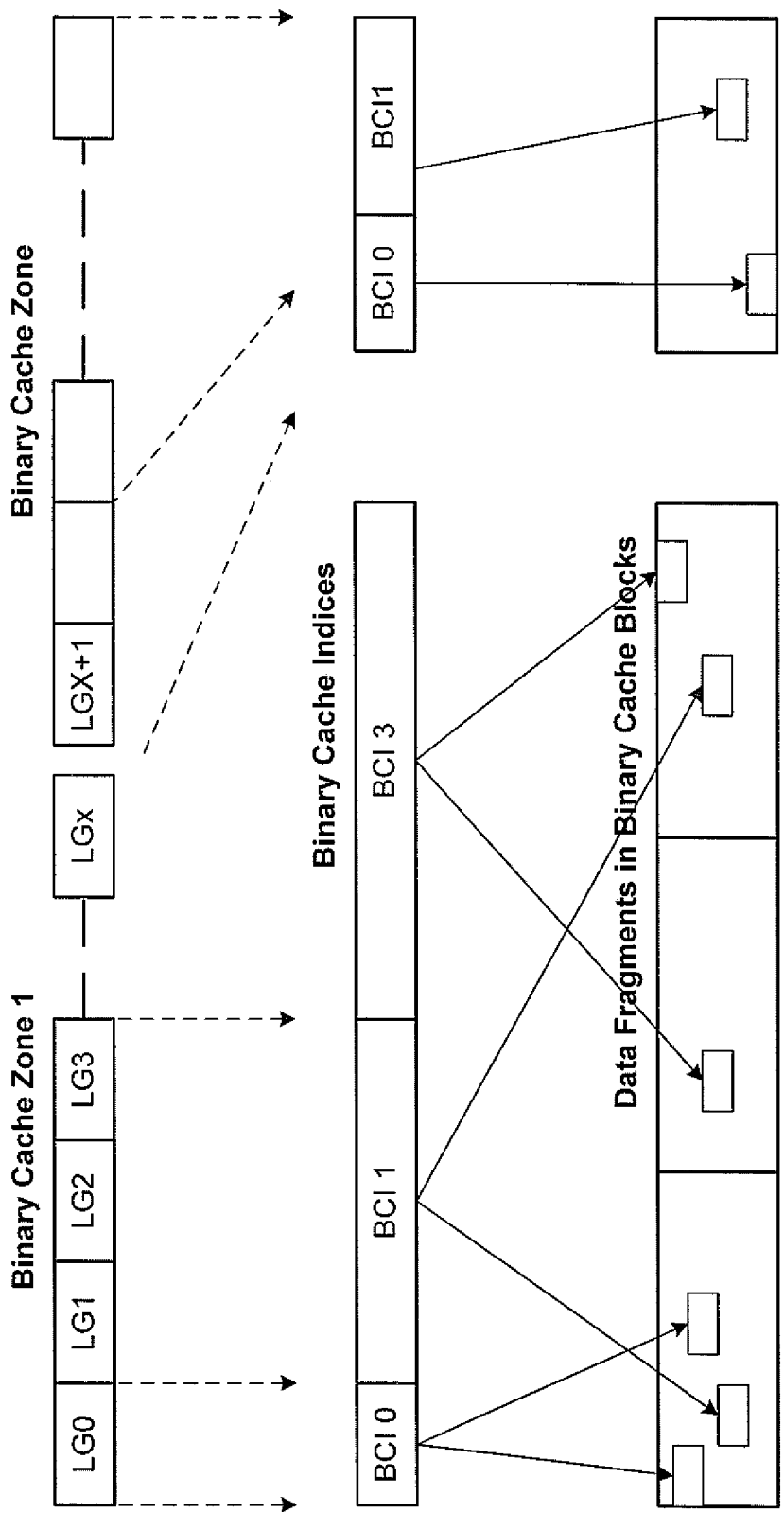
FIG. 30 illustrates BCI being stored in any block in its own zone.

FIG. 30 illustrates BCI being stored in any block in its own zone. In each Binary Cache zone, fragments for any Logical Group and any BCI can be stored in any blocks in the zone. Each fragment takes at one or more ECC page. ECC page can store only one consecutive fragment.

Figure 31:
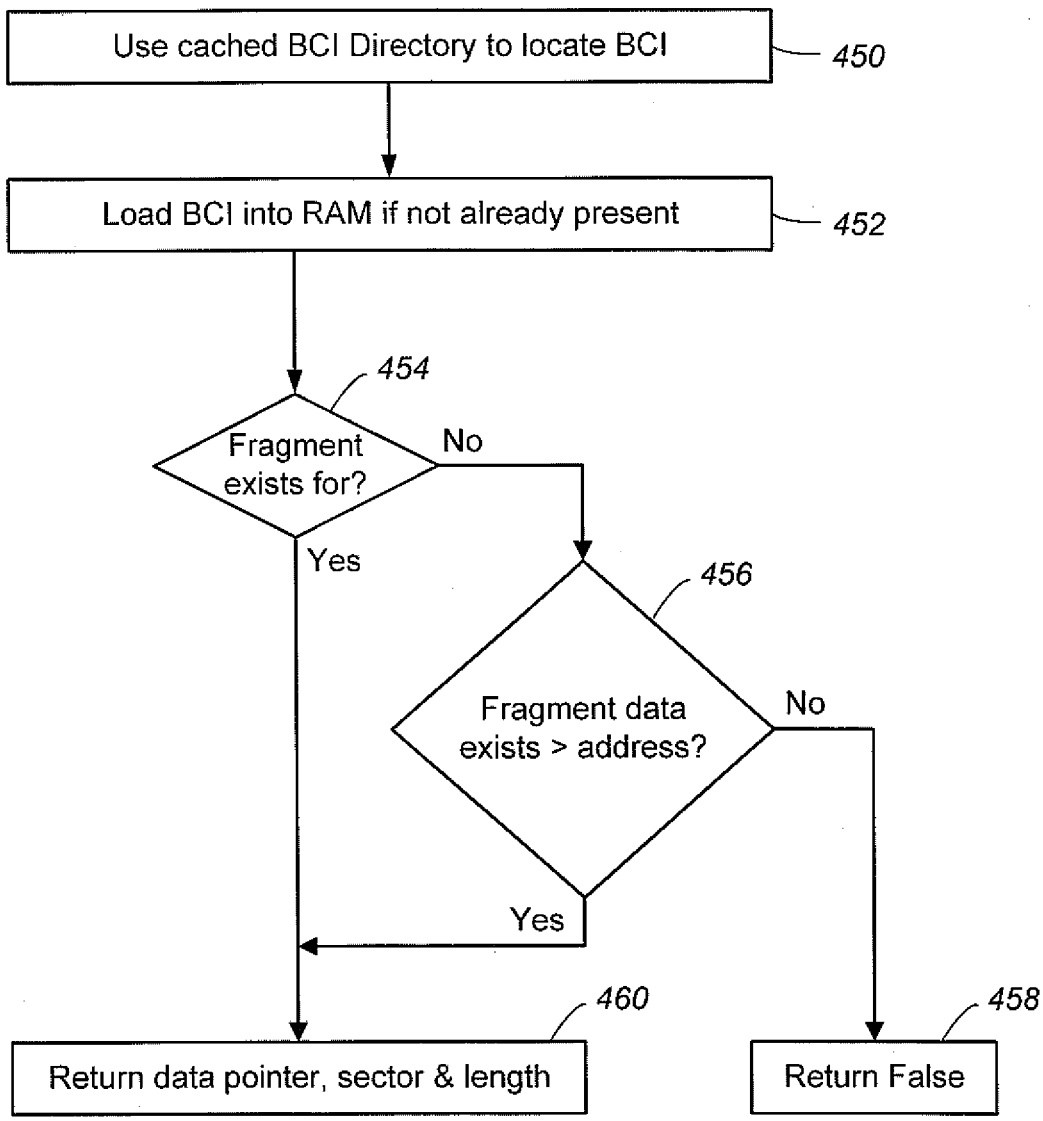
FIG. 31 is a flow diagram illustrating a fundamental read sequence for accessing the BCI index for a fragment.

FIG. 31 is a flow diagram illustrating a fundamental read sequence for accessing the BCI index for a fragment. When a read access is made to the Binary Cache, the appropriate Zone is selected and the BCI directory record is parsed to find correct BCI. This BCI is accessed to load the required fragment as can be seen in FIG. 31.

STEP 450: Use cached BCI Directory to locate BCI.
STEP 452: Load BCI into RAM if not already present
STEP 454: Does fragment have an index? If exists, proceed to STEP 460. Otherwise proceed to STEP 456.
STEP 456: Fragment data exists>address? If so, proceed to STEP 460. Otherwise proceed to STEP 458.
STEP 458: Return "False".
STEP 460: Return data pointer, sector and length.

BCI records are used to aid the indexing mechanism in a RAM limited system. One BCI references up to 64 logical groups, and up to 128 fragments per logical group. BCIs refer to fragments within logical groups and to other BCIs.

Figure 32:
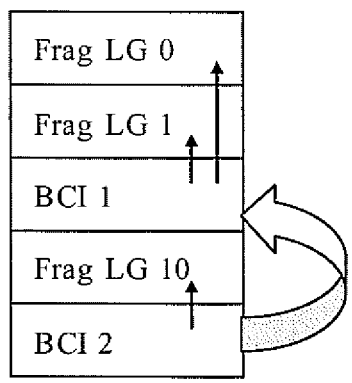
FIG. 32 illustrates the relationship between BCI and fragments in a binary block.

FIG. 32 illustrates the relationship between BCI and fragments in a binary block.

Figure 33:
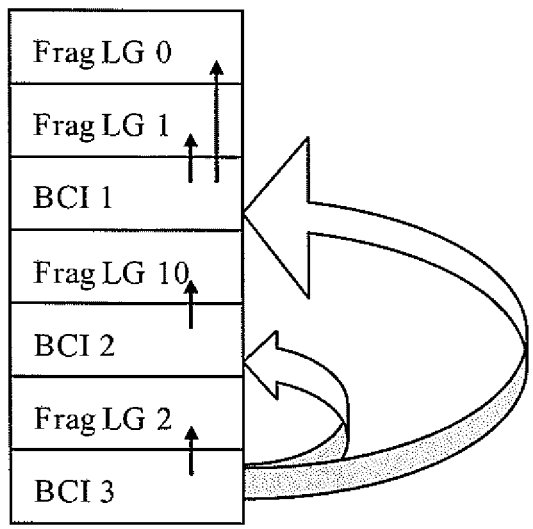
FIG. 33 illustrates adding fragments to logical group 2 results in change in BCI references.

FIG. 33 illustrates adding fragments to logical group 2 results in change in BCI references. When a new fragment, Frag LG 2, is added, a new BCI record, BCI 3, is also added. BCI 3, will reference Frag LG 2 as well as all existing BCI records, such as BCI 2 and BCI 1.

The BCI dictionary is used to locate BCI records. It references to BCI records in ascending numeric order i.e. the lowest Logical Address is listed first, ascending to the highest. To aid searching the fragment logical group information is stored in ascending numeric order in the BCI record.

It is important that when a read request is made to the BC that the most recent data is returned and that this process is carried out as efficiently as possible. It is possible that a host writes data repeatedly over a small range of sectors within a logical group, including writing to the same sector multiple times. As the fragments arrive in the BC they are added to the next free location on the physical binary store. As the fragments arrive the BCI record is built up in RAM.

FIG. 34 illustrates the BCI records in RAM getting reorganized dynamically. As the fragments arrive the BCI record is built up in RAM. Fragments in any logical group are sorted in ascending sector order. As shown, the BCI is updated with the storing of each fragment and is sorted in logical group number and sector number. When a previously written logical unit is being updated, the updated BCI should remove the reference to the previously written logical unit. In transaction #4, sectors 1-2 of LG) is new and therefore the previous index to these logical sectors should be replaced. This can result in logical group's info being edited as they are applied to the BCI and can force fragment reference splitting. The data from all fragments is still in the binary store. They have not been moved by this procedure, it is only the references to them that have been adjusted.

Sometimes it is required to split a BCI record into two. This occurs when a fragment write procedure wishes to add to a BCI, but there is insufficient space in the BCI for new fragments or Logical Groups. A BCI split operation results in two new BCIs with as similar a byte size as possible. The split occurs on a Logical Group boundary. The BCI dictionary is updated to include the new BCIs and remove the old ones. A BCI split operation requires a temporary EEC page buffer to be allocated.

After a BCI split the start ID of the second new BCI has to be decided. It must be>the last logical group in the first new BCI. It also must be<the first Logical Group ID of the second BCI. If the split of the initial BCI resulted in a divide at towards the upper end of the physical BCI area then problems can occur during future writes.

Figure 35:
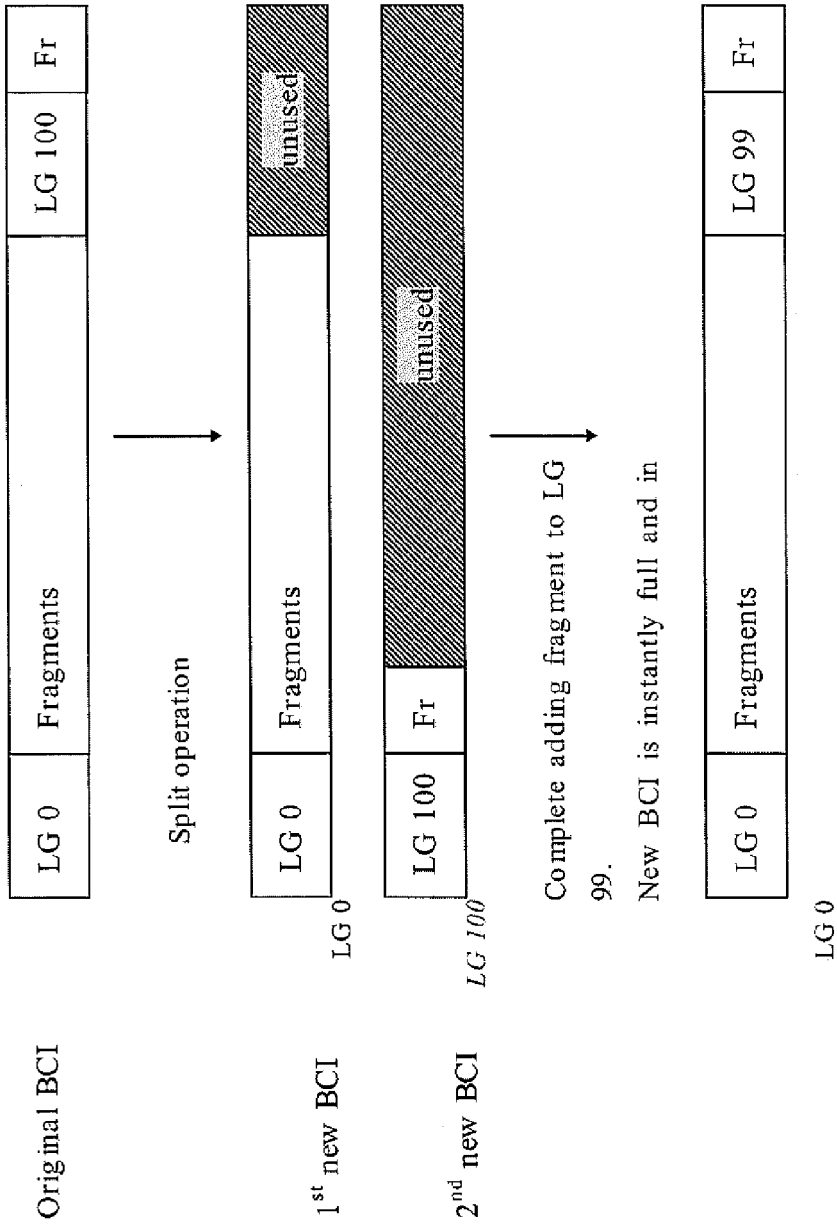
FIG. 35 illustrates how choosing a wrong start in split operation reflects further splits in BCI.

FIG. 35 illustrates how choosing a wrong start in split operation reflects further splits in BCI. There is a danger that future writes to the 1st new BCI will result in further splits. There is no room for further insertions into 1st new BCI. This situation can be controlled by choosing the start LG for the 2nd new BCI carefully. An algorithm based on free space in 1st new BCI versus allowed LG indexes can ensure that future LGs will get placed in the BCI with the most available space.

Binary Cache Compaction

BC compaction is where one of the BC physical blocks has its valid contents (i.e. those which are referenced by valid BCI record) moved to a new meta-block. The original block is marked for deletion. This results in an increased free space in the new Binary Cache block, as only valid fragments will be moved.

It is configurable as to whether the compaction procedure uses a new block or the current active physical block as its destination.

A Binary Cache meta-block (or just block to shorten the name in the description) can hold data from multiple logical groups and from multiple BCI records.

All valid fragments must be located and moved to the destination page.

FIG. 36 is an example of a pseudo code for binary cache compaction.

During compaction phase all dirty BCI records (Dirty BCI—BCI record held in RAM, may have been modified) (whether dirty before compaction or became so by updates during compaction) are saved to destination block. After successful compaction the "original" block in the zone is replaced with created one. The "Current write position" for a zone is set to next available page in "new" block.

The ideal physical block for compaction can be selected by managing a count that measure the amount of obsolete fragments.

An optimization to the above procedure which may save many flash read accesses is to store a BCI record in the last page of every block of the BC.

Once the physical block for compaction has been selected the BCI in the final page of the block can be read. This BCI may no longer be valid for normal operation, as much of its data may have become obsolete. However what this BCI, and other BCIs that it references does provide is information on LGs (valid or not) which have been stored in that physical block.

FIG. 37 shows a pseudo code for optimized binary cache compaction. Using these old BCIs to provide a list of LGs in the physical block makes searching the BCI tree for the correct fragment a much more rapid process.

An additional step is to merge the fragments together, so that they populate consecutive address ranges in the Binary store. This can increase storage density of the BC as fragments are provided in 512 Byte sectors but are stored in 2K ECC pages.

As BC data is evicted and become obsolete, BCI index records can become sparsely populated. As the system supports a finite number of BCIs, to enable rapid searching it is important to be able to merge BCI records. When 2 BCIs are merged, a new BCI is created and the original BCIs are no longer referenced. The merge operation ensures that the BCI records are maintained in LG order. An ideal time to merge BCIs is during compaction: at this time BCIs are being read and processed, so compaction can be carried out at reduced cost.

FIG. 38 shows a pseudo code to merge a BCI record.

It is possible that an upper ceiling could be put on the merged BCI record usage of the limited space for LGs and fragment data. This reduces the chance of a split occurring when a new fragment is added to the merged BCI.

Logical Group Eviction

Logical group eviction is performed when an entire logical group is moved out to an update block. This process is required when the Binary Cache is full and compaction has removed obsolete fragments within the Binary Cache.

FIG. 39 shows a pseudo code for logical group eviction.

Obsolescence of Fragment Data

The Update Manager has the ability to inform the BC that sectors within a logical group are obsolete. This may occur because the UM has placed data into an update block over this address range.

FIG. 40 shows a pseudo code for binary cache obsolescence.

Analysis

Statistics have to be gathered and stored to allow scheduling of cache maintenance procedures.

The physical block utilization can be measure by a count. Each BCI Directory will store the quantity of valid sectors in each physical block. As fragments are added to the BC this count will be incremented, as they are obsoleted, the count will be decremented. In this manner it will be possible to determine the absolute quantity of data in any physical block by accessing the most recent RAM BCI.

FIG. 41 is a pseudo code for maintaining information about identifying the physically largest logical group. Every BCI that gets processed as part of other operations has the size of each of its logical groups analyzed. Over time this will provide a measure of the largest LG in the BC. It will not necessarily be accurate. However it will be approximately correct and easy to gather without extra flash reads and with minimal resource overhead.

FIG. 42 is a pseudo code for identifying the oldest logical group by inferring from knowledge of how the systems in the BC operate. By this analysis a measure of an 'old' logical group is one which exists at the start of a physical block. To further refine this measurement the last BCI created as the result of a compaction will have a 'compaction' tag applied to it. When determining the oldest logical group each BCI can be scanned and BCIs with the compaction tag can be considered to be old.

Other Considerations

It is possible that the programming of an ECC page fails. If a program failure is reported by the LLS during fragment or BCI storage, all the valid data from the current Binary Cache block is copied to a new block. The old block is not returned to FBL; instead it gets added to the bad block list. If host data was lost, an error is returned to the back end.

Some operations within the Binary Cache occur periodically. It is important that they are scheduled in such a way that normal operation of the BC is not interrupted but that capacity of the BC is maintained.

In summary, logical group eviction may occur by the following reasons:
1. When a Logical Group contains too many fragments.
2. When a LG's fragments take a large number of sectors.
3. When the cache is full.

A BCI merge occurs:
1. If no more BCIs can be created.
2. During physical block compaction.

Initialization

There are strict requirements relating to initialization time. This procedure must be as efficient as possible.

FIG. 43 is a pseudo code for the initialization procedure. The most recent BCI record can be found by search in the Active Binary Cache block by meta-block address stored in the Master Index. Once the BCI record has been parsed the majority of the information about the BCI state can be determined.

Optimizations

1. Multiple BCI records can be held in RAM to allow faster search.

2. A bit field for each LG can be held. If a bit is set then fragment data exists for this LG. This reduces the quantity of BCI references that are required.

Binary Cache—Update Manager Interactions and Synchronization

In the event of data overlapping in the Binary Cache and update block areas steps must be take to ensure the most valid data is correctly used. The update manager controls the writing of data to the Binary Cache and the MLC area of flash. Depending on how these writes are performed, at any point the data in the Binary cache may be more up to date than the data in MLC, and vice versa. When the UM is initialized, it needs to be able to scan the contents of the BC and recently updated MLC and decide which data are valid and which are obsolete.

In order to make an informed decision about which data are valid at initialization time, extra information needs to be written along with each binary cache fragment to aid the UM in its scanning process. The synchronization scheme requires that each BC fragment should store a record of the next unwritten page in the update block at the point at which it is created. This page record will allow the initialization to see how much data had been written to the update block at the point that the fragment was created, and the binary cache can use this information to decide which of the UB and BC fragment data are the most recent.

Figure 44A:
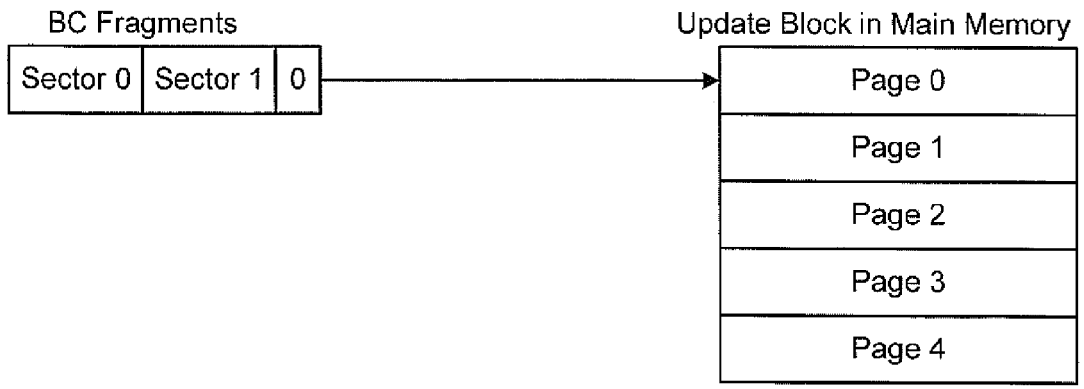
FIGS. 44A-44C illustrate examples of a synchronization scheme. Taking a new update block, with 4 sectors to a page.
Figure 44B:
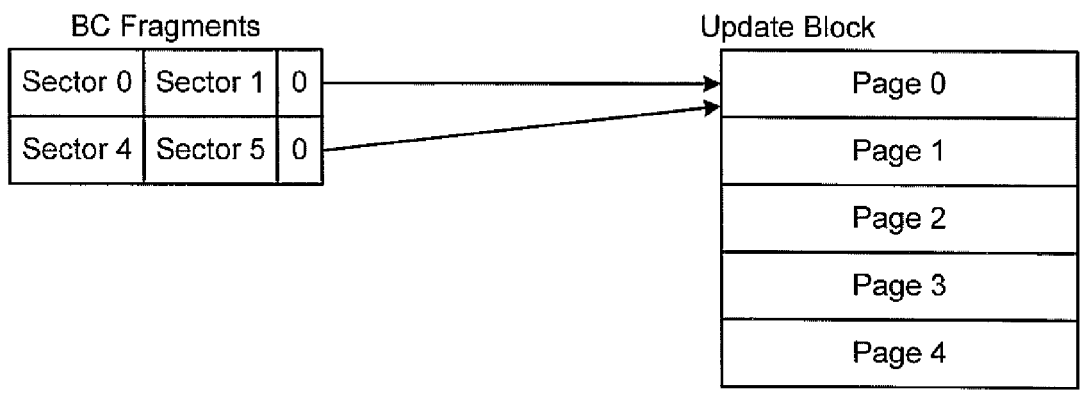
Figure 44C:
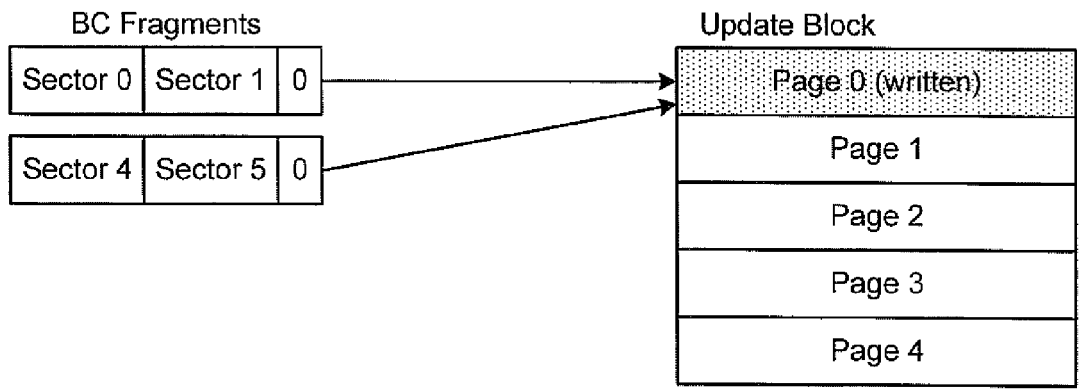

FIGS. 44A-44C illustrate examples of a synchronization scheme. Taking a new update block, with 4 sectors to a page.

In FIG. 44A, the UM performs a write of sectors 0 and 1. This is a partial page write and so it is written as fragment (0) to the Binary Cache. Nothing has been written to the update block yet so the BC fragment is stored with a pointer to page 0 of the update block. Another write is performed, of sectors 4 and 5.

In FIG. 44B, another BC fragment is created; still with a page pointer of 0 as no data has been written to the update block yet.

In FIG. 44C, a full page write of page zero is performed. This will be written straight to the update block, so the fragments in the BC will be obsolete.

In normal operation, after each write to the update block, the update manager will inform the binary cache of the range of LBAs written, at which point the BC will update its data structures in RAM to exclude the obsolete blocks. However, if a power fail happens at this point we need to have enough information to recover. After a power failure, on initialization the UM will inform the BC of which ranges of sectors have been written to the update block, and this will allow the BC to use the page pointers in each of its fragments to determine whether or not they are still valid.

In the above case, the page tags in the BC fragments (0) are less than the next erased block (1), so we know that they were created before the most recent write to the update block. The range of addresses written to the UB covers the range of the fragments, so we know that they are obsolete. If the fragments has been written after the data in the UB then they would have had a higher page pointer, and so we would be able to tell that they were valid.

In the above example, the data was written to the binary cache before it was written to the update block. That is the binary cache data supersedes the update block data.

FIGS. 45A and 45B illustrate another example for the case where the fragment written to the cache covers a range of sectors which has already been written to the update block. As shown in FIG. 45A, a number of pages already been written to an update block and no fragments are present in the BC: In FIG. 45B, if a BC fragment is then written to the update block covering part of the range of the written area of the UB, the fragments are written with their page pointers to the next erased page (page 3 in this case). If a power fail happened at this point then the update manager would inform the BC that it had an update block for a particular LG with sectors 0-11 (pages 0-2) written. The BC would be able to see that even though the fragments it had for the LG were covered by this range of data, their Next Erased Page tags would indicate that they were written after the update block data was written and are therefore valid.

Partially Valid/Obsolete Fragments

FIG. 46 illustrates an example of partially valid/obsolete fragments. It is possible that a fragment may only partially cover a written area of the update block. Taking the situation at the start of the previous example (FIG. 45A), where there are a number of pages already written to a UB: if in FIG. 46 a fragment (3) were to be written to the BC which spanned sectors 10 to 13, it would cover the last two sectors of page 2 (which is already written), and the first two sectors of page 3 (which is currently erased).

In this case the Next Erased Page tag lets us know which sectors were written to the update block at the point at which the fragment was written. We know that when we created the fragment page 3 was erased, so if a subsequent write were made to the update block covering page 3, we would be able to work out that the sectors in the fragment which cover page 3 would be obsolete.

Multiple Update Blocks

The above examples show the BC-UM interactions for an update group which only has a single update block. In reality, it is possible for a UG to have a number of update blocks, and the BC/UM synchronization needs to cope with this.

Figures 47A, 47B:
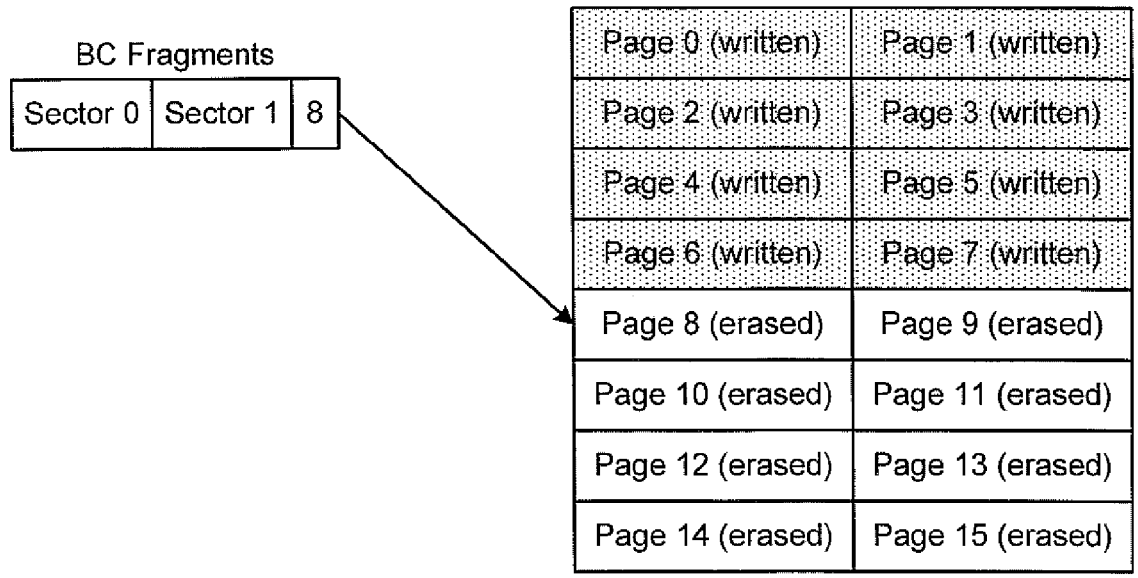

FIG. 47A-47C illustrate examples of operating with multiple update blocks for a given logical group.

FIG. 47A shows an example of an update group which has a single UB, with pages 0-7 already written.

In FIG. 47B, if we write data for sectors 0 and 1 (in page 0), it will be written to the binary cache as a fragment covering these sectors.

In FIG. 47C, if we then write data for pages 0-4, we need to open a new update block since in the existing UB#0, pages 0-4 are already written. The creation of this new update block has an effect on the validity of the BC fragments, in that the data covering pages 0-3 in the new update block is newer than the fragment in the binary cache. This is a problem because the fragment has been written with a Next Erased Page tag of 8, which is higher than the new next erased page (4).

If a power fail happens at this point then the Binary Cache can not work out whether or not the fragment data is valid. To protect against this situation, we need to perform some maintenance of the binary cache when we perform an update of an update block so that the information reflecting the current state of the binary cache and update blocks are written to flash GAT Entries and BCI The BC uses the BCI to store the GAT entry for each logical group held in the BC. The UM also stores the GAT for open update blocks. The GAT contains the page tag of an UB.

If the BC and UM reference the same meta-block number in their GAT entries then an update of update has not occurred since last power-down. This can be used as the basis of synchronization on an Update of Update situation.

UM-BC Initialization

Initialization is a time critical operation; there may be multiple update blocks in the FBL. At initialization the current write pointer of these blocks is not known. To avoid having to search each one for the Next Erased Page at initialization a phased initialization is carried out.

FIG. 48 shows a pseudo code for initialization.

Unreferenced fragments are more recent than those referenced by BCIs, so it is safe to update the BCIs with this data. At this point there may still be obsolete data held within the Binary Cache. This would happen if data has been added to a logical group's update block and a write abort has occurred before the binary cache has saved its BCI to flash.

As a BCI has limited physical size & therefore has limits to number of fragments and BCIs that can be stored the above initialization routine could get into trouble. For example if before the write abort occurred the UM obsolete a large range of fragments in the BC. As a result the fragments after the last BCI could be held in a dirty BCI. However now the BCI will be expected to hold all fragments, including the obsolete ones. In this situation it will be possible for the BC to call on the UM to initialize UBs, this will allow fragments to be obsolete and initialization to complete.

Update of Update Operation

FIG. 49 illustrates a pseudo code for the process followed by the UM when an update of an existing update is performed is shown below. Saving the current dirty BCI has the effect of closing the current UB i.e. the pageTag and block ID held in the BCI's GAT are correct.

If the logical group undergoing an UoU is dirty (i.e. it is in the RAM BCI) it will be saved with the GAT entry for the current UB. If the logical group undergoing UoU is not in the dirty BCI then its BCI will already have the correct GAT entry. It is not essential to save the dirty BCI in this instance.

Read/Write From Binary Cache.

FIG. 50 illustrates a pseudo code for further accesses to the BC have to validate the data in the phased initialization described above. This will increase the overhead of the initial access to a LG.

Power Failure During Maintenance

Due to the number of maintenance operations which are performed on an update of an update, it is important to be sure that a power failure at each stage of the maintenance will not result in an unrecoverable error.

In the case of a power fail after erase of the update block, a power fail after the write of data to the new update block can be detected at the point of the rescan of the FBL during initialization. As no data will have been written to the block the next free page will not invalidate any data held in the BC. This is a safe operation.

In the case of a power fail during an update block write, the current write pointer is determined at initialization of the UB, through a search of the UB. The data that was written will decide where the next free page is. Data will not be lost.

In the case of a power fail before the binary cache is informed of the update block write, the next access to the updated LG will detect that the GAT version in BCI is different to GAT version held by UM. BC can then obsolete fragments which may have been written to new UB.

Update of Update Example

Figure 51A:
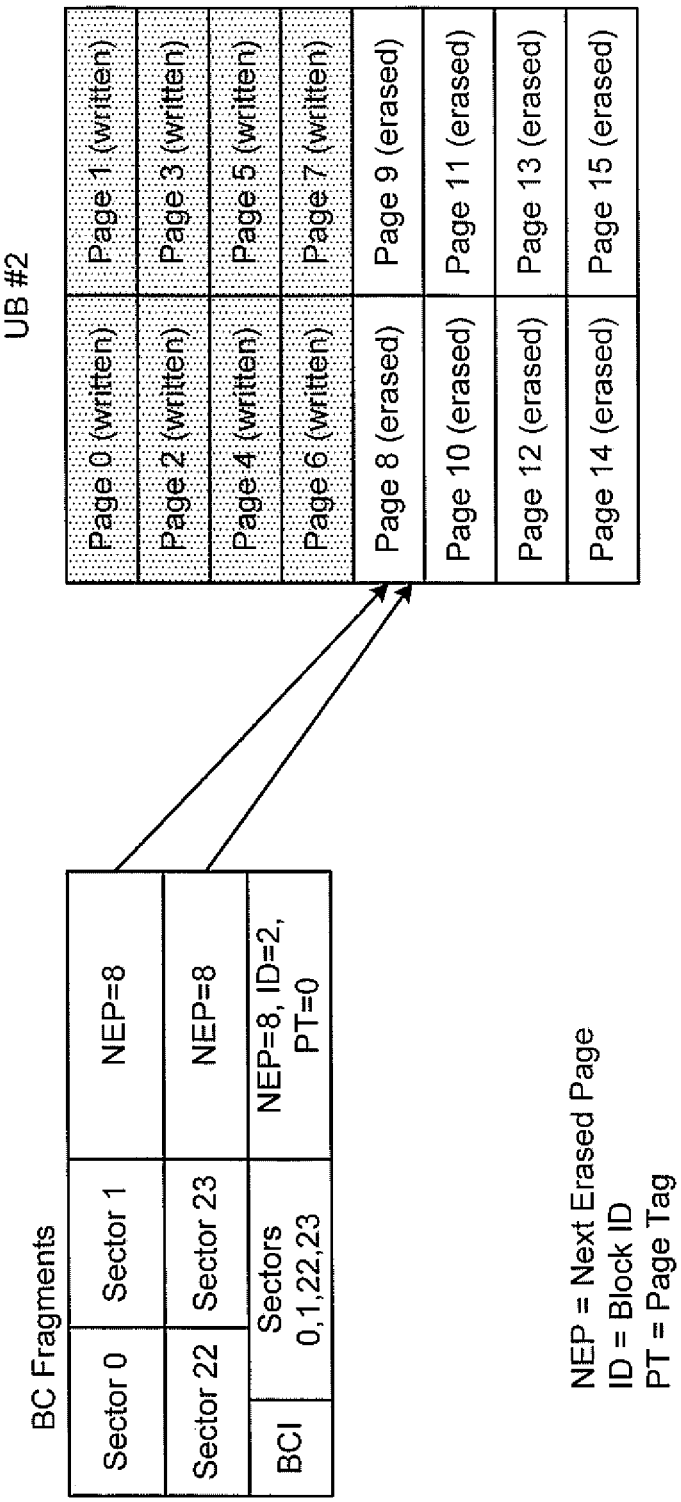

FIGS. 51A-51B illustrate an example, of an update of an update. In FIG. 51A, a number of pages are written to an update block UB#2, and some fragments are written to the BC which supersedes part of this data. In FIG. 51B, if a new update block UB#1 is open and written to with data covering part of the data written to the current UB, the binary cache will be informed that a new update block has been opened, and be given range of addresses have been written. The binary cache will update the BCI record, obsolescing those fragments between the new block's page tag and the new block's Next Erased Page. In this case only the fragments referencing sectors 1, 22 and 23 are still valid.

The fragments are not changed—they are left with its now-out of date page tags. However, as it is referenced by a BCI sector, the binary cache will know to use the BCI page tag in the future when determining the validity of the fragment.

Binary Cache Eviction

The Binary Cache will periodically require removal of an entire LG of fragments.

Figure 52:
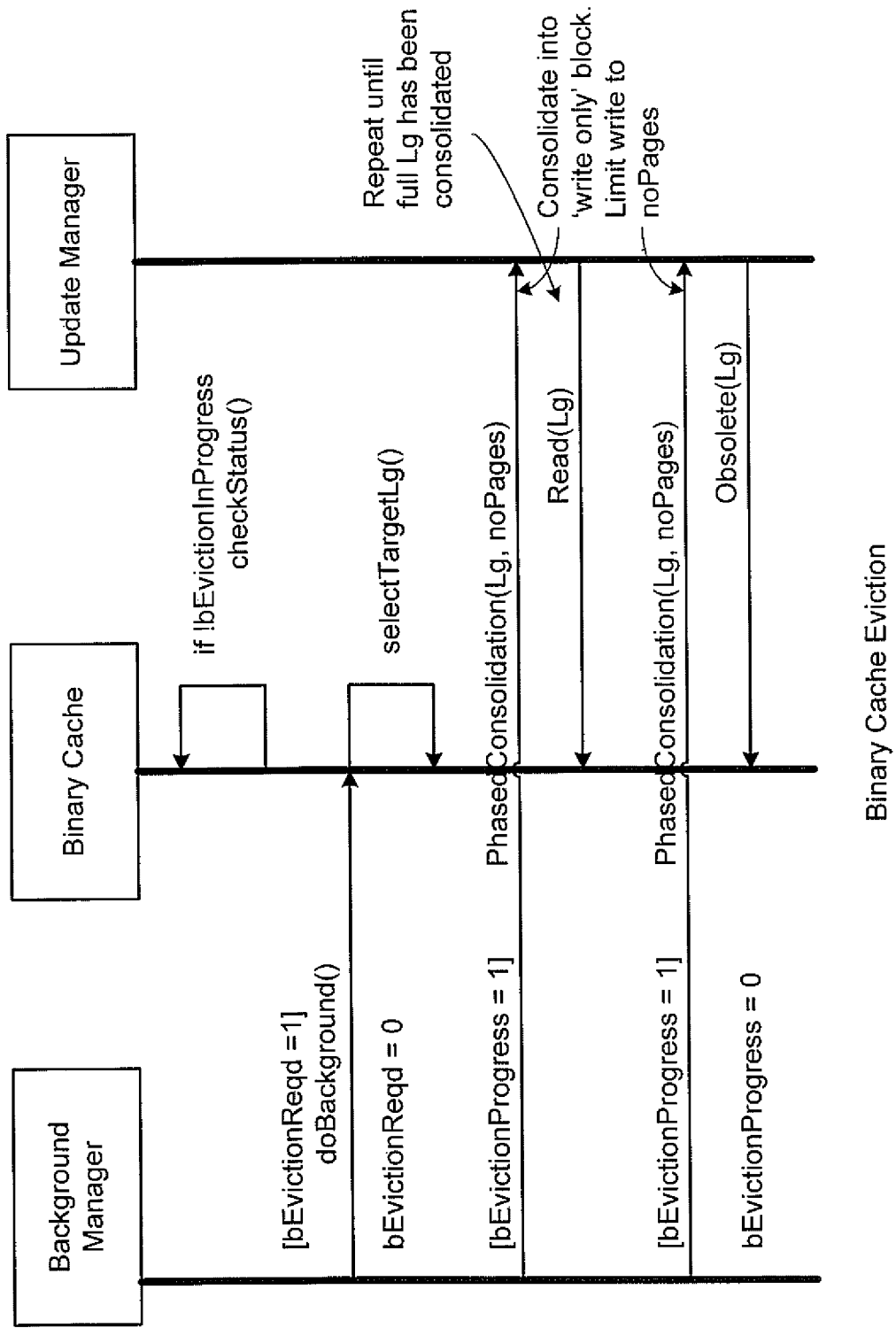
FIG. 52 illustrates the interaction between the background manager, the binary cache and the update manager to effect binary cache eviction.

FIG. 52 illustrates the interaction between the background manager, the binary cache and the update manager to effect binary cache eviction. Eviction (Consolidation) will be a phased process, called multiple times via the background manager to remove an entire LG from the BC.

The component in a LG eviction is the Update Manger's phasedConsolidation( ) routine. This uses a 'write only block', instead of a standard update block. Data is written to this block as per a normal UB. However read requests will not access it. This allows data to gradually be added to the block, duplicating the data in the BC, other UBs and intact blocks. Once all the data associated with the LG has been written to it the block can be closed and the LG in the BC obsolete.

Logical to Physical Mapping

Figure 53:
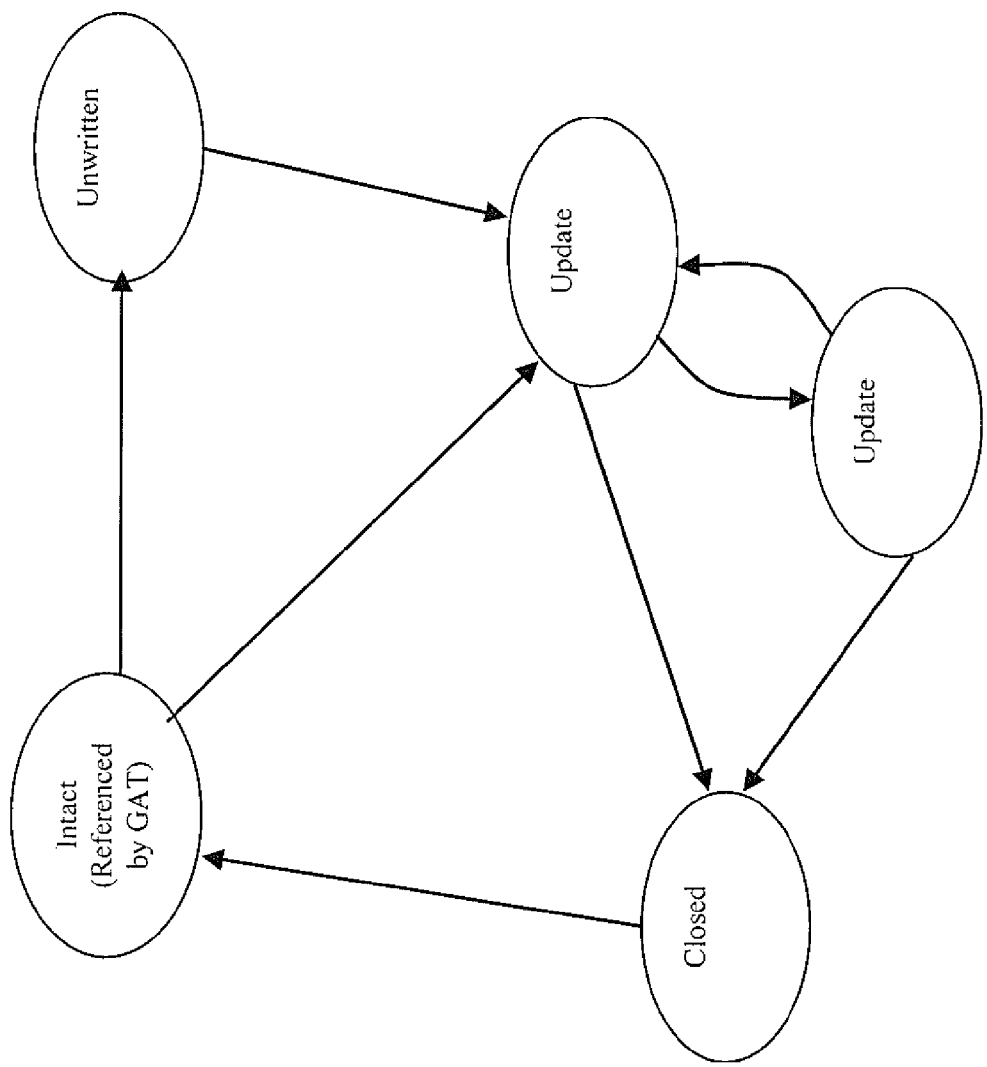

FIG. 53 is a state diagram showing the transitions a logical group can go through. When in an "Update" state, a new update block is opened from an unwritten block—the logical group now controls an Original or Intact block (referenced by GAT) and an update block (referenced by the MI is SRAM.) The logical group may release and allocate new update blocks as required. When the logical group is in a "Closed" state, the reference to the original block in flash is now obsolete and it has been released to the FBL in SRAM. The details of the update blocks are written to the GAT delta. In the transition between an "Intact" state and a "Closed" state, the MI in. SRAM has been synchronized with the flash memory. The logical group is not intact and is referenced by the GAT.

FIG. 54 is a table showing the possible states for a logical group and the control structures which are relevant for each state.

Figure 55:
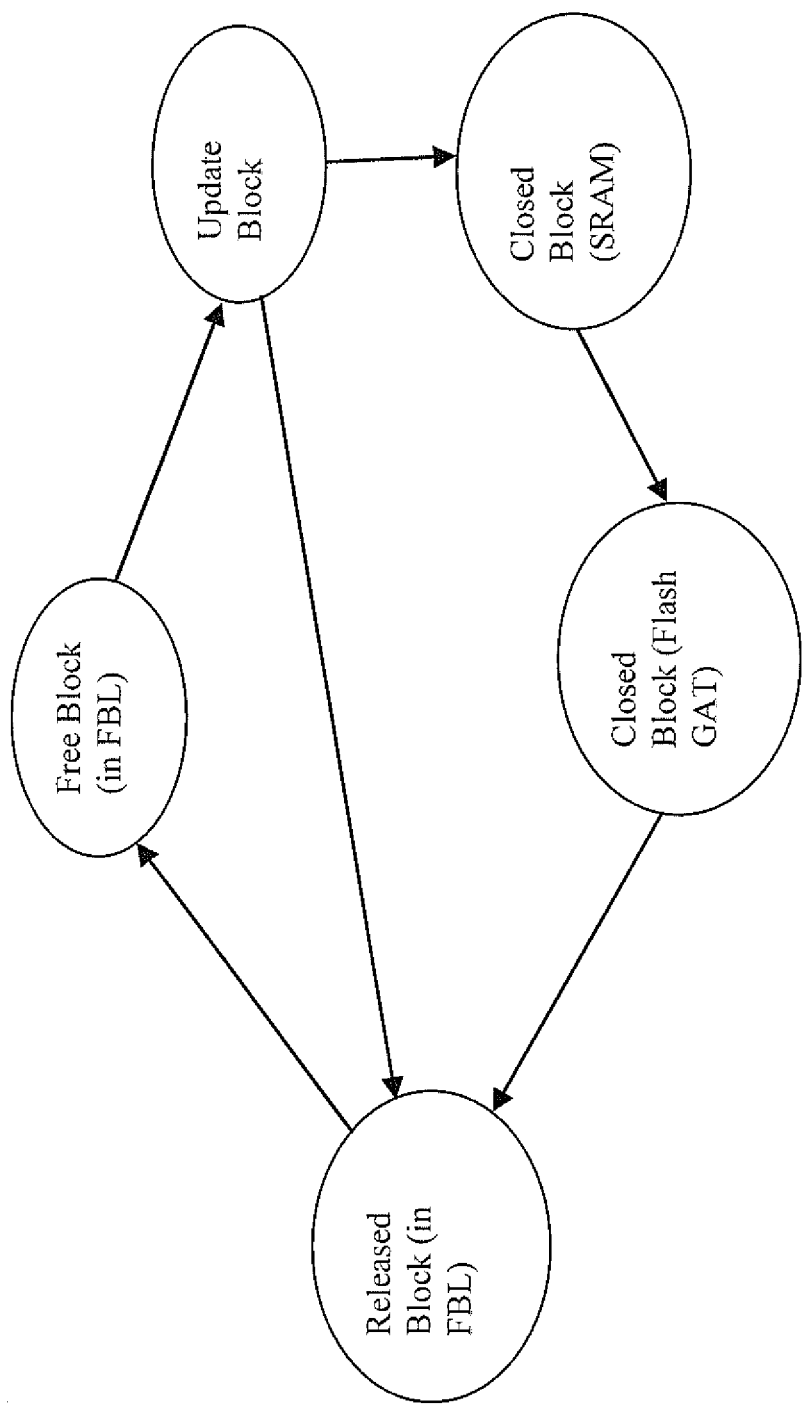

FIG. 55 is a state diagram showing the transitions a meta-block can go through. In particular, in the Free Block (FBL) to Update Block transition, the free block is allocated from FBL and becomes an update block. In the Update Block to Closed Block (SRAM) transition, the update block is written to and becomes a closed block—details are written to the GAT Delta in SRAM. In the Update Block to Released Block (in FBL) transition, the block becomes obsolete without being closed—it is released back to the FBL. In the Closed Block (SRAM to Closed Block (Flash GAT) transition, when the GAT Delta is synchronized with the flash memory, the block details are stored in the GAT in the flash memory. In the Closed Block (Flash GAT) transition, if the block becomes obsolete it is placed back in the FBL as a released block. In the Released Block (in FBL) to Free Block (in FBL) transition, the SRAM data structures are synchronized with flash memory and the block becomes free to use again.

FIG. 56 is a table showing the possible states for a meta-block and the control structures which are relevant for each state.

Meta-Block State Transitions

The Free Block to Update Block transition occurs when the MML requires a new update block. It calls one of the allocate functions which returns the details of the meta-block. At this point, the meta-block info is referenced only by the FBL. The block is considered to be allocated, and it will not be available for reuse until it has been released back to the FBL.

The Update Block to Closed Block transition occurs once there are no further writes to be made to an update block it is considered closed. At this point the meta-block details are written to the GAT Delta in SRAM. The block details are still held in the FBL at this point, and will not be overwritten until the GAT Delta is synchronized with flash.

The Update Block to Released Block transition occurs if an update block becomes obsolete without ever having been closed—e.g. it has been used for a partial write, then it is released back to the FBL without ever having been recorded in the GAT or GAT Delta. However, it is still not be available for reuse until the SRAM and Flash control structures have been synchronized.

The Closed Block (SRAM) to Closed Block (GAT) transition occurs when the control structures in SRAM are synchronized with the Flash, all pending updates to the GAT (stored in the GAT delta in SRAM) will be copied to the GAT in flash. A number of tasks are performed at this stage:

GAT Delta changes are merged into Flash

FBL Entries which were previously storing the details of allocated meta-blocks are now available to be overwritten with released blocks Blocks which were listed in the FBL as released are now available for allocation.

The Closed Block (GAT) to Released Block (FBL) transition occurs if the block becomes obsolete it is placed back in the FBL as a released block.

Group Address Table (GAT)

The GAT Block Handler is responsible for the following tasks:

1. GAT Entries control/Mapping:
 a. Controls & Manages all GAT Pages on Flash
 b. Supply Set/Get GAT Entries routines to MML modules
 c. Implement & manage GAT entries caching mechanism for Set (GAT Delta) & Get (GAT Cache)
2. SGAT (Spare GAT) control
 a. Manages SGAT entries (meaning un-allocated meta-blocks)
 b. Supply FBLexchange routine to MML modules (mainly BM) for allowing WL algorithms.
3. Master Index Page:
 a. Storing some of the fields in the module context.
 b. Supplying field access routines for these fields,
 c. Update MI when needed/required
 d. Find last MI in init process.
4. GAT Blocks Management:
 a. Managing all the above pages in a special control block called GAT Block.
 b. Responsible for compacting/allocating etc. of the GAT Blocks (when needed)

FIG. 57 is a table describing the terms used in GAT.

GAT Entries Management

Data Structures

FIG. 58 is a table showing the GAT Delta list. It is a list of GAT Entries including its corresponding LG used as a cache for updating new GAT entries (SetGATEntry). The size of it is given by G_CFG, the default size (& maximum size) is 128 entries. This List is held in RAM & in Flash in the same format as a part of the MIP. The list is ordered, by using an index array (pDeltaListCtrl)

FIG. 59 is a table showing the GAT Entry Cache List. This list includes chunks of GATY Entries (every chunk hold 32 GAT Entries) & their corresponding chunk startLG. By definition—this list doesn't hold any GAT Entry HC (optimizing Chunk upload from flash, optimizing RAM utilization.) This is list is implemented as a linked ordered list. The rule for removing a node is LRU. The GAT entries in every cache chunk are saved in field arrays (like the GAT Page layout format). The chunk size is currently static (compiled time)— maybe dynamically in init—TBD. The cache list size is dynamically, default is 4.

Figure 60:
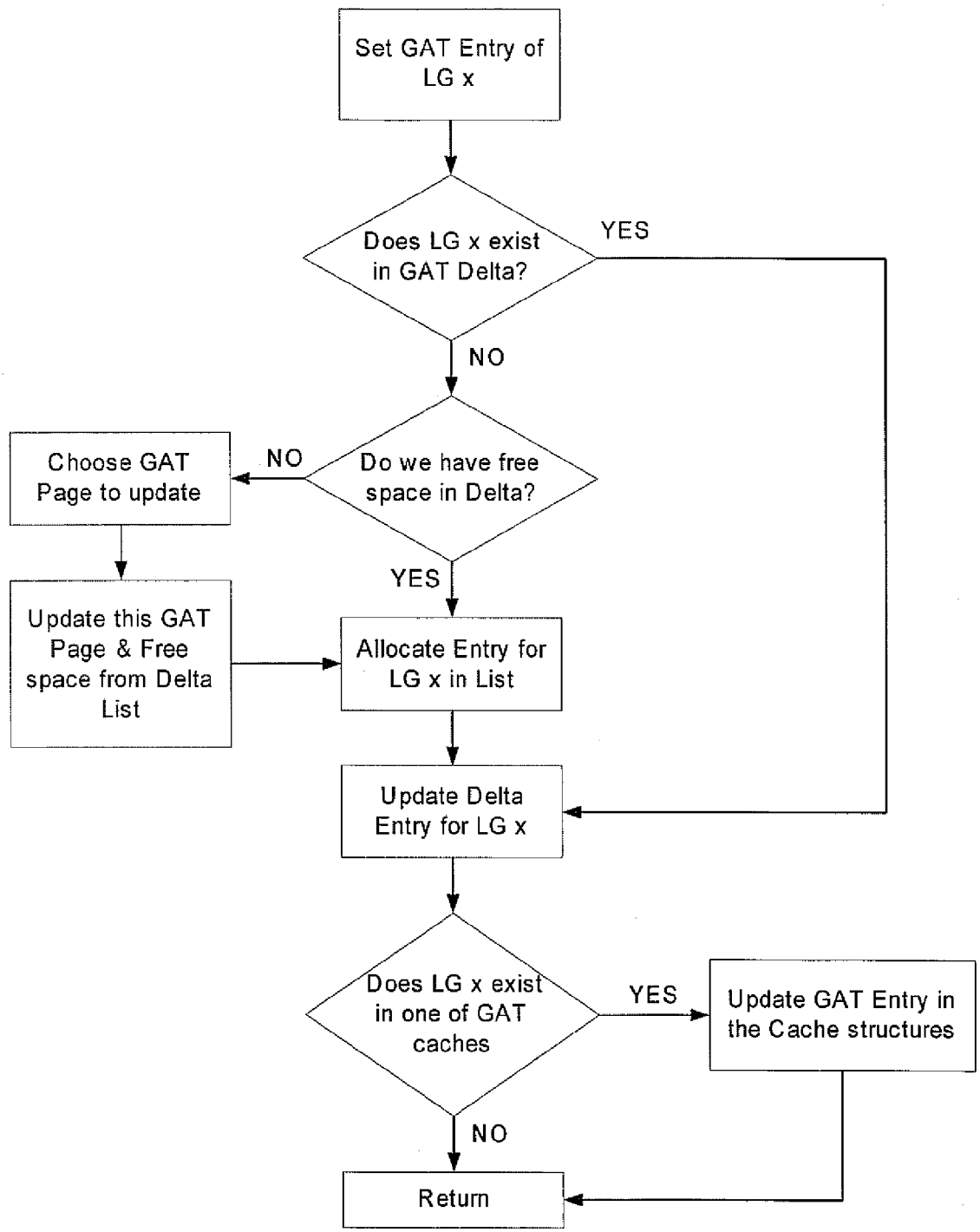
FIG. 60 is flow diagram illustrating set GAT entry process.
Figure 61:
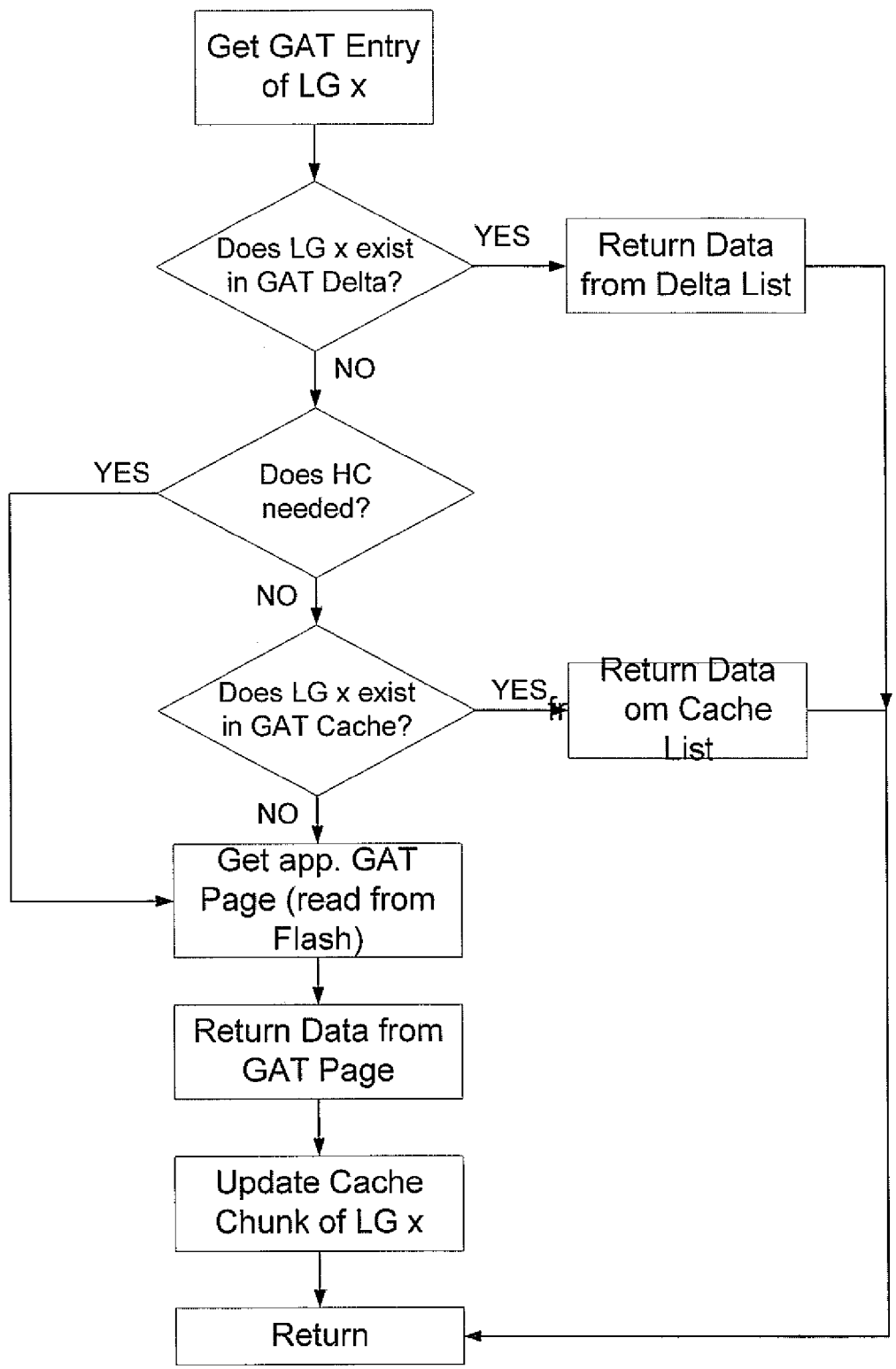
FIG. 61 is flow diagram illustrating get GAT entry process.

FIG. 60 is flow diagram illustrating set GAT entry process:
FIG. 61 is flow diagram illustrating get GAT entry process.

The GAT Page layout is basically a field array (an array for every field of the GAT Entry)

Update Page mechanism is a simple one:
Read appropriate page
Write this page to the next free ECC Page in the current active GAT block. If there is no more space—create one by allocating new Block (described below in GAT Block Management)

When GAT Page is updated, the GAT Delta List is scanned; all the corresponding GAT entries are removed from the Delta List & updated in the GAT Page on the flash.

GAT Page Indices List

The SGAT/GAT Pages in flash is management by Page Indices List. This List exists both in RAM & in flash (as a part of the MIP) For Every SGAT/GAT Page, a block index (within the GBL) & a page offset (Page size is 2KB) is saved within the GAT Block. The Indices list is updated on every SGAT/GAT Page update & initialized from the MIP on the init procedure.

Master Index Page Management
Data Structures

FIG. 62 is a table listing the data structure of the master index page (MIP).

Master Index update

MIP is programmed only in minBinaryWASafeStep aligned sector addresses, (see below WA safe description). The MIP is the 1st Block that is programmed in a new allocated GAT Block. When the MIP is updated, all the information from the MML modules is gathers & arranges in a 2KB array. This array is programmed to the GAT Block.

The MIP is updated in the following cases
1. New GAT Block is defined.
2. FBL exchange is triggered.
3. External triggering (by UM/BC when needed/)

GAT Entry Update in Master Index and GAT Page

When GAT Delta is empty, all Intact and Original blocks are addressed by GAT entries in GAT Pages. FBL lists free blocks, some of which may be allocated as Update Blocks since the last Master Index Page update. Some of the recently allocated Update blocks can be closed so that they have become new Intact blocks.

Figure 63A:
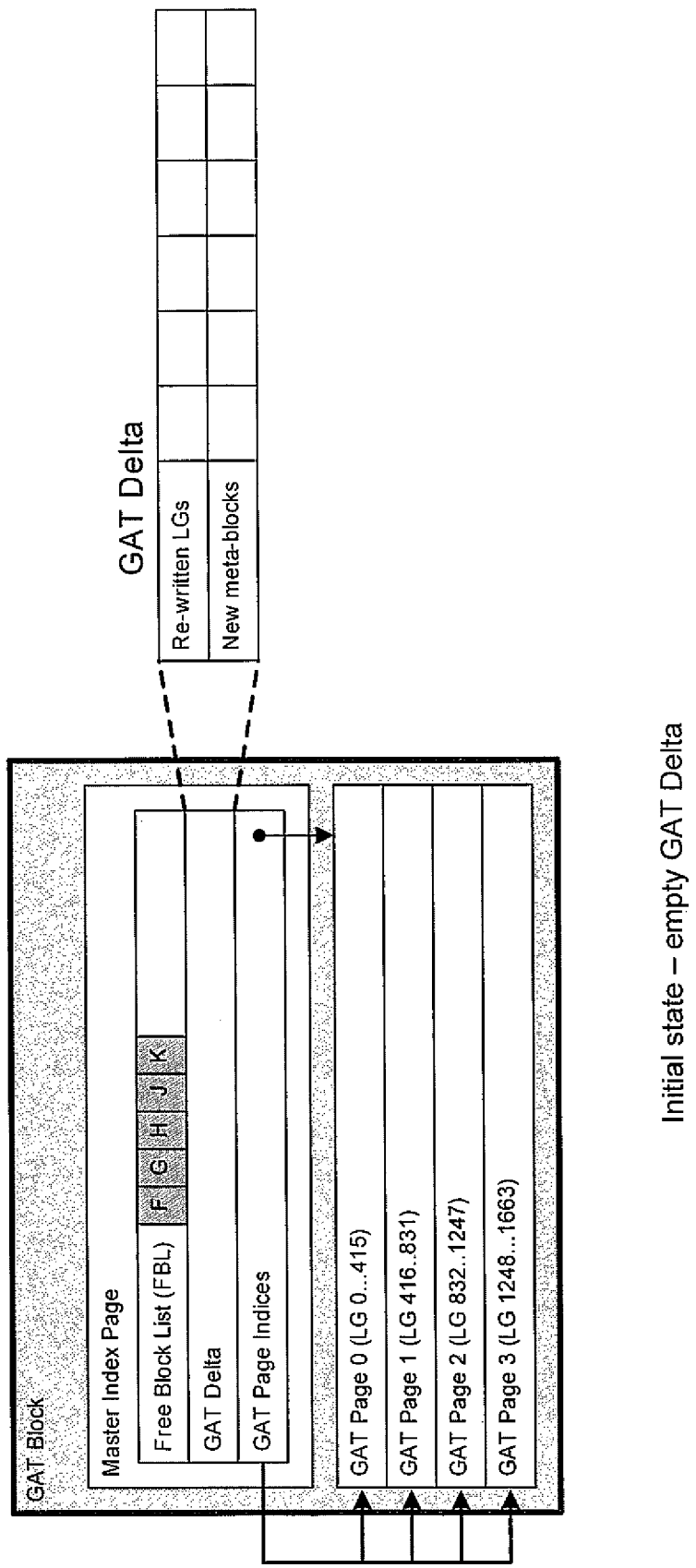
FIGS. 63A-63B show an example of GAT entry update in Master Index and GAT Page.
Figure 63B:
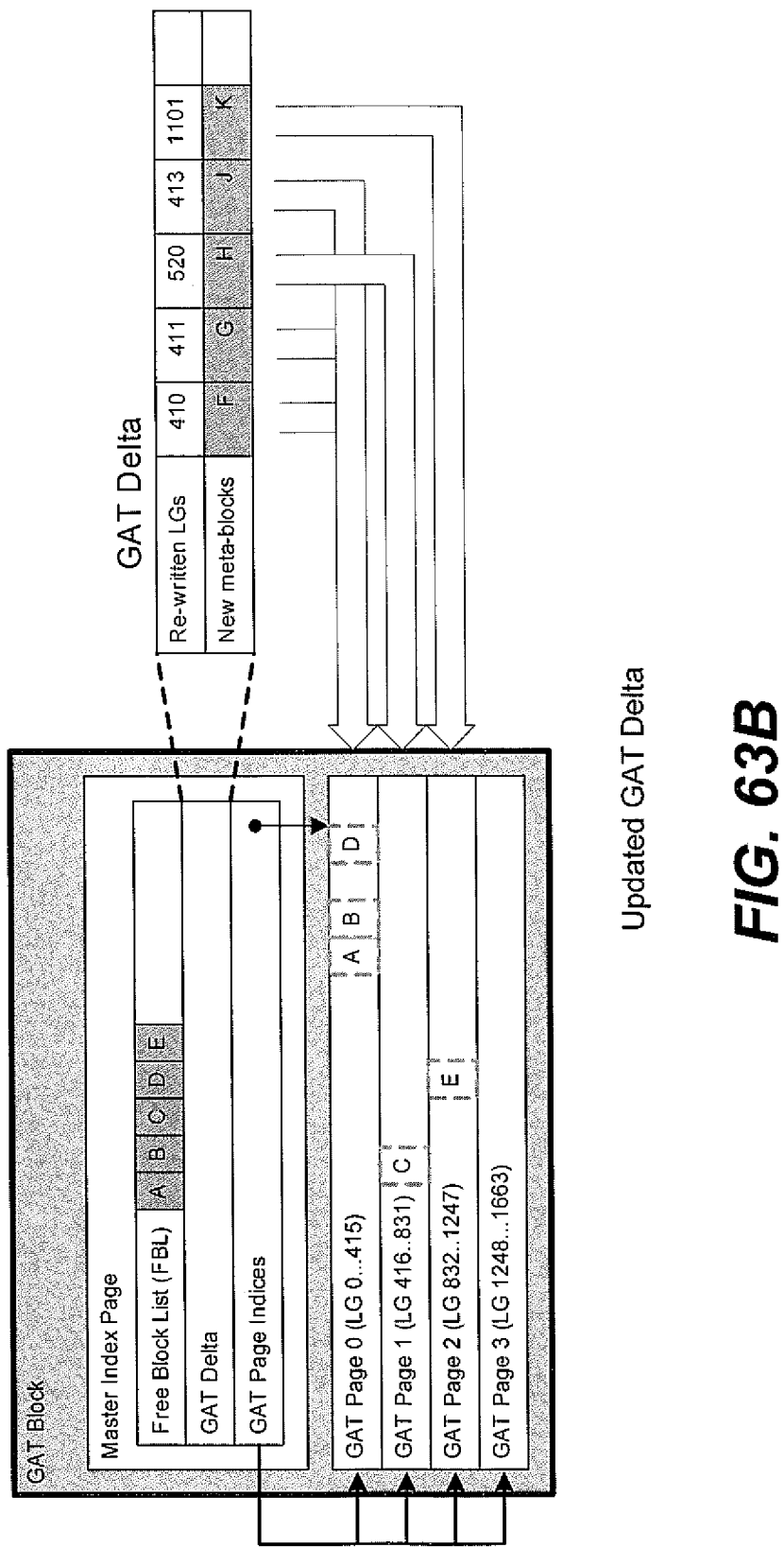

FIGS. 63A-63B show an example of GAT entry update in Master Index and GAT Page. In FIG. 63A, FBL references meta-blocks F, G, H, J and K. In FIG. 63B, the host re-writes Logical Groups 410, 411, 520, 413 and 1101, which are written to meta-blocks F, G, H, J and K correspondingly. The Logical Group numbers and meta-block numbers are recorded in GAT Delta. GAT Entries, pointing to the blocks which stored data for the Logical Groups previously (blocks A, B, C, D and E) for the updated Logical Groups, are superseded.

Master Index Page is updated (old copy is not shown on the diagram) with new GAT Delta information. FBL is populated with now available blocks A, B, C, D and E. Eventually, usually when GAT Delta gets full, information from GAT Delta is flashed to a GAT Page, which addresses more recently updated Logical Groups. (Alternatively, GAT Delta can be empties in a cyclic manner.)

In FIG. 63B, GAT Page is selected. GAT entries for Logical Groups 410, 411 and 413 are updated with references to blocks F, G and J. Then, Master Index is update with partially emptied GAT Delta, no referencing only Logical Groups 520 and 1101.

Copy of GAT Entry in BCI (Binary Cache Index)

When we update BCI, for each LG with fragments, we read GAT and store GAT entry in BCI itself. It helps us not to do extra control read of GAT when we do address translation of and LG with at least one fragment in BCI.

The normal address translation sequence would be:
If the LG has fragments in BC?
If Yes, then read BCI—FIRST CONTROL READ FROM FLASH
Check if required data is n BCI
If yes, read data from BC
If No, check if data is in Update Blocks (the info is in RAM)
If yes, read data from Update Blocks
If No, the data is in Intact block, referenced by GAT
Read GAT Page (unless the entry is in GAT Delta in RAM)—SECOND CONTROL READ FROM FLASH
For the LG, get the GAT entry from read GAT page For many cases, there will be many LGs with fragments in BC, but in most cases, we will not find the data in BC, and will have to go through the full address translation cycle and do the second read, of GAT Page. But, If we copy GAT entry in BCI, then we will not need the second read and will accelerate access time as a result. The modified sequence is:
If the LG has fragments in BC?
If Yes, then read BCI—FIRST CONTROL READ FROM FLASH
Check if required data is n BCI
If yes, read data from BC
If No, check if data is in Update Blocks (the info is in RAM)
If yes, read data from Update Blocks
If No, the data is in Intact block, referenced by GAT
Get GAT Entry from BCI referencing the LG (already in RAM)

SGAT Pages Management

The SGAT Pages are located just after the GAT pages in the Page index list. The SGAT indices are hold by a specific index. (this index means from which Page Index, the SGAT pages start).

Free Block List (FBL) Exchange

This will take required un-allocate meta blocks from SGAT Pages & replace them with the required FBL. When FBL exchange is triggered, the MIP is updated automatically after the exchange.

GAT Block Management

FIG. 64 is a table showing the GAT block list. The GAT Block is managed with the GAT block list.

MBA & RLF fields are also stored in MIP on flash. The size of this list in static defined (compilation) to be 16 (maximum allowed.

As described above, there are 3 Page type in GAT Blocks, all pages are programmed as Binary Blocks (in Binary Mode).

GAT Page—includes intact LG MB information
MIP—includes over all MML initialization information
SGAT—includes un-allocated MB information Write Abort Safe mechanism There are 2 main parameters defined related to specific flash, in the configuration structure:

minBinaryWASafeStep—number of sector range that is assured to be WA safe. For example in 43 nm D2 TrueSLC mode, this variable is equal to physical page size (16 sectors)

minBinaryStep—number of sector range that is assured to be programmed safe. For example in 43 nm D2 TrueSLC mode, this variable is equal to ECC Page (4 sectors).

MIP is programmed to the next free minBinaryWASafeStep space. By this we assure, that WA during this program will not harm any older data. After MIP program, the next free address space will be updated again with minBinaryWASafeStep. By this, we assure that MIP won't be harmed by any WA in GAT/SGAT program. GAT & SGAT pages can be programmed with minBinaryStep.

By this mechanism, if we Read a specific MIP as good, it means that every older pages (in this Block) are assured to be good.

GAT Block Allocation

Figure 65:
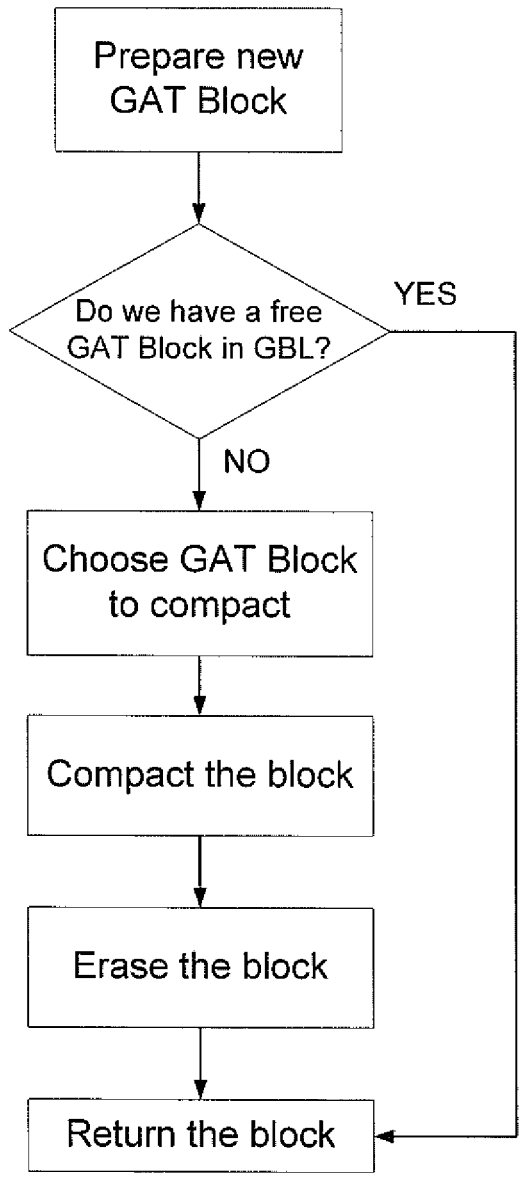
FIG. 65 is a flow diagram illustrating GAT block allocation.

FIG. 65 is a flow diagram illustrating GAT block allocation. Every new block allocation (from BM or after compaction) triggers a boot page update that allows the new initialization to pass.

The GAT block initialization is by looking for the last Good MIP in the given active GAT Block (this parameter is stored in the Boot Page & found in the Boot process). All RAM tables of the GAT Handler are defined by the information found in the MIP. All of the pages that are programmed in the block are ignored. The next Page programmed to GAT Block must be programmed to a new allocated GAT Block.

Meta-Block Management

The block manager handles the allocation and release of blocks to and from the Free block list (FBL) list in SRAM.

Figure 66:
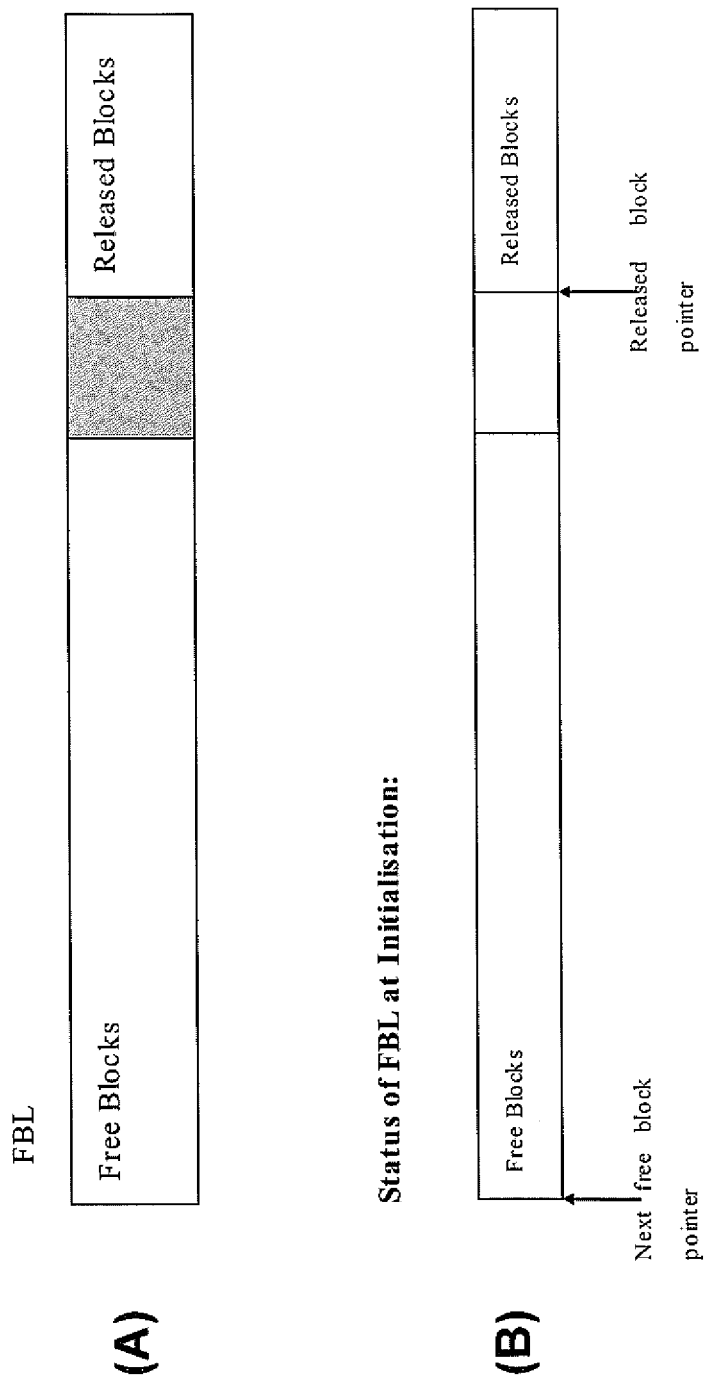
FIGS. 66(A)-(F) illustrates operations on allocation and release of blocks.

FIGS. 66(A)-(F) illustrates operations on allocation and release of blocks. FIG. 66(A) illustrates the FBL being divided into two sections. One section is for storing details of free blocks which are available for allocation. The other one is for storing the details of blocks which have been released but which cannot be reused until the master index in flash is synchronized with the master index in SRAM.

At initialization, a space is left at the end of the FBL to take the released blocks, and a gap is left between the two sections. This allows for the situation where, on performing an initial scan of the FBL, some blocks in the released area are actually found to be available for allocation.

The block manager maintains a set of indices into these lists to indicate which blocks are free and to where the released blocks should be written. As blocks are released, their details are written to the 'released blocks' section of the FBL.

Once a free block is allocated, the pointer indicating which block will be allocated next is moved on one space. The FBL space storing the details of an allocated block is not available for reuse until the SRAM-based control data has been synchronized with flash. After synchronization, all of the space used for allocated blocks will be available to store released blocks, and the released blocks will be available for reallocation.

Once this section is full, the space for released blocks can be extended to wrap around into the space at the start of the free block section occupied by blocks which have already been allocated.

If the space available for new released blocks is greater than a defined threshold, or the number of free blocks falls below a given threshold then a flag will be set to indicate that the Block Manager would benefit from the Master index being synchronized with flash. The state of this flag can be checked with the BlockManager_IsRefreshNeeded( ) function.

This function will return TRUE is any of the following conditions are met:

The pointer to the next free block comes within a defined number of blocks from the end of the free block section.

The space available to write released blocks falls below a defined threshold

If the BlockManager_IsRefreshNeeded( ) function determines that a refresh is required, it will consider all of the blocks listed in the FBL to be available for allocation regardless of whether they were previously in the free or released sections. When synchronization occurs, the wear leveling module will be informed of this and given the opportunity to perform any wear leveling operations it considers necessary.

Metablock Linking

The Block Linking Manager is used to create meta-blocks from physical blocks. Within the context of the MML meta-blocks is the smallest erasable unit on the card. A meta-block consists of physical blocks linked together logically to create a larger addressable unit. Meta-block operations consist of Write, Copy and Erase.

Block linking, consists of a process of scanning all physical flash memory to identify bad physical blocks, these bad physical blocks cannot be used by the MML. All remaining available blocks are either mapped out, marked as spare or linked into usable meta-blocks.

Figure 67:
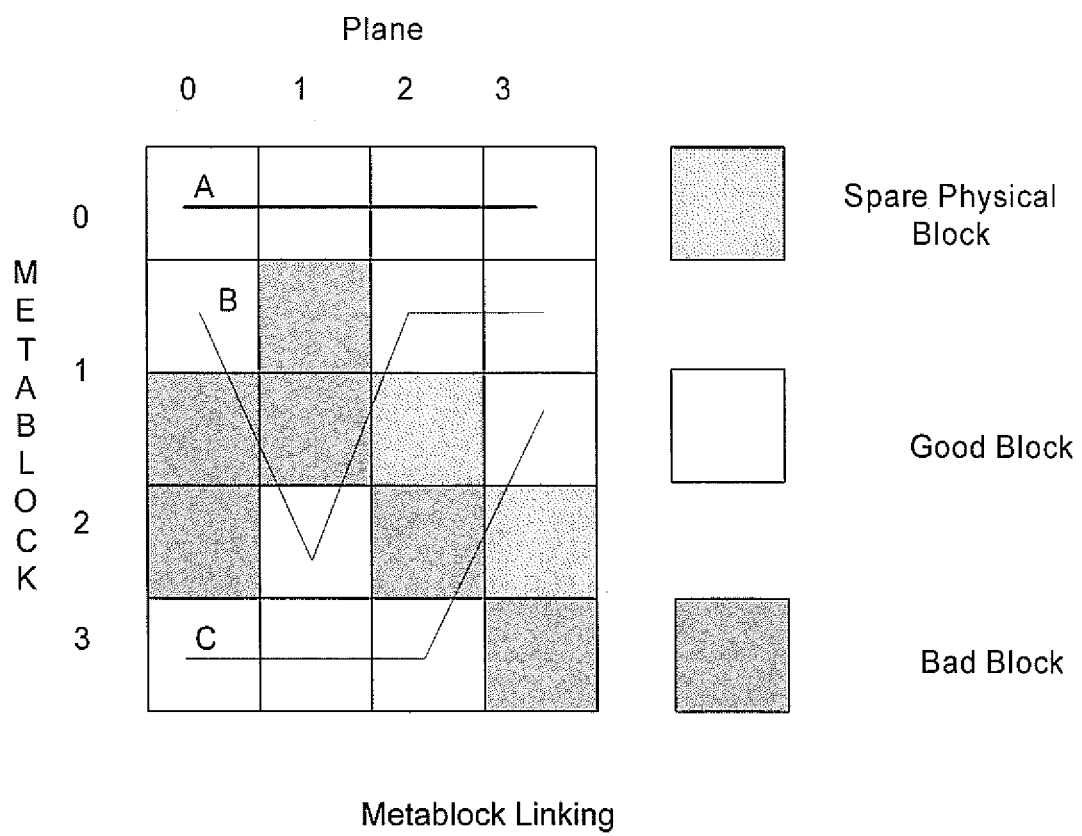
FIG. 67 illustrates several block linking situations.

Block Linking consists of two types of linking: Standard linking of blocks or Re-linking of blocks. The Standard Linking will be configurable as either straight or diagonal linking. Re-linked meta-blocks are those meta-blocks that contain a bad block within a plane to be linked causing the standard re-linking algorithm to fail, but to which a spare block can be substituted to make up a meta-block FIG. 67 illustrates several block linking situations. Block A is a regularly linked meta-block Block B is a re-linked meta-block with a bad block in plane 1. Block C is a re-linked meta-block with a bad block in plane 3.

Interleaving Options

Meta-block (up to 8× physical blocks total):

Plane Interleave—number of planes which can be programmed or erased in parallel within a single die. Value must be a power of 2. The default is to interleave all planes within a die.

Die Interleave—number of dies which can be programmed or erased in parallel within a single physical chip. Value must be a power of 2. The default value is 1.

Chip Interleave—number of chips which can be programmed or erased in parallel. Value must be a power of 2. The default value is 1.

Bank Splitting—determines when to split the host data between banks. 1: split at metapage boundary, 2: split at chip boundary, 3: split at die boundary, 4: split at plane boundary. Default is to split at metapage boundary.

Mega-block (up to 4× meta-blocks total):

Bank Interleave—number of banks which can be accessed in parallel within the product. Value must be 1, or 2, or 4. The default is 1.

Spare Block

In the exemplary embodiment, a spare block is a free block above the minimum required for system functionality in its normal fashion, where at least one free block is used to perform consolidations and compactions. Additionally, the minimum may include a certain number of blocks which can be used as binary cache block and update blocks, to guarantee certain level of performance. There maybe some blocks allocated to be temporary closed update blocks, so that the system does not need to update free block list (FBL) and group access table (GAT) every time a new block is fully written. When the number of free blocks reaches the minimum, the system can then either go to Read-Only mode immediately, or it is possible to use less blocks as update blocks and so on, but this will gradually affect performance. The spare blocks are extra blocks above the predefined minimum and can be described as blocks that can be used to compensate for block failures before the system becomes reduced from its fully functional and, for example, goes into an "end of life" type scenario, such as a Read-Only mode or other measured described in U.S. patent publication number US-2007-0266200-A1.

SGAT: Maintenance of Spare Blocks in Access Table

Spare blocks, free blocks, or both, can be addressed by the group access table. Traditionally, an access table, such as a File Access Table (FAT) or the group access table (GAT) mainly described here, is a look up table with an entry for each logical address, where the addresses are at the appropriate level of granularity for the system: file, sector, block, or, in the exemplary GAT, meta-block. Each GAT entry stores the corresponding physical location for the currently stored logical address. Depending on the embodiment, various attributes of the address may also be stored associated with the address, such as a1-bit time stamp or the experience count. The aspect presented here extends the access table to include entries not associated with a host's logical address: If the memory has too many spare blocks to fit into the free block list, the system creates additional GAT entries to be used as placeholders for the excess spare blocks. Schematically, this is equivalent to formatting a device to a larger logical capacity without making the extra capacity available to the host and the blocks, pre-allocated for the extra logical capacity will be used as spares, since the host will not use them.

This extended portion for spare blocks can be referred to as Spare GAT or SGAT. The entries in the SGAT will be for logical addresses not exported to, and not available to, the host, with the corresponding physical address entries being those of spare blocks. The logical address space for the SGAT entries can begin with a value following that of the address range as seen by the host from outside of the memory system.

Use of 1-Bit Time Stamp For Spare and Free Block Management

As noted above, a spare block is a free block above the minimum required for system functionality in its normal fashion. There maybe some blocks allocated to be temporary closed update blocks, so that the system does not need to update free block list (FBL) and group access table (GAT) every time a new block is fully written. The spare blocks are extra blocks above a predefined minimum that includes the full complement free blocks and can be described as blocks that can be used to compensate for block failures. In some embodiments, the spare blocks can used as any other blocks, effectively make the free block pool larger by, for example, occasionally swapping members of the spare block pool with members of the free block list. In the embodiment described here, the system only knows that it has spares by keeping a count of total free blocks. Consequently, members of the spare block pool may have been used, as opposed having been kept segregated in an used state. According to another aspect presented here, the system keeps a 1-bit time stamp or flag as a block's attribute to tell recently written blocks in the case when blocks are not kept in erased state. In an exemplary embodiment, a block has a data storing portion and a header portion, which includes the 1-bit time stamp. If the blocks are organized into fixed meta-blocks, only a single TS needs to keep for the meta-block. A data management structure, such as a free block list or spare block pool, used for managing the block will also have an entry for the free or spare block.

The time stamp values in the free/spare block tables are set when the free block list is newly populated with the block, its time stamp being added along with its address. When a block which used to be referenced somewhere else, say by the GAT, becomes free, it is added to the free block list with the time stamp copied "as is" copied from its header time stamp. In the exemplary embodiment, the system holds obsolete blocks in the free and spare block pools in an un-erased state until as late as practical. The time value stored on the block itself will be toggled when the system erases the block and programs to it before the next erase. It is programmed to the first header to be programmed and may be continued in the other headers as well. On the next update of the free block list, it can be removed from the free block list as it is not longer free or spare, be is reference somewhere else, such as the group access table or updating information for the access table. Consequently, the comparison of these two TS bits, the one on the block itself and that in the free block list, for a given block will indicate whether the block has been erased and stated to be programmed since the last update of the table. As obsolete, free blocks and recently written blocks, with new data may look identical, a comparison of the two can tell if a block in the free block list or spare pool has old data or just been rewritten with a new data. At initialization, the system scan free and/or blocks and if time stamp in block does not match one in the control structure, the block is recognized as recently written, after the last data structure update. In this way, the time stamp allows the system to use blocks from the free block list without the need to update free block list every time it is done, since the system can scan the free block list and check the time stamps to find out what changed.

Transference of Spare Blocks Between Partitions

To allow for defective memory blocks, a memory with two different portions can include spare blocks in a number of different arrangements. For example, each partition could keep its own separate spare pool, one of extra binary blocks and one of extra MLC blocks; however, this would result in the device reaching its end of life scenario when either of the pools is fully used, regardless of the state of the other pool. Another arrangement would be a shared pool of blocks for mixed use, taken by either the binary partition or MLC partition as needed and operated in the corresponding mode. In the shared pool arrangement, the memory would reach end of life scenario when the shared pool is fully used; but the resultant endurance will not be optimal because frequent random writes will no longer be kept outside the MLC partition for blocks in the shared pool and this will cause an impact to the MLC blocks, reducing any endurance advantage.

According to the aspect presented here, the two partitions have separate spare block pools, but spare blocks can be transferred from the pool for the lower endurance MLC partition to the pool for the higher endurance binary partition. This allows for a relatively small pool to be kept for the binary partition, but should the need arise, for blocks to be transferred over form the MLC block pool. For example, there may initially be assigned very few spare binary partition blocks. This initial assignment of spare binary block could even be none, but as a practical matter, there will usually a few blocks, or even just a single spare, assigned to binary so that the transfer mechanism need not be invoked by a single failure. If any additional spare blocks are need for the binary partition, MLC spares can then be transferred as needed from the larger MLC spare pool, with any transferred blocks than being operated as appropriate for the new partition (i.e., binary). Although some embodiments could also allow transferal of spares from the spare pool of the higher endurance binary pool to the MLC spare pool, this will generally not be done as the binary cells are usually operated in a coarser, faster mode that may lead to lower endurance if subsequently operated in the more stringent MLC mode.

Figure 68:
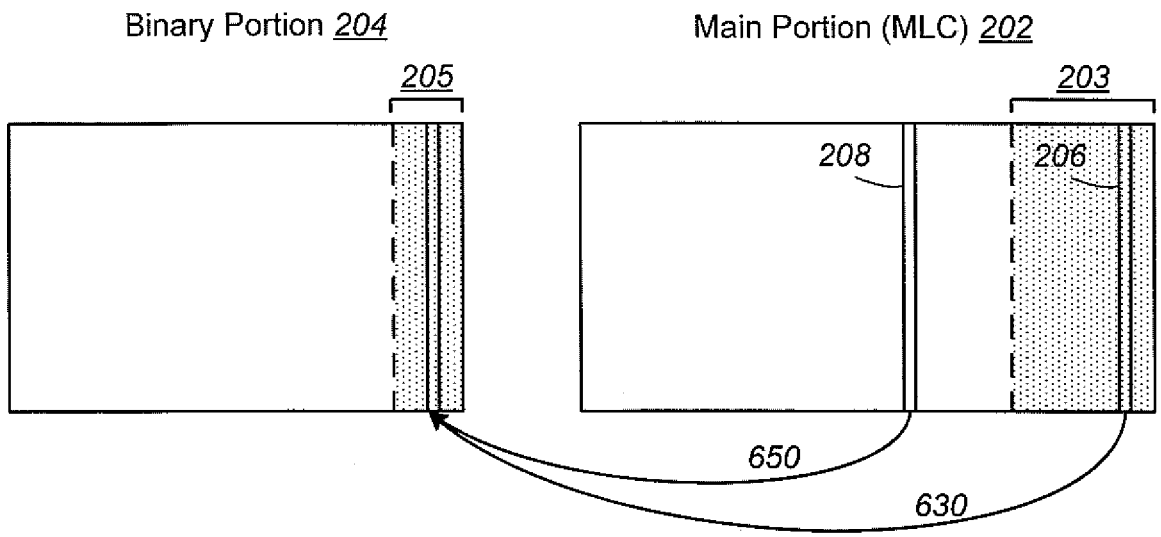
FIG. 68 illustrates the transfer of spare blocks from the main memory portion to the binary cache portion.

FIG. 68 illustrates the transfer of spare blocks from the main memory portion to the binary cache portion. (It will be understood that the arrangement shown is just conceptual and the physical layout on a device need not group all the spare blocks together, etc.) The memory is partitioned into two sections, the binary section 204 and MLC section 202. The partition may be a fixed, hard partition or a dynamic or other soft partition. Each partition has spare block pool, shown as 205 and 203. The binary spare block pool 205 is initially assigned few spare blocks, from none to a few, with one or two taken as the exemplary embodiment. The MLC spare block pool 203 initially assigned a larger number of blocks. Some of these initially allotted spare may be lost at testing, being reassigned to cover for bad blocks from the production process. In any case, when the binary section 204 needs a spare block due to, say, a programming failure, it will first check its own spare block pool 205 and appropriate the needed block if one is available; if not, it will then request one such as spare block 206 to be reassigned as shown at STEP 630 from the MLC spare block pool 203, which is then treated as the needed binary spare block. If there are no available spares in 203 to be reassigned, the device goes into end of life ("EoL") mode.

The preceding discussion has noted how MLC mode tends to be a finer, or less reliable, mode in that it has tighter operating tolerances and is usually more prone to grown defects than the coarser binary mode. Because of this, a block that may be considered defective when operated in a multi-state mode may still be operable in binary mode: for example, although a block may experience program failure when programming an upper page, it may still be operable in a binary (e.g., lower page only) format. Consequently, a block that is found defective as an MLC block can be reassigned to the spare block pool of the binary partition. This is illustrated at STEP 250 in FIG. 68, where a block such as block 208 from the MLC partition 202, which is outside of the MLC spare block pool 203, is transferred over to the binary spare block pool 205. The transfer need not be immediate, but can be performed when convenient for the system, such as a sort of background operation. If the MLC partition 202 then needs a replacement block, this can then be shifted out of the spare pool 203.

FIG. 69 is a flow diagram illustrating the allocation of spare blocks across the binary portion and the main (MLC) portion of the memory.

STEP 600: Request spare block

STEP 402: Is a spare block available in its own pool? For the binary cache, it will be spare pool 205 shown in FIG. 68. If so, proceed to STEP 612. Otherwise proceed to STEP 620.

STEP 612: Appropriated the available block from the spare pool 205 to be use. Done.

STEP 620: Is a spare block available in the spare pool of the other memory portion? For the binary cache, the other spare pool will be spare pool 203 of the main memory shown in FIG. 68. If so, proceed to STEP 622. Otherwise proceed to STEP 630

STEP 622: Since none is available from both spare pools. The device goes into an End-of-Life mode. Done STEP 630: Expropriate a spare block such as spare block 206 from the spare block pool 203 and transfer it for use in the binary cache 204.

STEP 640: The transferred block will be operated in binary mode.

The transfer of blocks from the main memory to the binary cache memory is mainly for spare blocks. When a block in the binary cache becomes defective, a spare block is used to replace it.

In another aspect of the invention, the partition between the binary cache and the main memory can be dynamically adjusted on demand. There are times when the binary cache needs additional blocks due to new applications such as storing specific type of data that require faster access or data that are relative fragmented. In that case, blocks that originally belong to the main memory can be transferred to the binary cache on demand.

In a preferred embodiment, the endurance history a block in the main memory is tracked by a hot count. When a transfer of a block is needed from the main memory to the binary cache, a block with relatively high hot count is preferably selected. In this way, the block with the relatively high hot count may be deemed marginally reliable when operating in MLC mode but will be quite usable in SLC or binary mode when the operating margin of error is more relaxed. In this case, as shown in FIG. 68, a block with a high hot count but not defective like block 208 can be reallocated from the main memory portion 202 to the binary portion 204 by STEP 650. The block can be added to either the spare block pool 205 or regular area 204 of the binary cache.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A nonvolatile memory, comprising:
an array of memory cells organized into a plurality of blocks, each block being a plurality of memory cells that are erasable together;
said array of memory cells being partitioned into a first group of blocks and a second group of blocks;
a group of read/write circuits for reading or programming in parallel a corresponding page of memory cells among said array of memory cells;
said first group of blocks having first-group pages of memory cells that are each once programmable in between erasure, and each of the memory cells in the first-group pages storing one or more bit of data;
said second group of blocks having second-group pages of memory cells that are each multi-time programmable with a partial page of memory cells being once programmable each time, and each of the memory cells in the second-group page storing one bit of data; and
a cache memory configured from said second group of blocks to cache data being written in granularity of one or more partial page of memory cells, said cache memory archiving selected data to said first group of blocks as a function of predefined attributes of the selected data and predefined states of said first group of blocks and said second group of blocks.

2. The nonvolatile memory as in claim 1, wherein:
said archiving is enabled whenever data to be archived exceeded a predetermined threshold of a capacity of the cache memory.

3. The nonvolatile memory as in claim 1, wherein:
data is in logical units addressable by logical addresses assigned by a host;
said first group of blocks stores data page by page preferably in sequential order of logical addresses, each logical address in a block of the first group of blocks belonging to a predefined logical group of logical addresses; and
said selected data to be archived belongs to a logical group with a highest occupancy in the cache and the logical group does not coincide with that of any partially empty block in the first group of blocks.

4. The nonvolatile memory as in claim 1, wherein:
data is in logical units addressable by logical addresses assigned by a host;
said first group of blocks stores data page by page preferably in sequential order of logical addresses, each logical address in a block of the first group of blocks belonging to a predefined logical group of logical addresses; and
said selected data to be archived belongs to a logical group with a highest occupancy in the cache and the logical group coincides with that of any partially empty block in the first group of blocks.

5. The nonvolatile memory as in claim 1, wherein:
said cache provides resources to maintain an index for the data;
said selected data to be archived belongs to a set that takes up a highest indexing resource in the cache.

6. The nonvolatile memory as in claim 5, wherein:
said first group of blocks stores data page by page preferably in sequential order of logical addresses, each logical address in a block of the first group of blocks belonging to a predefined logical group of logical addresses; and
said set coincides with one of the predefined logical groups.

7. The nonvolatile memory as in claim 6, wherein:
said set does not coincide with a logical group of any partially empty block in the first group of blocks.

8. The nonvolatile memory as in claim 7, wherein:
said set is archived from the cache to an empty block of the first group of blocks.

9. The nonvolatile memory as in claim 6, wherein:
said set coincides with a logical group of a partially empty block in the first group of blocks.

10. The nonvolatile memory as in claim 6, wherein:
said set does not coincide with a logical group of any partially empty block in the first group of blocks.

11. The nonvolatile memory as in claim 10, wherein:
said set is archived from the cache to an empty block of the first group of blocks.

12. The nonvolatile memory as in claim 1, wherein:
said archiving is disabled for a set of persistent data designated to remain indefinitely in the cache memory.

13. In a nonvolatile memory having an array of memory cells organized into a plurality of blocks, each block being a plurality of memory cells that are erasable together; a method of operating the nonvolatile memory, comprising:
partitioning the array of memory cells into a first group of blocks and a second group of blocks;
providing a group of read/write circuits for reading or programming in parallel a corresponding page of memory cells among said array of memory cells;
said first group of blocks having first-group pages of memory cells that are each once programmable in between erasure, and each of the memory cells in the first-group pages storing one or more bit of data;
said second group of blocks having second-group pages of memory cells that are each multi-time programmable with a partial page of memory cells being once programmable each time, and each of the memory cells in the second-group page storing one bit of data; and
archiving selected data from said second group of blocks to said first group of blocks as a function of predefined attributes of the selected data and predefined states of said first group of blocks and said second group of blocks.

14. The method as in claim 13, wherein:
said archiving is enabled whenever data to be archived exceeded a predetermined threshold of a capacity of the cache memory.

15. The method as in claim 13, wherein:
data is in logical units addressable by logical addresses assigned by a host;
said first group of blocks stores data page by page preferably in sequential order of logical addresses, each logical address in a block of the first group of blocks belonging to a predefined logical group of logical addresses; and
said selected data to be archived belongs to a logical group with a highest occupancy in the cache and the logical group does not coincide with that of any partially empty block in the first group of blocks.

16. The method as in claim 13, wherein:
data is in logical units addressable by logical addresses assigned by a host;
said first group of blocks stores data page by page preferably in sequential order of logical addresses, each logical address in a block of the first group of blocks belonging to a predefined logical group of logical addresses; and
said selected data to be archived belongs to a logical group with a highest occupancy in the cache and the logical group coincides with that of any partially empty block in the first group of blocks.

17. The method as in claim 13, wherein:
said cache provides resources to maintain an index for the data;
said selected data to be archived belongs to a set that takes up a highest indexing resource in the cache.

18. The method as in claim 17, wherein:
said first group of blocks stores data page by page preferably in sequential order of logical addresses, each logical address in a block of the first group of blocks belonging to a predefined logical group of logical addresses; and
said set coincides with one of the predefined logical groups.

19. The method as in claim 18, wherein:
said set does not coincide with a logical group of any partially empty block in the first group of blocks.

20. The method as in claim 19, wherein:
said set is archived from the cache to an empty block of the first group of blocks.

21. The method as in claim 18, wherein:
said set coincides with a logical group of a partially empty block in the first group of blocks.

22. The method as in claim 18, wherein:
said set does not coincide with a logical group of any partially empty block in the first group of blocks.

23. The method as in claim 21, wherein:
said set is archived from the cache to an empty block of the first group of blocks.

24. The method as in claim 13, wherein:
said archiving is disabled for a set of persistent data designated to remain indefinitely in the second group of blocks.

* * * * *